(12) United States Patent
Kim

(10) Patent No.: US 9,799,659 B2
(45) Date of Patent: Oct. 24, 2017

(54) SEMICONDUCTOR DEVICE HAVING AIR GAP, A METHOD FOR MANUFACTURING THE SAME, A MEMORY CELL HAVING THE SAME AND AN ELECTRONIC DEVICE HAVING THE SAME

(71) Applicant: SK hynix Inc., Gyeonggi-do (KR)

(72) Inventor: Seung-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/209,502

(22) Filed: Jul. 13, 2016

(65) Prior Publication Data

US 2016/0322365 A1 Nov. 3, 2016

Related U.S. Application Data

(63) Continuation-in-part of application No. 14/858,732, filed on Sep. 18, 2015.

(30) Foreign Application Priority Data

Apr. 20, 2015 (KR) ........................ 10-2015-0055446

(51) Int. Cl.
*H01L 29/66* (2006.01)
*H01L 27/108* (2006.01)
(Continued)

(52) U.S. Cl.
CPC .. *H01L 27/10885* (2013.01); *H01L 27/10823* (2013.01); *H01L 27/10876* (2013.01);
(Continued)

(58) Field of Classification Search
CPC ........... H01L 27/1052; H01L 27/10823; H01L 27/10876; H01L 27/10885; H01L 29/0649; H01L 29/1083; H01L 29/407; H01L 29/4236

See application file for complete search history.

(56) References Cited

U.S. PATENT DOCUMENTS 8,338,875 B2 12/2012 Nakao
2011/0303974 A1* 12/2011 Kim .................. H01L 27/10876
257/329

(Continued)

FOREIGN PATENT DOCUMENTS

KR 1020090036283 4/2009
KR 1020160042561 4/2016

OTHER PUBLICATIONS

Office Action issued by the United States Patent and Trademark Office for a parent U.S. Appl. No. 14/858,732, dated Aug. 25, 2016.
(Continued)

*Primary Examiner* — Trung Q Dang
*Assistant Examiner* — Frederick B Hargrove
(74) *Attorney, Agent, or Firm* — IP & T Group LLP

(57) ABSTRACT

A semiconductor device may include: a semiconductor substrate comprising a plurality of active regions and a device isolation region for isolating the plurality of active regions; and a conductive shield pillar formed in the device isolation region and connected to the semiconductor substrate. Each of the active regions may include: a body portion formed in the substrate; a pillar floating from the body portion and positioned over the body portion; a side portion provided over a side surface of the pillar and connected to the body portion; and an embedded spacer positioned between the side portion and the pillar, the pillar may be coupled to the substrate through the side portion.

17 Claims, 55 Drawing Sheets

(51) Int. Cl.
   *H01L 29/06*   (2006.01)
   *H01L 29/423*  (2006.01)
   *H01L 29/40*   (2006.01)
   *H01L 29/10*   (2006.01)

(52) U.S. Cl.
   CPC ...... *H01L 29/0638* (2013.01); *H01L 29/0649* (2013.01); *H01L 29/1083* (2013.01); *H01L 29/407* (2013.01); *H01L 29/4236* (2013.01)

(56) References Cited

U.S. PATENT DOCUMENTS

| | | | |
|---|---|---|---|
| 2012/0025300 A1* | 2/2012 | Chung | H01L 27/10876 257/330 |
| 2013/0001675 A1 | 1/2013 | Chung et al. | |
| 2013/0105872 A1* | 5/2013 | Kim | H01L 27/10823 257/296 |
| 2014/0015027 A1* | 1/2014 | Mikasa | H01L 29/66666 257/296 |
| 2014/0015034 A1* | 1/2014 | Ryu | H01L 27/108 257/329 |
| 2014/0061850 A1* | 3/2014 | Cho | H01L 27/0203 257/506 |
| 2014/0117438 A1 | 5/2014 | Meiser et al. | |

OTHER PUBLICATIONS

Office Action issued by the United States Patent and Trademark Office for U.S. Appl. No. 15/258,588 in the same family tree on Sep. 6, 2017.

\* cited by examiner

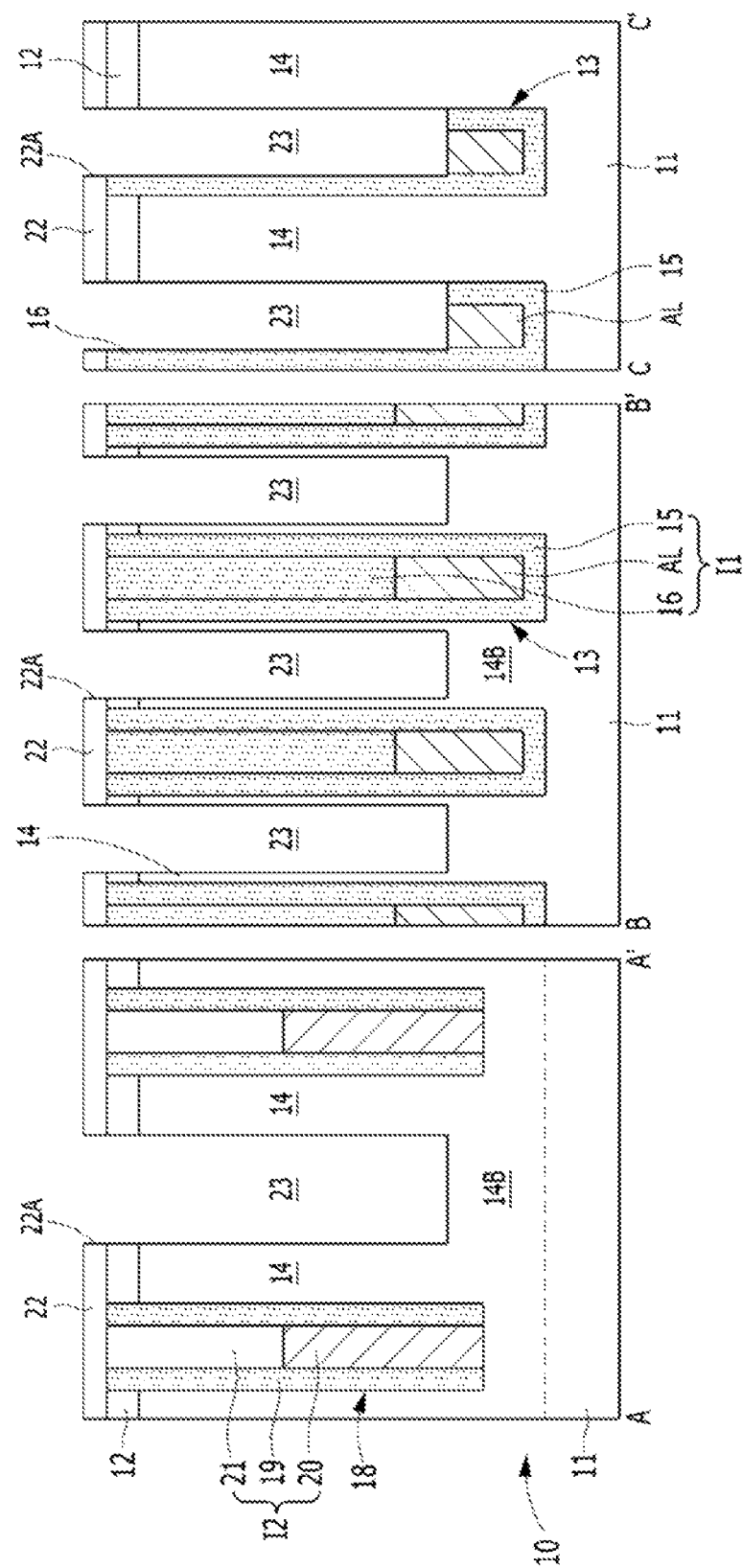

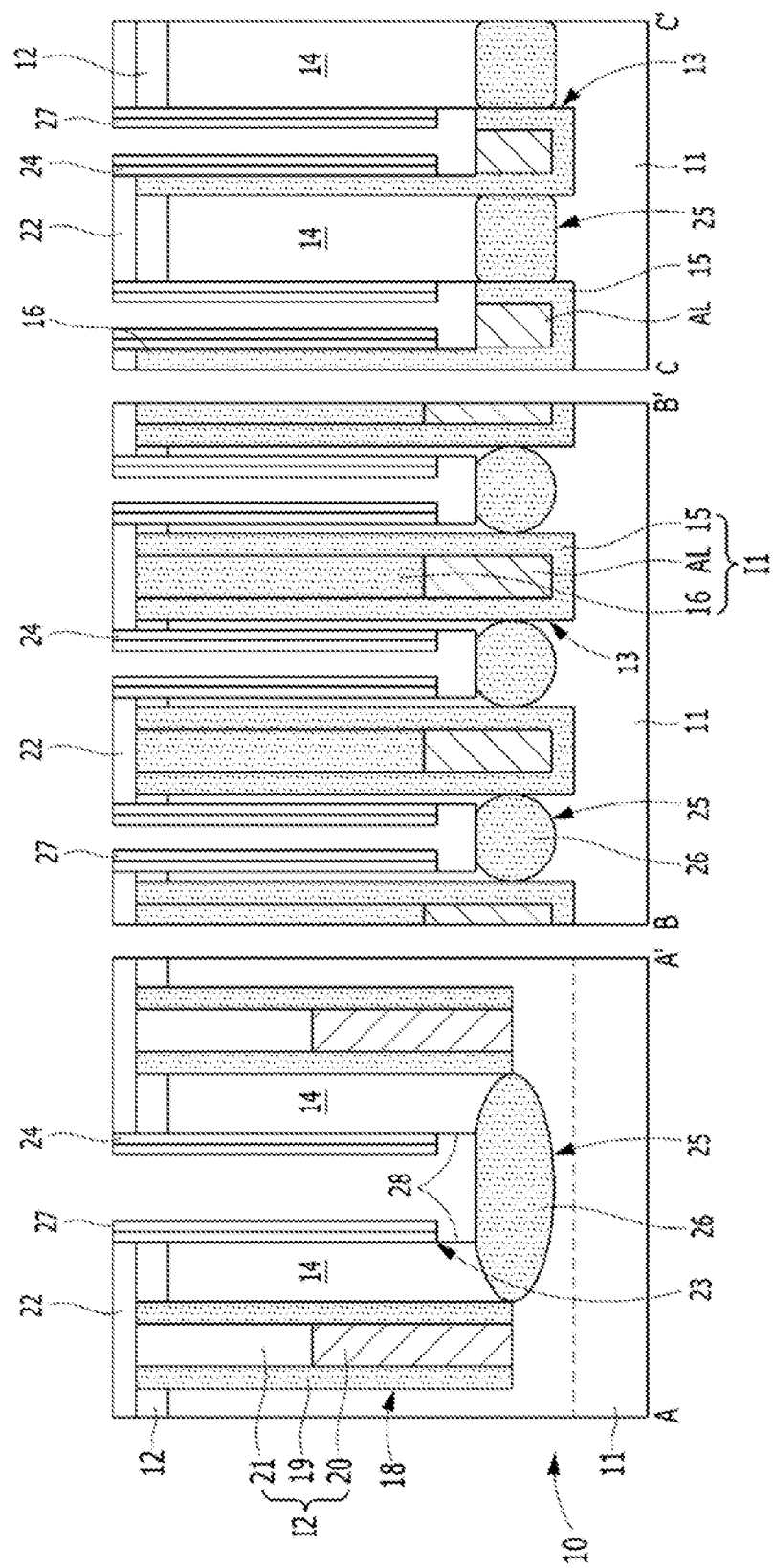

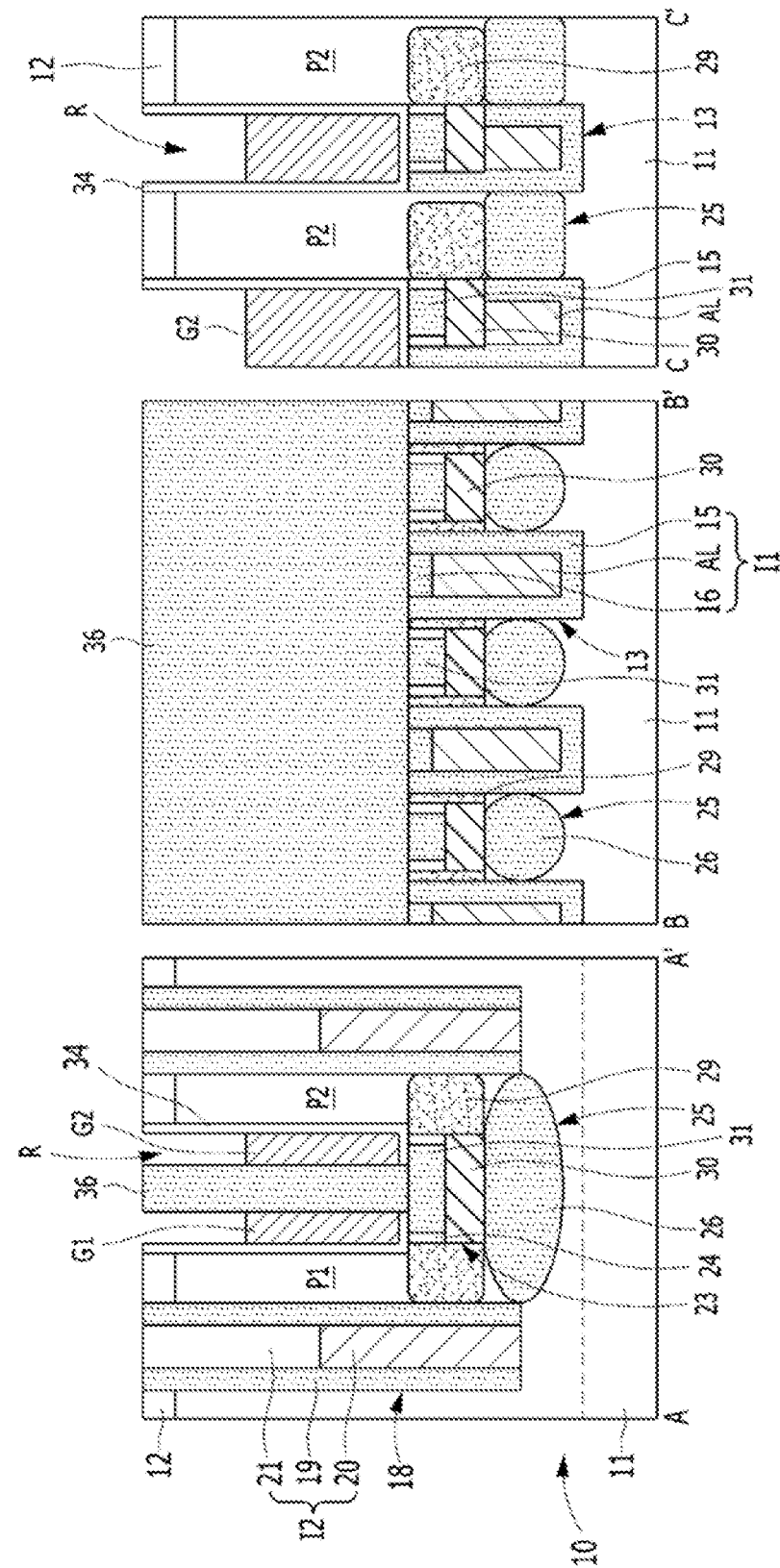

SEMICONDUCTOR DEVICE HAVING AIR GAP, A METHOD FOR MANUFACTURING THE SAME, A MEMORY CELL HAVING THE SAME AND AN ELECTRONIC DEVICE HAVING THE SAME

CROSS-REFERENCE TO RELATED APPLICATIONS

This application is a Continuation-In-Part (CIP) application of U.S. application Ser. No. 14/858,732 filed on Sep. 18, 2015, which claims priority of Korean Patent Application No. 10-2015-0055446, filed on Apr. 20, 2015. The disclosure of each of the foregoing applications is incorporated herein by reference in its entirety.

BACKGROUND

1. Field

Exemplary embodiments of the present invention relate to a semiconductor device, and more particularly, to a semiconductor device having an air gap, a method for manufacturing the same, a memory cell having the same, and an electronic device having the same.

2. Description of the Related Art

As a semiconductor device is highly integrated, parasitic capacitance between neighboring conductive structures exerts a substantial influence on performance of the semiconductor device.

SUMMARY

An embodiment of the present invention is directed to a semiconductor device capable of suppressing a passing gate effect and a method for manufacturing the same.

In accordance with an embodiment of the present invention, a semiconductor device may include a semiconductor substrate having a plurality of active regions and a device isolation region for isolating the plurality of active regions from each other; and a buried bit line and a buried gate electrode which are formed in the semiconductor substrate, wherein the device isolation region includes a first device isolation region extending in a first direction and a second device isolation region extending in a second direction crossing with the first direction and having a shield pillar. The shield pillar may be electrically coupled to the semiconductor substrate. The shield pillar may include polysilicon doped with boron. The semiconductor device may further including a first isolation trench extending in the first direction, and wherein the first device isolation region is formed in the first isolation trench. The semiconductor device may include a second isolation trench extending in the second direction, wherein the second device isolation region is formed in the second isolation trench. The second device isolation region may include: a liner formed on sidewalls of the second isolation trench; and an isolation dielectric layer covering the shield pillar, wherein the liner may be positioned between the shield pillar and a sidewall of the second isolation trench. The semiconductor device may further include a gate trench having a bottom surface, a first side surface and a second side surface opposite to the first side surface, wherein the buried gate electrode may be formed in the gate trench. The gate trench may include: a first trench extending in the second direction, and a second trench and a third trench each extending from the first trench and extending in the first direction. The buried gate electrode may include: a first electrode buried in the first trench of the gate trench; a second electrode buried in the second trench of the gate trench; and a third electrode buried in the third trench of the gate trench. The semiconductor device may further include a bit line trench extending in a third direction crossing with the first and second directions, wherein the buried bit line may be formed in the bit line trench. The semiconductor device may further include: a body trench under the buried bit line; and a punch-through preventing layer formed in the body trench. Each of the active regions may include a body and a pillar vertically extending over the body, wherein the pillar may include: a first junction region electrically coupled to the buried bit line; a second junction region vertically positioned from the first junction region; and a channel region positioned between the first junction region and the second junction region, and overlapping with the buried gate electrode. Each of the active regions has a major axis and a minor axis, the first isolation region may be positioned between the minor axes of neighboring active regions, and the second isolation region may be positioned between the major axes of the neighboring active regions. The shield pillar may be positioned between the major axes of the neighboring active regions.

In accordance with another embodiment of the present invention, a semiconductor device may include a semiconductor substrate having a plurality of active regions and a device isolation region for isolating the plurality of active regions from each other; and a buried bit line and a buried gate electrode which are formed in the semiconductor substrate, wherein the device isolation region may include a first device isolation region extending in a first direction and a second device isolation region extending in a second direction crossing with the first direction, and having an air gap and a conductive shield pillar, wherein each of the active regions may be defined by the first device isolation region and the second device isolation region. The conductive shield pillar may be electrically coupled to the semiconductor substrate. The conductive shield pillar may include polysilicon doped with boron. The second device isolation region may include an isolation dielectric layer covering the conductive shield pillar and the air gap. Each of the active regions has a minor axis and a major axis, the first device isolation region may be positioned between the minor axes of neighboring active regions, and the second device isolation region may be positioned between the major axes of the neighboring active regions. The conductive shield pillar may be independently positioned between the major axes of the neighboring active regions.

In accordance with yet another embodiment of the present invention, a semiconductor device may include a semiconductor substrate including a plurality of active regions and a device isolation region for isolating the plurality of active regions from each other; and a buried bit line and a buried gate electrode which are formed in the semiconductor substrate, wherein the device isolation region comprises a first device isolation region extending in a first direction and having a first air gap and a second device isolation region extending in a second direction crossing the first direction and having a second air gap and a conductive shield pillar, and wherein the active region is defined by the first device isolation region and the second device isolation region. The conductive shield pillar may be electrically coupled to the semiconductor substrate. The conductive shield pillar may include polysilicon doped with boron. Each of the active regions has a minor axis and a major axis, wherein the first device isolation region may be positioned between the minor axes of neighboring active regions, and wherein the second device isolation region may be positioned between the major axes of the neighboring active regions. The conductive shield pillar and the second air gap are positioned between the major axes of neighboring active regions. The first air gap may be positioned between minor axes of the neighboring active regions.

In accordance with still another embodiment of the present invention, a method for manufacturing a semiconductor device may include forming a line type active region by etching a semiconductor substrate; forming a plurality of island type active regions and an isolation trench by cutting the line type active region; forming a device isolation region comprising a shield pillar, wherein the shield pillar is formed in the isolation trench and is electrically coupled to the semiconductor substrate; and forming a buried bit line and a buried gate electrode which are formed in each of the island type active regions. The forming the device isolation region may include: forming a spacer over a sidewall of the isolation trench; forming a conductive material filling the isolation trench over the spacer; forming the shield pillar by recessing the conductive material; filling an isolation dielectric layer over the shield pillar. The shield pillar may include polysilicon doped with boron.

In accordance with still another embodiment of the present invention, a method for a semiconductor device may include forming a line type active region by etching a semiconductor substrate; forming a plurality of island type active regions and an isolation trench by cutting the line type active region; forming a spacer over a sidewall of the isolation trench; forming a shield pillar partially filling the isolation trench over the spacer; forming an air gap by removing the spacer; forming a device isolation region by filling an isolation dielectric layer in the isolation trench and over the air gap and the shield pillar; and forming a buried bit line and a buried gate electrode which are formed in each of the island type active regions. The shield pillar may include polysilicon doped with boron.

In accordance with still another embodiment of the present invention, a method for manufacturing a semiconductor device may include forming a line type active region and a first isolation trench by etching a semiconductor substrate; forming a first device isolation region including a dielectric pillar in the first isolation trench; forming a plurality of island type active regions and a second isolation trench by cutting the line type active region and the first device isolation region; forming a spacer over a sidewall of the second isolation trench; forming a shield pillar partially filling the second isolation trench and over the spacer; forming a first air gap by removing the spacer; forming a second device isolation region by filling the second isolation trench with an isolation dielectric layer and over the first air gap and the shield pillar; forming a buried bit line and a buried gate electrode which are formed in each of the island type active region; and forming a second air gap in the first isolation trench by removing the dielectric pillar. The forming the first device isolation region may include: forming a first liner layer over a sidewall of the first isolation trench; forming the dielectric pillar partially filling the first isolation trench and over the first liner layer, and filling the first isolation trench with the first isolation dielectric layer, wherein the first isolation dielectric layer is formed over the dielectric pillar. The dielectric pillar may include silicon germanium. The forming the second air gap by removing the dielectric pillar comprises wet etching the dielectric pillar. The shield pillar may include polysilicon doped with boron. The forming the first air gap by removing the spacer comprises wet etching the spacer.

In an embodiment, a semiconductor device may include: a semiconductor substrate comprising a plurality of active regions and a device isolation region for isolating the plurality of active regions; and a conductive shield pillar formed in the device isolation region and connected to the semiconductor substrate. Each of the active regions may include: a body portion formed in the substrate; a pillar floating from the body portion and positioned over the body portion; a side portion provided over a side surface of the pillar and connected to the body portion; and an embedded spacer positioned between the side portion and the pillar, the pillar may be coupled to the substrate through the side portion. The embedded spacer may include a dielectric material. The embedded spacer may include silicon oxide. The side portion may include a silicon epitaxial layer. The conductive shield pillar may include boron-doped polysilicon. The device isolation region may include: a plurality of first device isolation regions extending in a first direction and a plurality of second device isolation regions extending in a second direction crossing the first direction, and the conductive shield pillar may be formed in each of the second device isolation regions. The semiconductor device may further include: a plurality of first isolation trenches extending in the first direction, each of the first device isolation regions may be formed in each of the first isolation trenches. The semiconductor device may further include: a plurality of second isolation trenches extending in the second direction, each of the second device isolation regions may be formed in each of the second isolation trenches. Each of the second device isolation regions may include: a liner formed between the conductive shield pillar and the sidewalls of the second isolation trenches; and an isolation dielectric layer covering the shield pillar. Each of the active regions may be formed in an island shape and has a minor axis and a major axis, the plurality of first device isolation regions may be positioned between the minor axes of the plurality of active regions in the second direction, and the plurality of second device isolation regions may be positioned between the major axes of the plurality of active regions in the first direction. The pillar may include: a first pillar and a second pillar formed over the body portion, the first pillar and the second pillar may be isolated from each other. The semiconductor device may further include: a body trench formed in the body portion; a punch-through preventing layer formed in the body trench; a bit line trench over the punch-through preventing layer; and a buried bit line formed in the bit line trench and connected to bottom portions of the first and second pillars, the first pillar and the second pillar may be floats from the body portion by the punch-through preventing layer. The semiconductor device may further include: a gate trench over the buried bit line; and a buried gate electrode formed in the gate trench, the gate trench may be formed between the first pillar and the second pillar. The gate trench may include: a first trench portion; and second and third trench portions each extending from the first trench portion. The first trench portion may be formed between the first pillar and the second pillar, the first, second and the third trench portion may be surround a portion of sidewalls of the first and second pillar. The buried gate electrode may include first to third electrode portions, and the first to third electrode portions may be formed in the first to third trench portions of the gate trench, respectively. The first pillar and the second pillar may include: a first junction region connected to the buried bit line; a second junction region positioned vertically over the first junction region; and a channel portion positioned between the first and second junction regions and overlapping the buried gate electrode.

In an embodiment, a method for fabricating a semiconductor device may include: forming a line-shaped active region by etching a semiconductor substrate; forming a preliminary island-shaped active region by cutting the line-shaped active region; forming a spacer over sidewalls of the preliminary island-shaped active region; forming a growth layer to cover the preliminary island-shaped active region and the spacer; and forming an island-shaped active region and an isolation trench by etching the growth layer, the spacer may be embedded within the island-shaped active region. The island-shaped active region may include (i) a main portion defined by the preliminary island-active region, (ii) a body portion provided under the main portion, (iii) a growth portion positioned over the main portion, and (iv) a side portion extending from the growth portion down to the semiconductor substrate, the spacer extends from between the main portion and the side portion, and the body portion coupled to the side portion. The forming of the growth layer may be performed by Selective Epitaxial Growth (SEG) of a silicon layer. The forming of the spacer may include: forming a silicon oxide layer over sidewalls and top surface of the preliminary island-shaped active region; and etching the silicon oxide layer to form the spacer. The method may further include: forming a shield pillar in the isolation trench, after the forming of the island-shaped active region and the isolation trench, the shield pillar may be connected to the semiconductor substrate. The forming of the shield pillar may include: forming a liner over the sidewalls of the isolation trench; forming a polysilicon layer over the liner to fill the isolation trench; and etching the polysilicon layer to form the shield pillar. The shield pillar may include boron-doped polysilicon. The method may further include, after the forming of the island-shaped active region and the isolation trench: forming a bit line trench by etching a portion of the island-shaped active region; forming a body trench by etching the bottom surface of the bit line trench; forming a punch-through preventing layer to fill the body trench; forming a buried bit line over the punch-through preventing layer; forming a gate trench and a pair of pillars by etching the island-shaped active region, the gate trench may be positioned over the buried bit line, the pair of pillars may be defined by the gate trench; and forming a buried gate electrode in the gate trench.

BRIEF DESCRIPTION OF THE DRAWINGS

FIGS. 6A to 6H are cross-sectional views taken along the lines A-A', B-B' and C-C' of FIG. 5A to 5H.

FIGS. 8A to 8H are cross-sectional views taken along the lines A-A', B-B' and C-C' of FIG. 7H.

DETAILED DESCRIPTION

Figure 1:
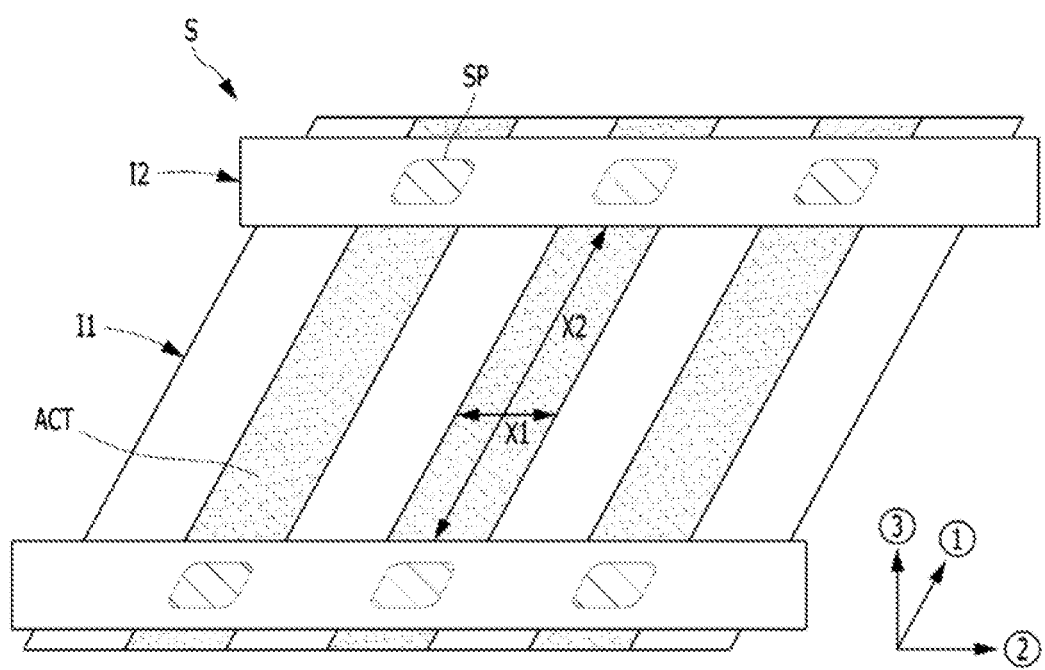
FIG. 1 is a cross-sectional view illustrating a device isolation region in accordance with a first embodiment.

Exemplary embodiments of the present invention will be described below in more detail with reference to the accompanying drawings. The present invention may, however, be embodied in different forms and should not be construed as limited to the embodiments set forth herein. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

FIG. 1 is a cross-sectional view illustrating a device isolation region in accordance with a first embodiment.

Referring to FIG. 1, a device isolation region and an active region ACT may be formed in a substrate S. The device isolation region may include a first device isolation region I1 and a second device isolation region I2. The active region ACT may be defined by the first device isolation region I1 and the second device isolation region I2. The first device isolation region I1 may extend in a first direction ①, and the second device isolation region I2 may extend in a second direction ② crossing with the first direction ①. The first device isolation region I1 may become discontinuous by the second device isolation region I2. The first device isolation region I1 and the second device isolation region I2 may be shallow trench isolation (STI) regions which are formed by trench etching. The first and second device isolation regions I1 and I2 may be formed by filling isolation trenches (not numbered) with a dielectric material, respectively. The first device isolation region I1 and second device isolation region I2 may be formed of the same material or different materials. For example, the first device isolation region I1 and the second device isolation region I2 may include silicon oxide, silicon nitride or a combination thereof. The second device isolation region I2 may have a shield pillar SP.

The active region ACT may be an island type. A plurality of active regions ACT may be arrayed in the second direction ② and the first device isolation region I1 is interposed therebetween. The plurality of active regions ACT may be arrayed with the same spacing and size as each other. The active region ACT may have a major axis X2 and a minor axis X1. The second device isolation region I2 may be positioned between major axes X2 of two neighboring active regions ACT. The first device isolation region I1 may be positioned between minor axes X1 of the two neighboring active regions ACT.

According to FIG. 1, the second device isolation region I2 having a shield pillar SP may be positioned between major axes X2 of two active regions ACT. Various semiconductor devices may be formed in the active region ACT.

Figure 2A:
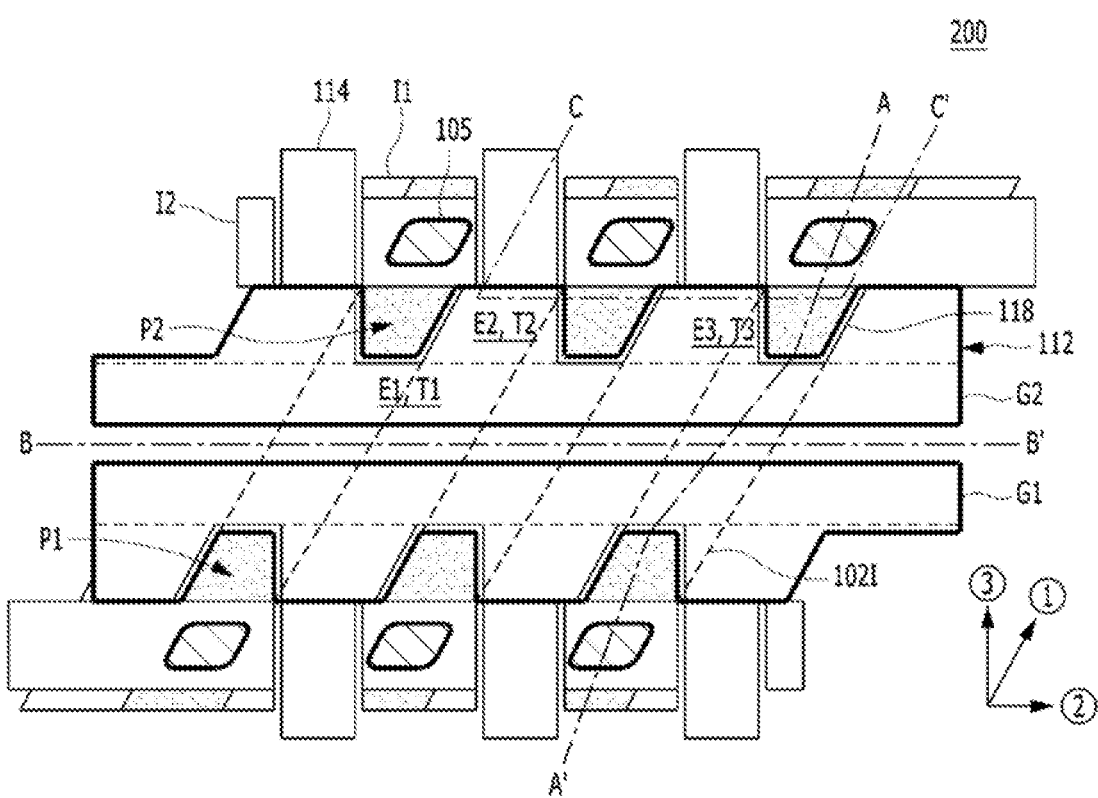
FIG. 2A is a plan view illustrating a semiconductor device in accordance with the first embodiment.
Figure 2B:
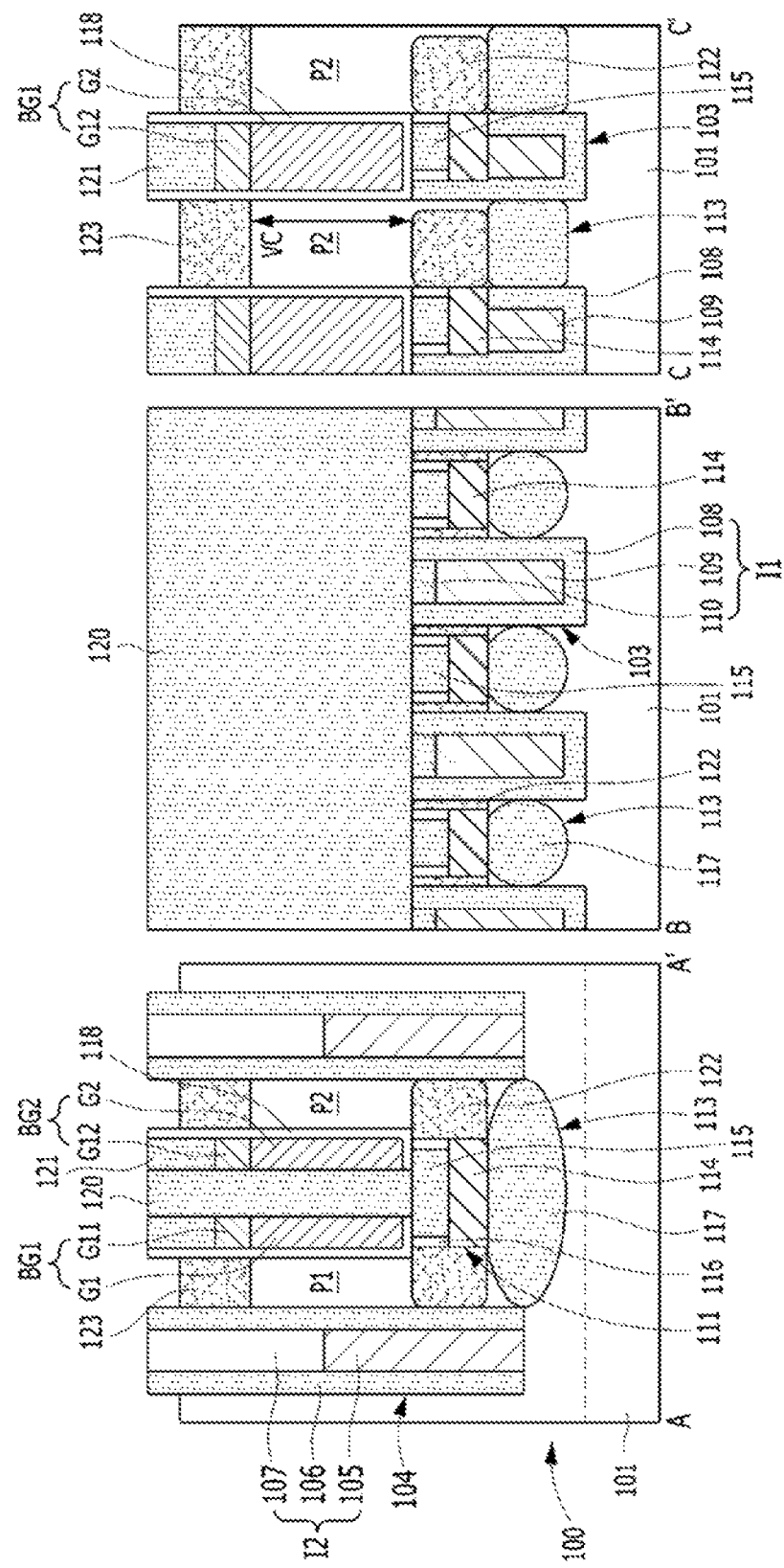
FIG. 2B is a cross-sectional view taken along the lines A-A', B-B' and C'C' of FIG. 2A.

Hereinafter, an example of a semiconductor device in accordance with the first embodiment will be described. FIG. 2A is a plan view illustrating a semiconductor device in accordance with a first embodiment. FIG. 2B is a cross-sectional view taken along the line A-A', B-B' and C'C' of FIG. 2A. A semiconductor device 200 may include a memory cell.

The semiconductor device 200 may include a substrate 100. The substrate 100 may include a semiconductor substrate. The substrate 100 may be formed of a silicon-containing material. The substrate 100 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment, the substrate 100 may include semiconductor material such as germanium. The substrate 100 may include III/V group semiconductor materials, for example, a compound semiconductor substrate such as GaAs. Further, the substrate 100 may include a silicon-on-insulator (SOI) substrate.

A device isolation region and an active region 102I may be formed in the substrate 100. The device isolation region may include a first device isolation region I1 and a second device isolation region I2. The active region 102I may be defined by the first device isolation region I1 and the second device isolation region I2. A part of the substrate 100 under the active region 102I may become a bulk 101. The first device isolation region I1 may extend in a first direction ①, and the second device isolation region I2 may extend in a second direction ② crossing with the first direction ①. The first device isolation region I1 may become discontinuous by the second device isolation region I2. The first device isolation region I1 and the second device isolation region I2 may be STI regions which are formed by trench etching. The first and second device isolation regions I1 and I2 may be formed by filling first and second isolation trenches 103 and 104 with a dielectric material, respectively.

The first device isolation region I11 and the second device isolation region I2 may be formed of the same material as each other or different materials from each other. For example, the first device isolation region I1 and the second device isolation region I2 may include silicon oxide, silicon nitride or a combination thereof. The second device isolation region I2 may include a spacer 106, a shield pillar 105 and a second isolation dielectric layer 107. The second device isolation region I2 may be formed in a second isolation trench 104. Thus, the shield pillar 105 may be formed in the second device isolation region I2. The shield pillar 105 may be electrically coupled to the substrate 100. The first device isolation region I1 may include a liner 108, a dielectric pillar 109 and a first isolation dielectric layer 110.

The active region 102I may be an island type. A plurality of active regions 102I may be arrayed in a second direction ② and the first device isolation region I1 may be interposed therebetween. The plurality of active region 102I may be arrayed with the same spacing and size as each other. The active region 102I may have a major axis and a minor axis (see, FIG. 1). The second device isolation region I2 may be positioned between the major axes X2 of two active regions 102I. The first device isolation region I1 may be positioned between the minor axes X1 of two active regions 102I. The active region 102I may include a first pillar P1 and a second pillar P2. The first pillar P1 and the second pillar P2 may form a pair and be symmetrical to each other. One side surface of each of the first pillar P1 and the second pillar P2 may contact the second device isolation region I2.

The substrate 100 may include a plurality of trenches. The trenches may include a bit line trench 111, a gate trench 112 on the bit line trench 111, and a body trench 113 under the bit line trench 111. The bit line trench 111 may extend in a third direction ③. The third direction ③ may be a direction crossing with the first direction ① and the second direction ②. The gate trench 112 may extend in the second direction ②. The second direction ② may be a direction crossing with the first direction ① and the third direction ③. The body trench 113 may extend in the first direction ① and the length of the body trench 113 may be the same as the active region 102I when measured along the first direction. The first pillar P1 and the second pillar P2 may be spaced from each other by the gate trench 112.

A buried bit line 114 may be formed in the bit line trench 111. A bit line capping layer 115 may be formed on the buried bit line 114. The buried bit line 114 may include a low resistivity metal. The buried bit line 114 may include tungsten. A bit line capping liner 116 may be positioned between the bit line capping layer 115 and the bit line trench 111. The bit line capping layer 115 and the bit line capping liner 116 may include a dielectric material. The bit line capping layer 115 and the bit line capping liner 116 may include silicon oxide, silicon nitride or a combination thereof.

The bit line capping layer 115 may cover the top surface of the buried bit line 114. Accordingly, the buried bit line 114 may also be referred to as an embedded buried bit line in the substrate 100. A punch-through preventing layer 117 may be formed under the buried bit line 114. The punch-through preventing layer 117 may be formed of a dielectric material. The punch-through preventing layer 117 may prevent punch between neighboring buried bit lines 114. The buried bit line 114 may float from a bulk 101 of the substrate 100 by the punch-through preventing layer 117.

The gate trench 112 may be between the first pillar P1 and the second pillar P2. A pair of gate electrodes BG1 and BG2 may be formed in the gate trench 112. In the pair of gate electrodes, a first gate electrode BG1 may overlap with a side surface of the first pillar P1 and a second gate electrode BG2 may overlap with a side surface of the second pillar P2. The first gate electrode BG1 and the second gate electrode BG2 may be symmetrical to each other.

A gate dielectric layer 118 may be formed on sidewalls of the first pillar P1 and the second pillar P2. The first gate electrode BG1 and the second gate electrode BG2 may be covered by first and second gate capping layers 120 and 121. The top surfaces of the first and second gate electrodes BG1 and BG2 may be positioned at a level lower than the top surfaces of the first pillar P1 and the second pillar P2. The top surfaces of the first and second gate capping layer 120 and 121 may be at the same level as the top surfaces of the first pillar P1 and second pillar P2.

Since the first and second gate electrodes BG1 and BG2 are positioned within the gate trench 112 and the top and side surfaces thereof are covered by the first and second gate capping layers 120 and 121, the first and second gate electrodes BG1 and BG2 may have buried structures. They may also be referred to as buried gate electrodes. The semiconductor device 200 may be applied to a memory cell. Therefore, the first and second gate electrodes BG1 and BG2 may become buried word lines.

A gate dielectric layer 118 may be formed on sidewalls of the gate trench 112. That is, the gate dielectric layer 118 may cover the gate trench 112. Moreover, the gate dielectric layer 118 may cover the lower side surfaces and the upper side surfaces of the first pillar P1 and second pillar P2.

The gate dielectric layer 118 may include silicon oxide, silicon nitride, silicon oxynitride, a high-k material or a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30.

The high-k material may include at least one metallic element. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. In another embodiment, other high-k materials known in the art may be used.

The bottom surfaces of the first and second gate electrodes BG1 and BG2 may contact the bit line capping layer 115. That is, the bit line capping layer 115 may be positioned between the first and second gate electrodes BG1 and BG2 and the bit line 114. The first and second gate electrodes BG1 and BG2 may overlap with the side surfaces of the first and second pillars P1 and P2, respectively.

A second junction region 123 and a first junction region 122 may be formed in the first and second pillars P1 and P2. The first junction region 122 may be positioned at the bottom of the first and second pillars P1 and P2, and the second junction region 123 may be positioned at the top of the first and second pillars P1 and P2. The first junction region 122 may be electrically coupled to the buried bit line 114. The first junction region 122 may be positioned at a level lower than the second junction region 123.

A vertical channel VC may be vertically formed between the first junction region 122 and the second junction region 123. The first junction region 122 and the second junction region 123 may be regions where a conductive type impurity is doped. For example, the conductive type impurity may include phosphorus (P), arsenic (As), antimony (Sb) or boron (B). The first junction region 122 and the second junction region 123 may be doped with the same conductive type impurity as each other. The first junction region 122 and the second junction region 123 may respectively correspond to a source region and a drain region.

The first and second gate electrodes BG1 and BG2 may be a stack of lower gate electrodes G1 and G2 and upper gate electrodes G11 and G12, respectively. The first gate electrode BG1 may include the first lower gate electrode G1 and the first upper gate electrode G11. The second gate electrode BG2 may include the second lower gate electrode G2 and the second upper gate electrode G12. The lower gate electrodes G11 and G2 may include a high work function material. The upper gate electrodes G11 and G12 may include a low work function material. Threshold voltage may be controlled by the lower gate electrodes G1 and G2 with the high work function. Gate-induced drain leakage may be improved by the upper gate electrodes G11 and G12 with the low work function.

The first and second gate electrodes BG1 and BG2 may respectively include a first electrode E1, a second electrode E2 and a third electrode E3. The first electrode E1 may extend in the second direction ②, and the second electrode E2 and the third electrode E3 may branch from the first electrode E1. The second electrode E2 and the third electrode E3 may extend in the first direction ①. The first electrode E1, the second electrode E2 and the third electrode E3 may surround at least three side surfaces of the first and second pillars P1 and P2. The first electrode E1 may be in a direction crossing with the buried bit line 114, and the second electrode E2 and the third electrode E3 may be positioned between neighboring first pillars P1 or between neighboring second pillars P2.

The gate trench 112 may be a line type extending in any one direction. The gate trench 112 may include a first trench T1, a second trench T2 and a third trench T3. The first electrode E1 may be formed in the first trench T1, and the second and third electrodes E2 and E3 may be formed in the second trench T2 and third trench T3, respectively.

Hereinafter, a second device isolation region I2 will be described in detail. The second device isolation region I2 may include a spacer 106, a shield pillar 105 and a second isolation dielectric layer 107. The second device isolation layer I2 may be formed in the second isolation trench 104. The second device isolation region I2 may have the shield pillar 105 therein. The shield pillar 105 may be formed of a silicon-containing material. The shield pillar 105 may include polysilicon layer. The shield pillar 105 may be doped with an impurity. The shield pillar 105 may include a polysilicon layer doped with boron. The shield pillar 105 may be independently positioned between the major axes of the active region 102I. That is, neighboring shield pillars 105 may be formed separately from each other.

The shield pillar 105 may be recessed such that the surface height thereof is lower than that of the top surface of the active region 102I. The spacer 106 may be positioned between the sidewall of the shield pillar 105 and the sidewall of the second isolation trench 104. The bottom of the shield pillar 105 may contact the substrate 100.

According to the first embodiment, the shield pillar 105 may be positioned between the major axes X2 of two active regions 102I. Thus, a passing gate (PG) effect may be suppressed. That is, field shielding of the passing gate may result in suppressing the PG effect. Moreover, since the shield pillar 105 functions as a back gate, threshold voltage may be increased.

Hereinafter, a method for manufacturing the semiconductor in accordance with the first embodiment will be described. For convenience, the description will be divided into three parts, which are production part 1, production part 2, and production part 3. The production part 1 relates to a method for forming parallel active regions, the production part 2 relates to a method for forming a buried bit line (BBL) and the production part 3 relates to a method for forming a buried gate electrode (BG).

FIGS. 3A to 3H are cross-sectional views illustrating a method for forming parallel active regions of the semiconductor device in accordance with the first embodiment. FIGS. 4A to 4H are cross-sectional views taken along the lines A-A' and B'-B of FIG. 3A to 3H.

Figure 3A:
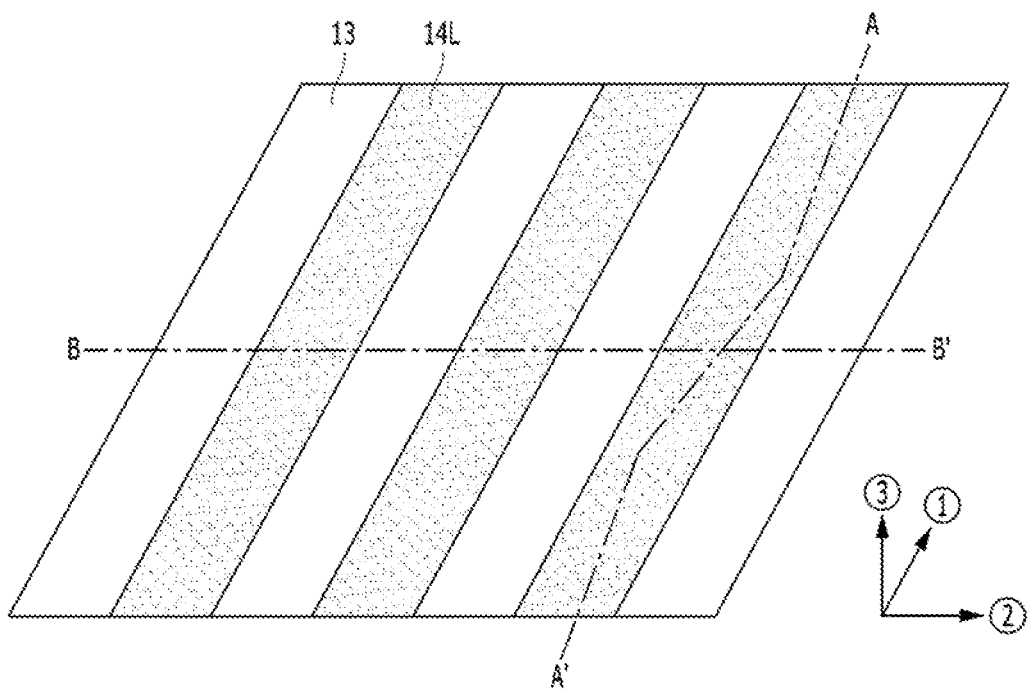
FIGS. 3A to 3H are views illustrating a method for forming parallel active regions of the semiconductor device in accordance with the first embodiment.
Figure 4A:
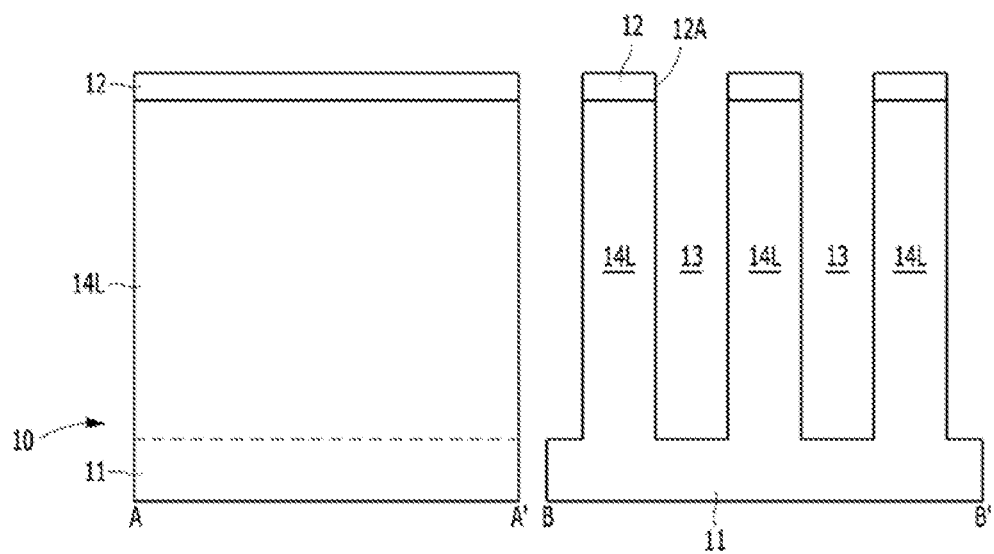
FIGS. 4A to 4H are cross-sectional views taken along the lines A-A' and B'-B of FIG. 3A to 3H.

As shown in FIGS. 3A and 4A, a substrate 10 may be prepared. The substrate 10 may include a material suitable for a semiconductor processing. The substrate 10 may include a semiconductor substrate. The substrate 10 may include a silicon-containing material. The substrate 10 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment the substrate 10 may include semiconductor material such as germanium. Also, the substrate 10 may include III/V group semiconductor materials, for example, a compound semiconductor substrate such as GaAs. Further, the substrate 10 may include a silicon-on-insulator (SOI) substrate.

A first hard mask layer 12 may be formed on the substrate 10. A plurality of line type openings 12A may be formed in the first hard mask layer 12. To form the plurality of line type openings 12A, the first hard mask layer 12 may be etched by using a mask (not shown). The plurality of line type openings 12A may be formed by a spacer pattern technology (SPT). The first hard mask layer 12 may be formed of a material having etch selectivity with respect to the substrate 10. For example, the first hard mask layer 12 may include silicon nitride. Although it is not shown, a buffer layer or a pad layer may be formed between the first hard mask layer 12 and the substrate 10. The buffer layer may be formed of silicon oxide.

A first isolation trench 13 may be formed. The substrate 10 may be etched by using the first hard mask layer 12 having the line type opening 12A as an etch mask. Thus, the first isolation trench 13 may be formed in a line type. A line type active region 14L may be defined in the substrate 10 by the first isolation trench 13. A space between the line type active regions 14L may become the first isolation trench 13. The line type active region 14L and the first isolation trench 13 may extend in the first direction ①. For convenience, the first direction ① may also be referred to as an oblique direction. The bottom of the substrate 10 where the process for forming the line type active region 14L and the first isolation trench 13 are not performed is referred to as a bulk 11.

Figure 3B:
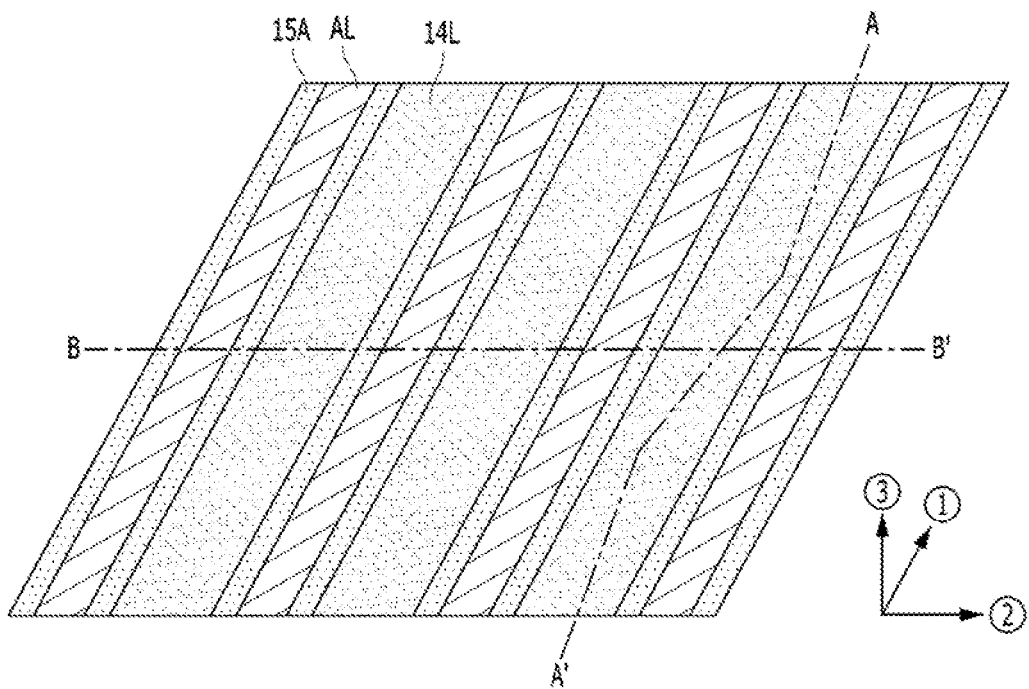
Figure 4B:
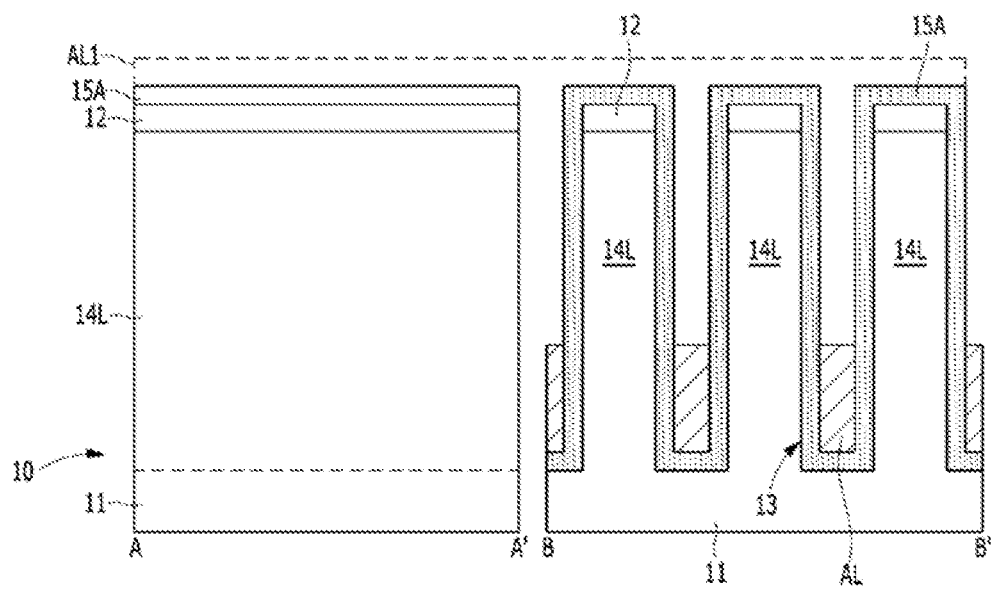

As shown in FIGS. 3B and 4B, a first liner layer 15A may be formed in the first isolation trench 13. The first liner layer 15A may be formed of silicon oxide. The first liner layer 15A may be formed by a thermal oxidation process or a deposition process. In another embodiment, the first liner layer 15A may be formed in a double layer structure. For example, the first liner layer 15A may be a stack of silicon oxide and silicon nitride.

A dielectric pillar layer AL1 may be formed on the first liner layer 15A. The dielectric pillar layer AL1 may be formed of a material having etch selectivity with respect to the first liner layer 15A. The dielectric pillar layer AL1 may include a silicon-containing material. The dielectric pillar layer AL1 may include silicon germanium (SiGe).

The dielectric pillar layer AL1 may be recessed. The dielectric pillar layer AL1 may be recessed in the first isolation trench 13 to form a dielectric pillar AL. The dielectric pillar AL may have a recessed surface. The recessed surface of the dielectric pillar AL may be lower than the top surface of the line type active region 14L.

Figure 3C:
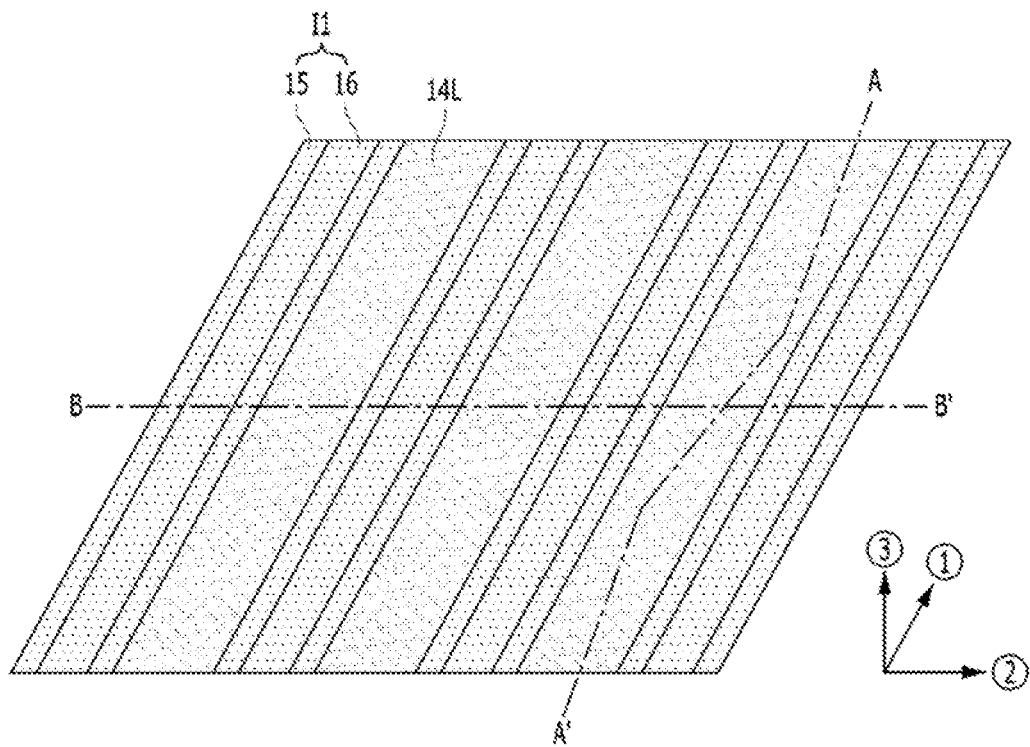
Figure 4C:
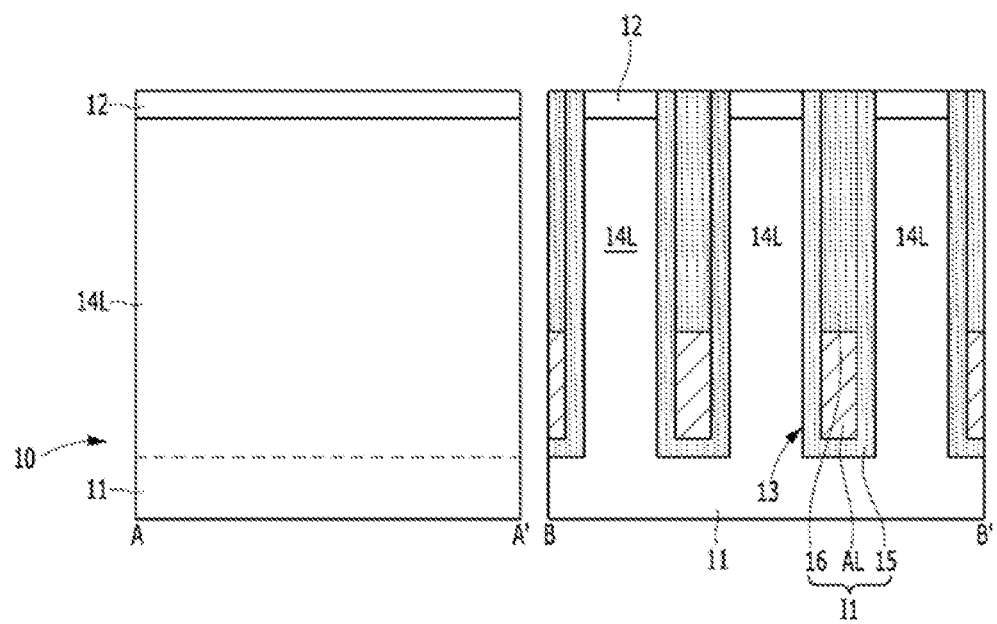

As shown in FIGS. 3C and 4C, a first isolation dielectric layer 16 may be formed on the dielectric pillar AL. The first isolation dielectric layer 16 may be formed of a dielectric material. The first isolation dielectric layer 16 may include silicon oxide, silicon nitride or a combination thereof. A chemical vapor deposition (CVD) process or another deposition process may be used to fill the first isolation trench 13 with the dielectric material. The first isolation dielectric layer 16 may include a spin-on-dielectric (SOD).

A planarization process such as chemical mechanical polishing (CMP) may be performed with respect to the first isolation dielectric layer 16. Thus, the first isolation dielectric layer 16 filling the first isolation trench 13 may be formed. In the planarization process of the first isolation dielectric layer 16, a part of the first liner layer 15A may be planarized. For example, the first isolation dielectric layer 16 and the first liner layer 15A may be planarized until the top surface of the first hard mask layer 12 is exposed. Thus, the first isolation dielectric layer 16 and a first liner 15 may remain in the first isolation trench 13.

According to the above processes, a first device isolation region I1 may be formed. The first device isolation region I1 may include the first liner 15, the dielectric pillar AL and the first isolation dielectric layer 16. The first device isolation region I1 may be formed in the first isolation trench 13. The dielectric pillar AL may be formed in the first device isolation region I1. The line type active region 14L and the first device isolation region I1 may be alternately formed. The line width of the line type active region 14L may be the same as that of the first device isolation region I1. The line type active region 14L and the first device isolation region I1 may extend in the first direction ①.

Figure 3D:
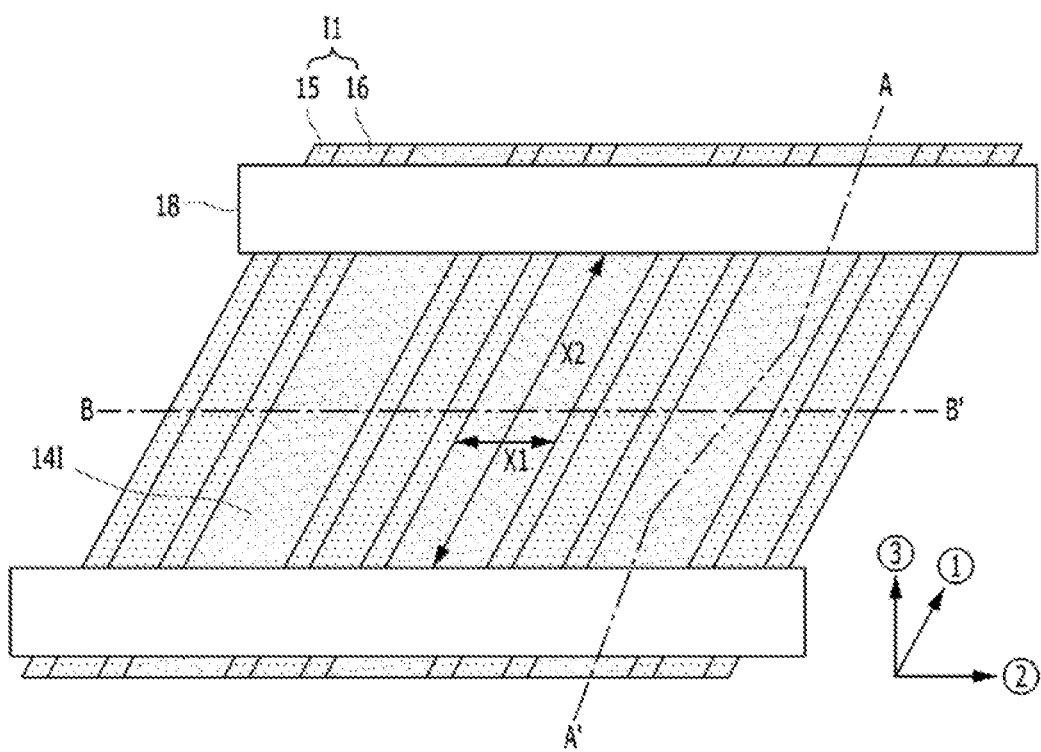
Figure 4D:
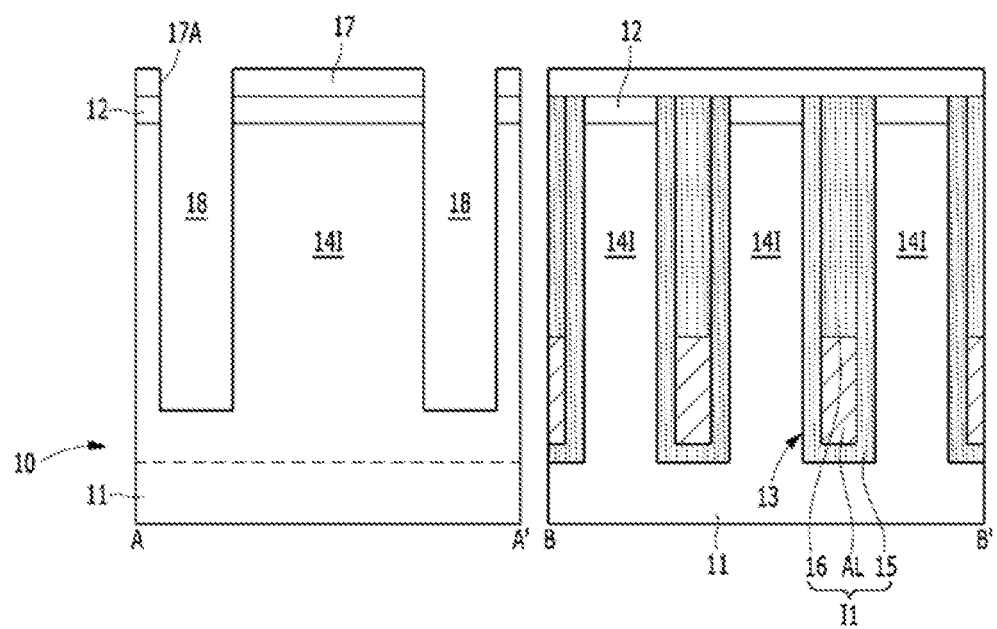

As shown in FIGS. 3D and 4D, the line type active region 14L may be cut in a uniform length unit. To cut the line type active region 14L, a cutting mask 17 may be used. The cutting mask 17 may have a plurality of line type openings 17A. The plurality of line type openings 17A may extend in the second direction ②. The cutting mask 17 may extend in a direction crossing with the line type active region 14L. The cutting mask 17 may include a photoresist pattern.

The first hard mask layer 12, the line type active region 14L and the first device isolation region I1 may be etched by using the cutting mask 17 as an etch mask. Thus, the line type active region 14L may be cut to form a second isolation trench 18. The second isolation trench 18 may extend in the second direction ②. A plurality of island type active regions 14I may be formed by the second isolation trench 18.

According to the above processes, the line type active region 14L may be cut to form the independent island type active region 14I. When viewed in the first direction ①, neighboring island type active regions 14I may be uniform in length and spacing, and may be separated from each other by the second isolation trench 18.

The island type active region 14I may have a minor axis XL and a major axis X2. The plurality of island type active regions 14I may be repeatedly formed and spaced from each other along the first direction ① and the second direction ②. The second isolation trench 18 may be formed between the major axes X2 of neighboring island type active regions 14I, and the first device isolation region I1 may be positioned between the minor axes X1 of neighboring island type active regions 14I. The second isolation trench 18 may extend in the second direction ②.

Figure 3E:
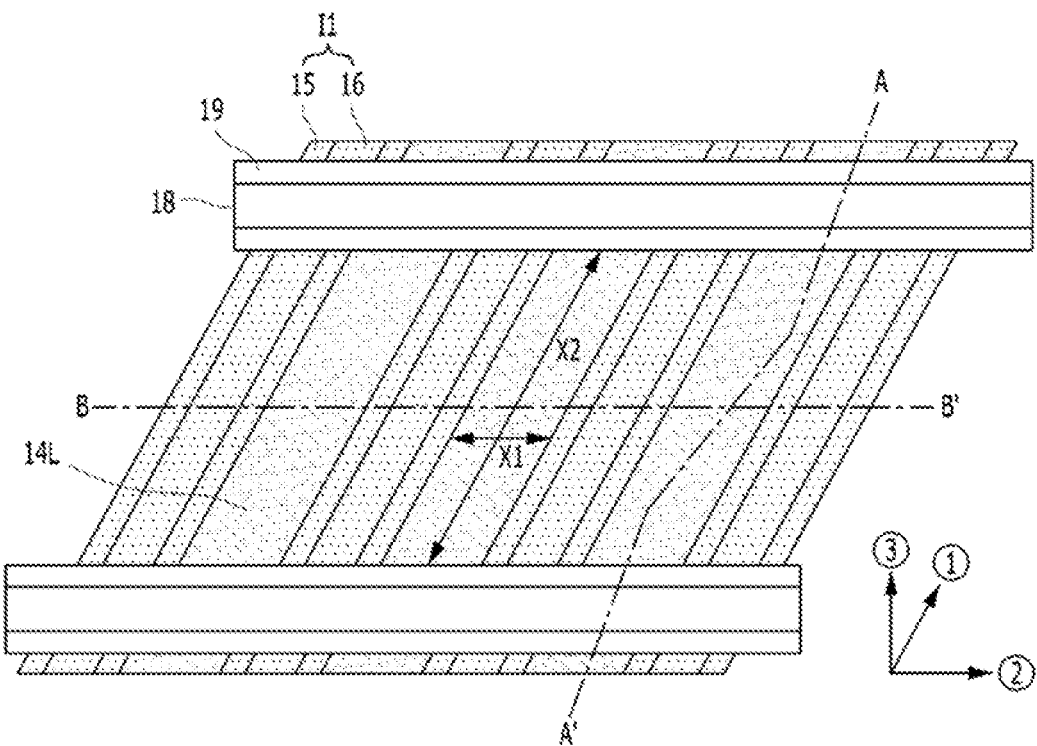
Figure 4E:
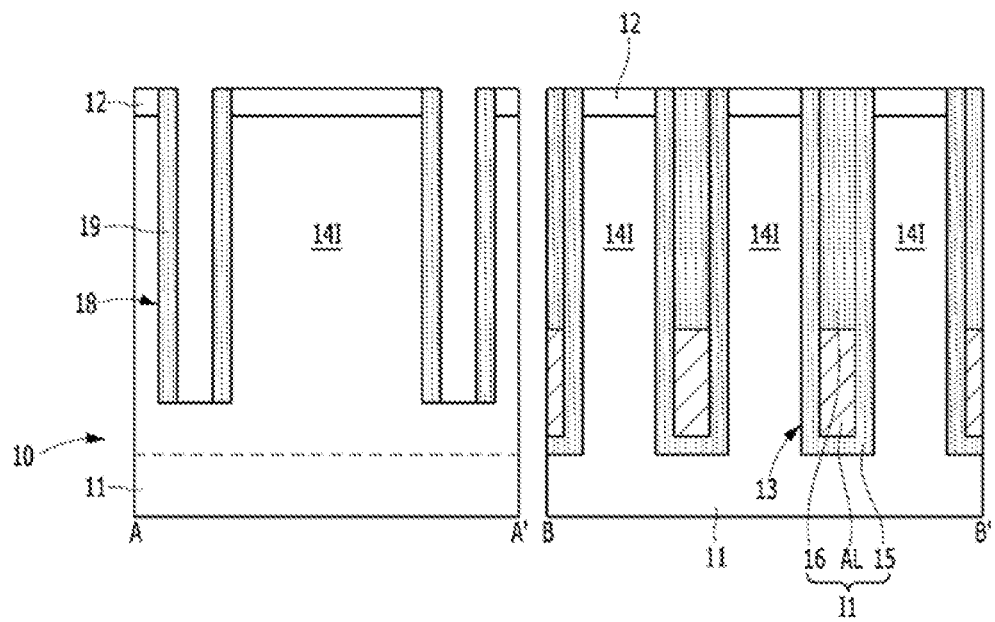

As shown in FIGS. 3E and 4E, the cutting mask 17 may be removed. A spacer 19 may be formed on the sidewalls of the second isolation trench 18. To form the spacer 19, a dielectric material may be deposited followed by an etch-back process. The spacer 19 may be formed of a material having etch selectivity with respect to the substrate 10. The spacer 19 may include silicon oxide. The bottom surface of the second isolation trench 18 may be exposed by the spacer 19.

Figure 3F:
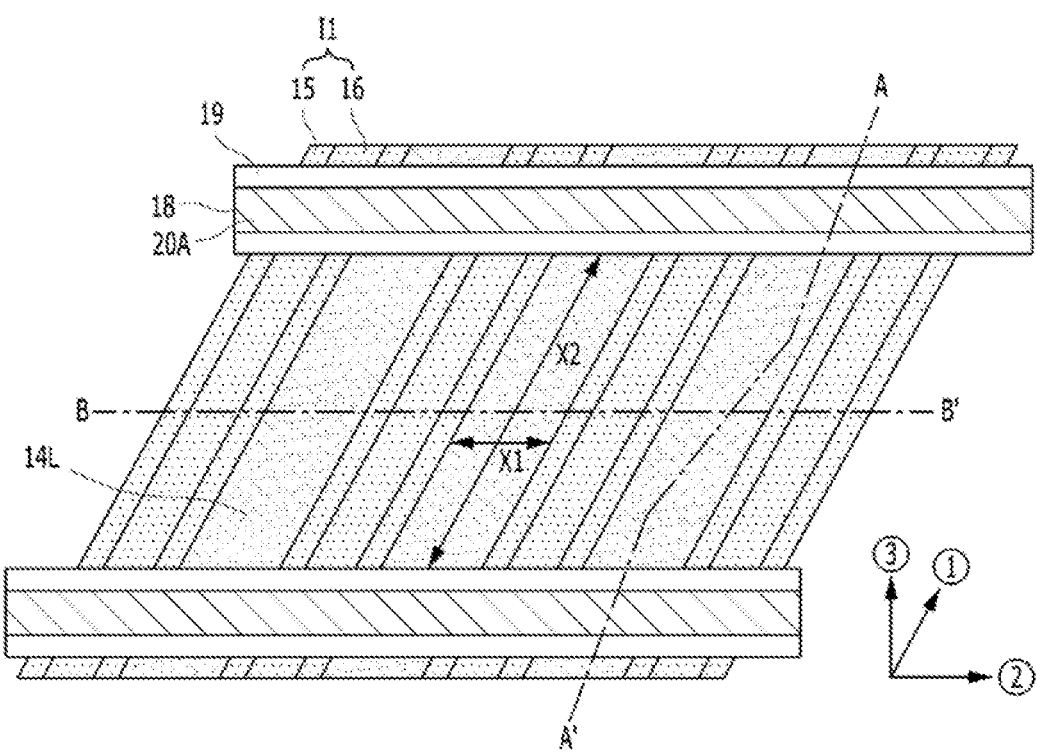
Figure 4F:
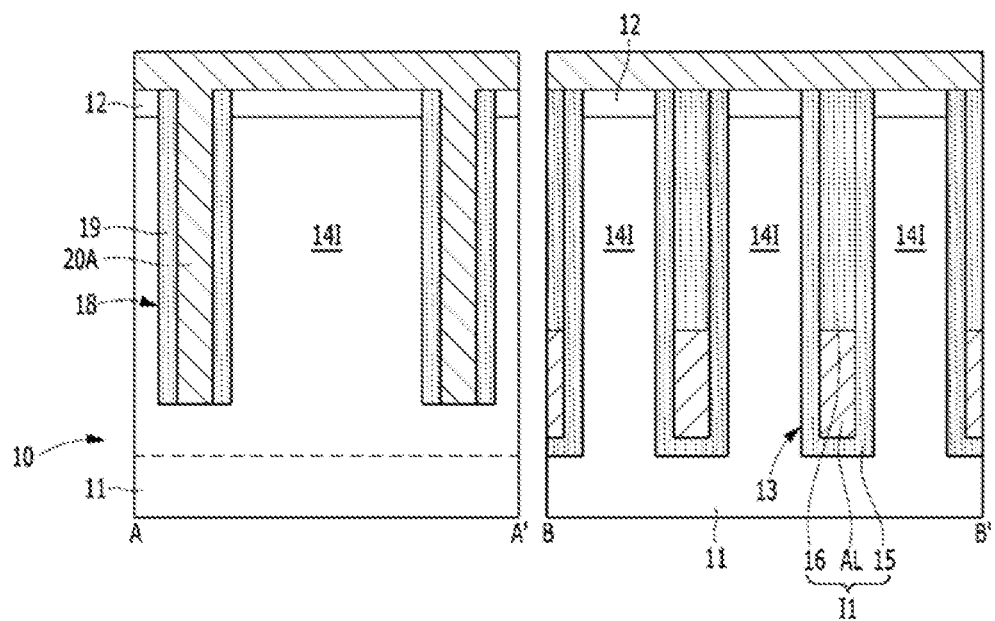

As shown in FIGS. 3F and 4F, a shield layer 20A may be formed. The shield layer 20A may include a conductive material. The shield layer 20A may be formed of a silicon-containing material. The shield layer 20A may include a polysilicon layer. The shield layer 20A may be doped with an impurity to have conductivity. The shield layer 20A may include a polysilicon layer doped with boron.

Figure 3G:
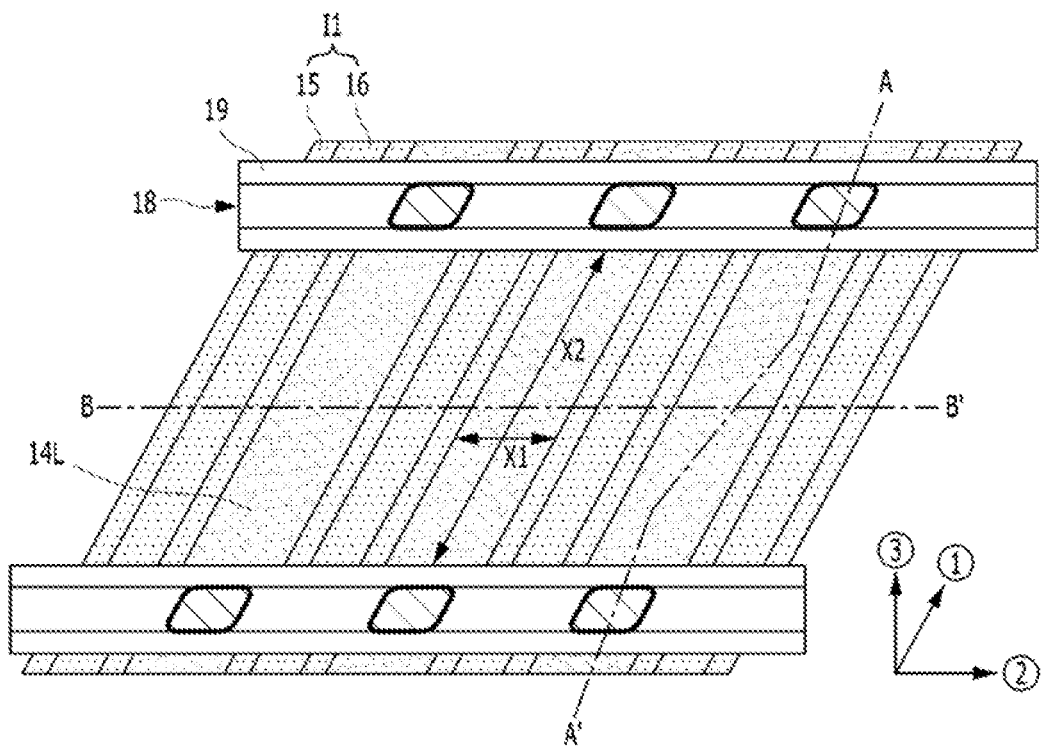
Figure 4G:
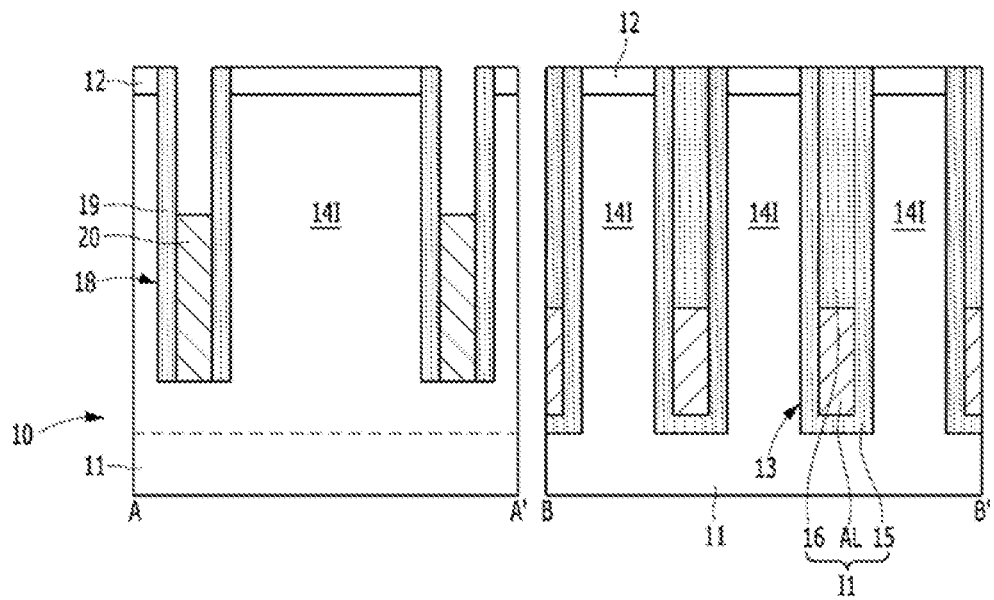

As shown in FIGS. 3G and 4G, a shield pillar 20 may be formed. The shield pillar 20 may be formed by selectively etching the shield layer 20A. For example, the shield layer 20A may be etched by an etch-back process. Thus, the shield pillar 20 may be formed in the second isolation trench 18. The shield pillar 20 may be independently positioned between the major axes of the active regions 14I. That is, neighboring shield pillars 20 may be formed separately from each other. The shield pillar 20 may be recessed such that the surface height thereof is lower than that of the top surface of the active region 14I. The spacer 19 may be formed between a sidewall of the shield pillar 20 and a sidewall of the second isolation trench 18. The bottom of the shield pillar 20 may contact the substrate 10.

Figure 3H:
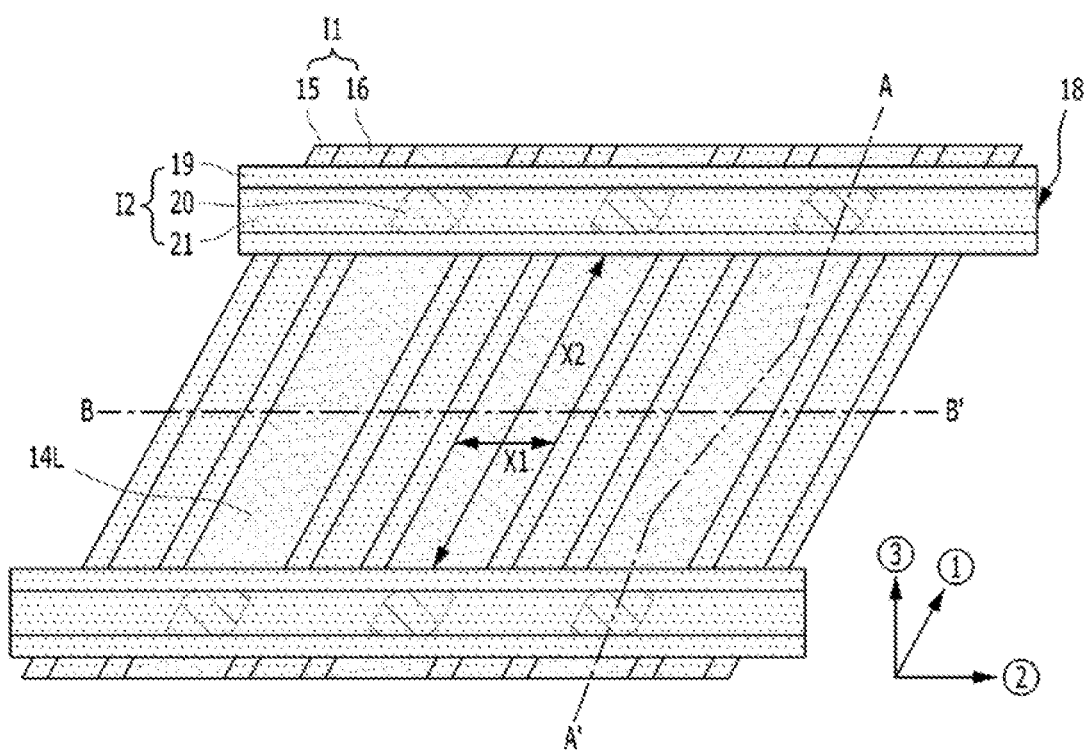
Figure 4H:
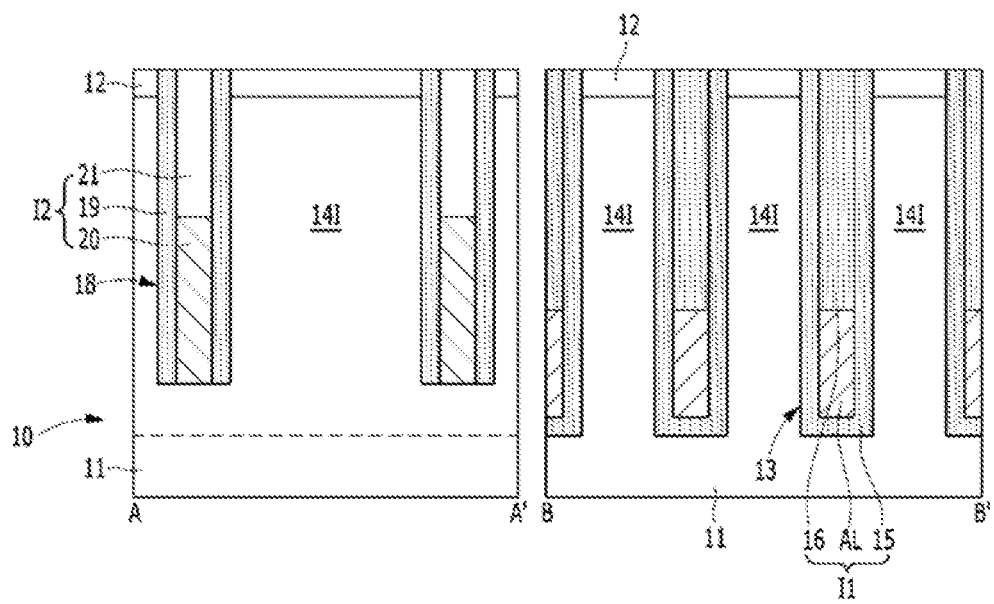

As shown in FIGS. 3H and 4H, a second isolation dielectric layer 21 may be formed. The second isolation dielectric layer 21 may be formed of silicon oxide. The second isolation dielectric layer 21 may fill the recessed region of the shield pillar 20. Subsequently, the second isolation dielectric layer 21 may be planarized. Thus, the second isolation dielectric layer 21 may remain to fill the recessed region of the shield pillar 20. The planarized surface of the second isolation dielectric layer 21 may be at the same level as the top surface of the first hard mask layer 12.

As above, a second device isolation region I2 may be formed by planarizing the second isolation dielectric layer 21. The second device isolation region I2 may include the spacer 19, the shield pillar 20 and the second isolation dielectric layer 21. The second device isolation region I2 may be formed in the second isolation trench 18. The second device isolation region I2 may have the shield pillar 20.

The island type active region 14I may be defined by the first device isolation region I1 and the second device isolation region I2. A plurality of island type active regions 14I may be defined by a plurality of first device isolation regions I1 and a plurality of second device isolation regions I2. The plurality of island type active regions 14I may be disposed in parallel with each other. It may be referred to as parallel active regions.

The shield pillar 20 may be positioned between major axes of the island type active regions 14I. Thus, PG effect may be suppressed.

FIGS. 5A to 5H are views illustrating a method for forming a buried bit line of the semiconductor in accordance with the first embodiment. FIGS. 6A to 6H are cross-sectional views taken along the lines A-A, B-B' and C-C' of FIG. 5A to 5H. Hereinafter, for convenience, in FIGS. 5A to 5H, the first device isolation region I1 and the second device isolation region I2 are shown. That is, the first liner 15, the dielectric pillar AL, the spacer 19 and the second isolation dielectric layer 21 are omitted. However, the shield pillar 20 formed in the second device isolation region I2 is shown.

Figure 5A:
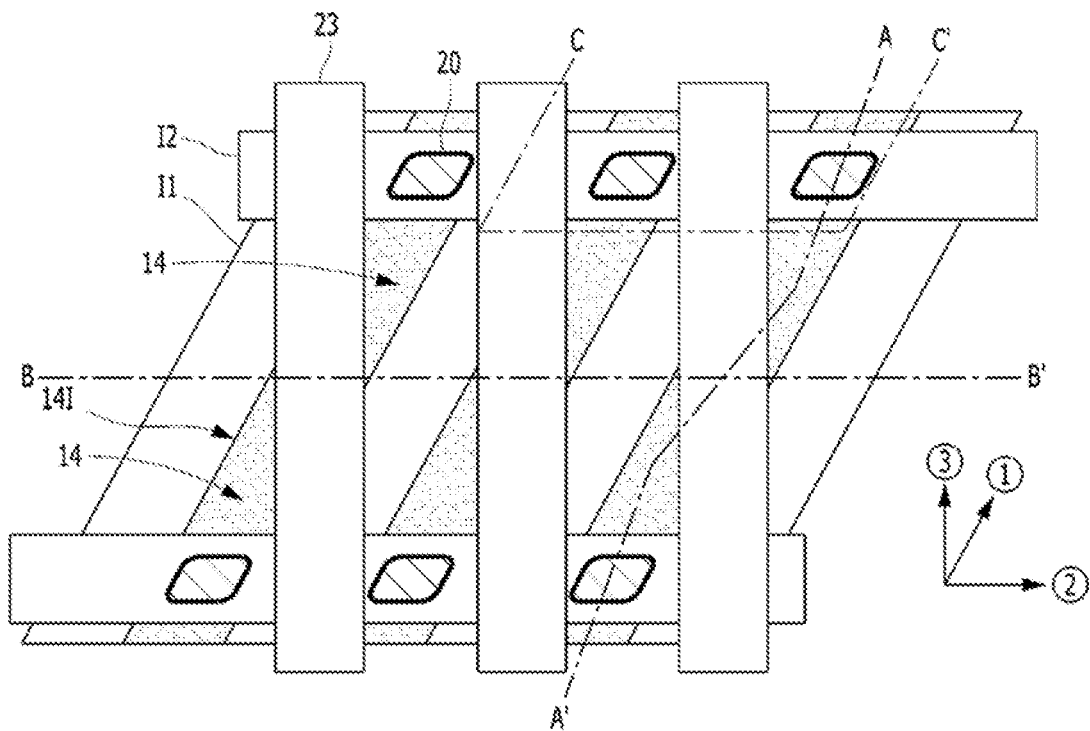
FIGS. 5A to 5H are views illustrating a method for forming a buried bit line of the semiconductor in accordance with the first embodiment.

As shown in FIGS. 5A and 6A, a second hard mask layer 22 may be formed. A plurality of line type openings 22A may be formed in the second hard mask layer 22. The second hard mask layer 22 may be formed of a material having etch selectivity with respect to the substrate 10. For example, the second hard mask layer 22 may include silicon nitride.

A bit line trench 23 may be formed. The island type active region 14I may be etched using the second hard mask layer 22 having the line type openings as an etch mask. Thus, the line type bit line trench 23 may be formed. The bit line trench 23 may be a line type extending in a third direction ③. The bit line trench 23 may extend in a direction crossing with the second isolation trench 18. The bit line trench 23 may be formed to be shallower than the first and second isolation trenches 13 and 18. The bit line trench 23 may have a depth sufficient to increase the average cross-sectional area of a subsequent gate electrode.

To form the bit line trench 23, in addition to the island type active region 14I, the first device isolation region I1 and the second device isolation region I2 may also be etched. A part of the island type active region 14I may be divided into preliminary pillars 14 by the bit line trench 23. A remaining portion 14B of the island type active region 14I may be formed under the preliminary pillar 14. The remaining portion 14B may be referred to as a body 14B.

Figure 5B:
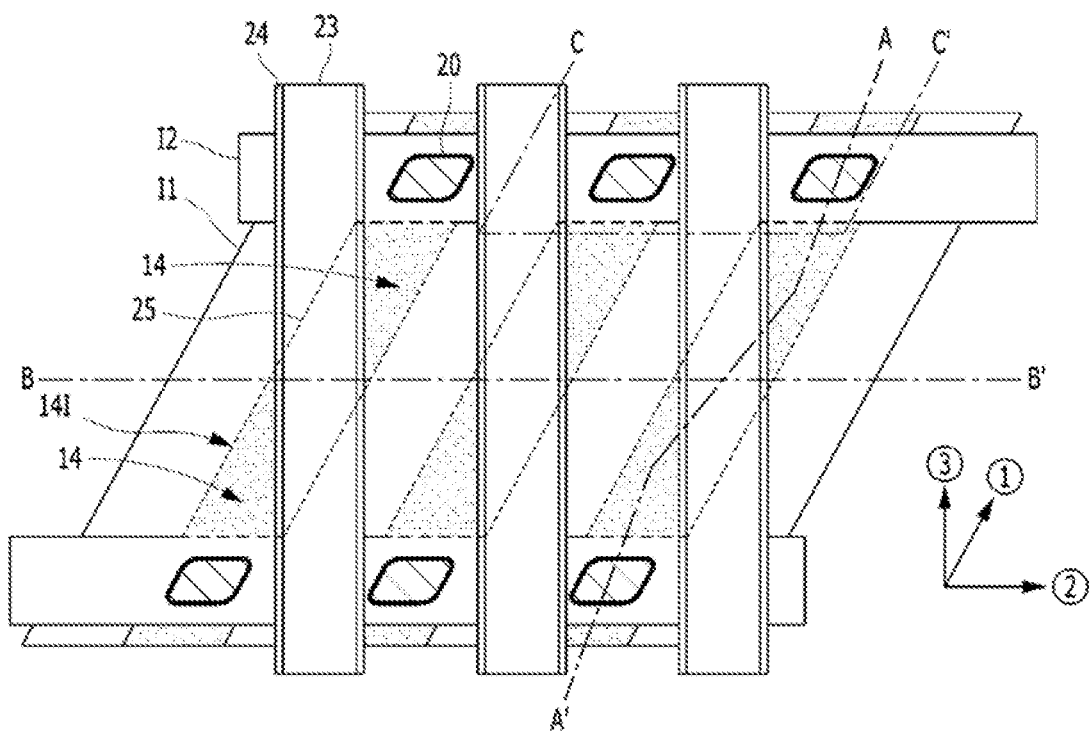
Figure 6B:
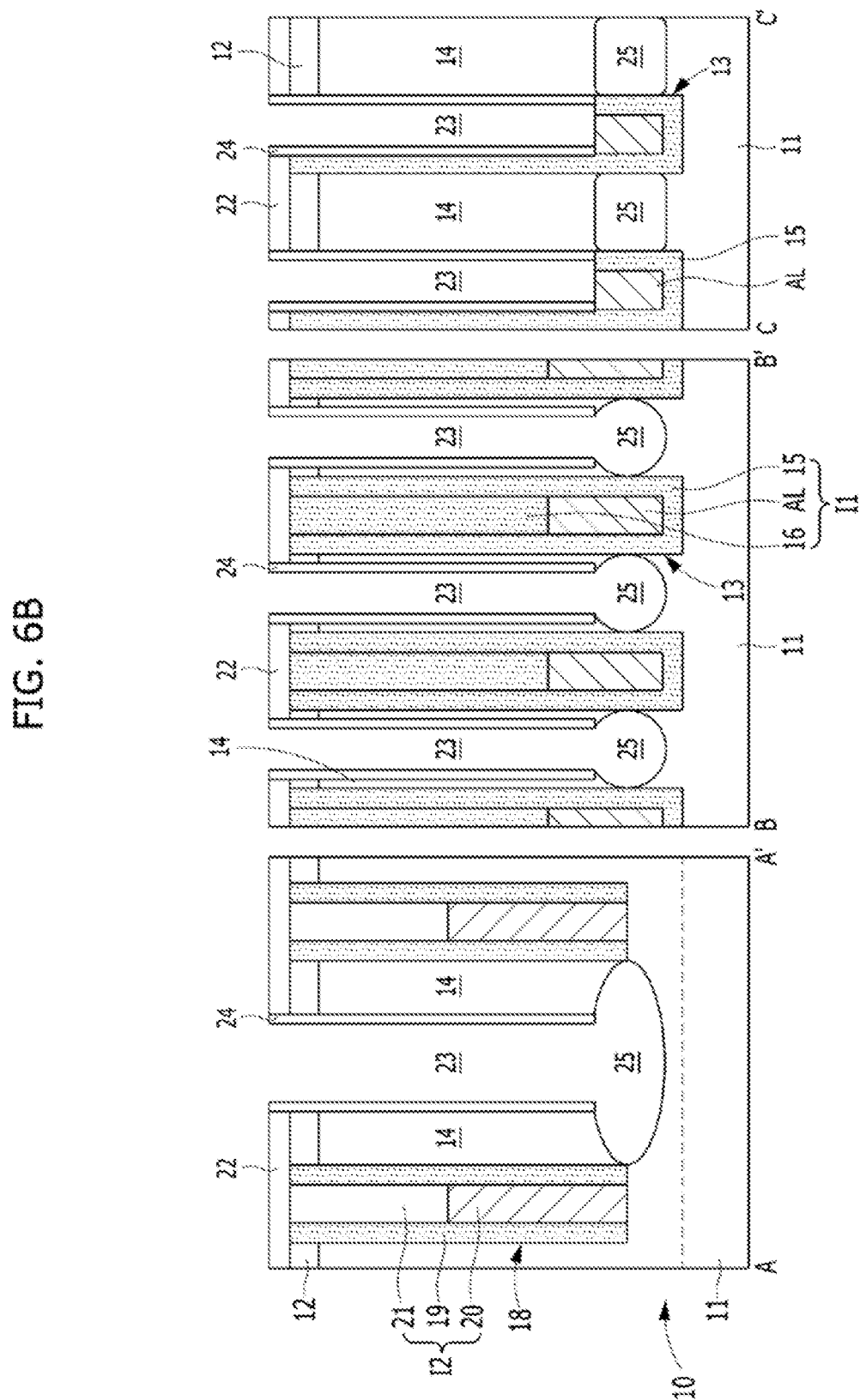

As shown in FIGS. 5B and 6B, a liner spacer 24 may be formed. The liner spacer 24 may be formed on both sidewalls of the bit line trench 23. The liner spacer 24 may be formed by depositing silicon oxide followed by an etch-back process.

A body trench 25 may be formed. The body trench 25 may be formed by etching the bottom surface of the bit line trench 23 to a given depth. The bottom surface of the bit line trench 23 may be extended by using the second hard mask layer 22 and the liner spacer 24 as etch masks. Thus, a part of the body 14B may be etched to form the body trench 25.

To form the body trench 25, isotropic etching may be performed. According to the isotropic etching, the body trench 25 may be a bulb type. The line width of the body trench 25 may be larger than that of the bit line trench 23. The depth of the body trench 25 may be shallower than those of the first and second isolation trenches 13 and 18. The body trench 25 may extend in the first direction ① under the preliminary pillar 14. For example, the side surface of the body trench 25 may be extended to be adjacent to the sidewalls of the second isolation trench 18.

When the bit line trench 23 and the body trench 25 are formed, the island type active region 14I may be divided into a pair of preliminary pillars 14. That is, the pair of preliminary pillars 14 may be spaced apart from each other by the bit line trench 23 and the body trench 25.

Figure 5C:
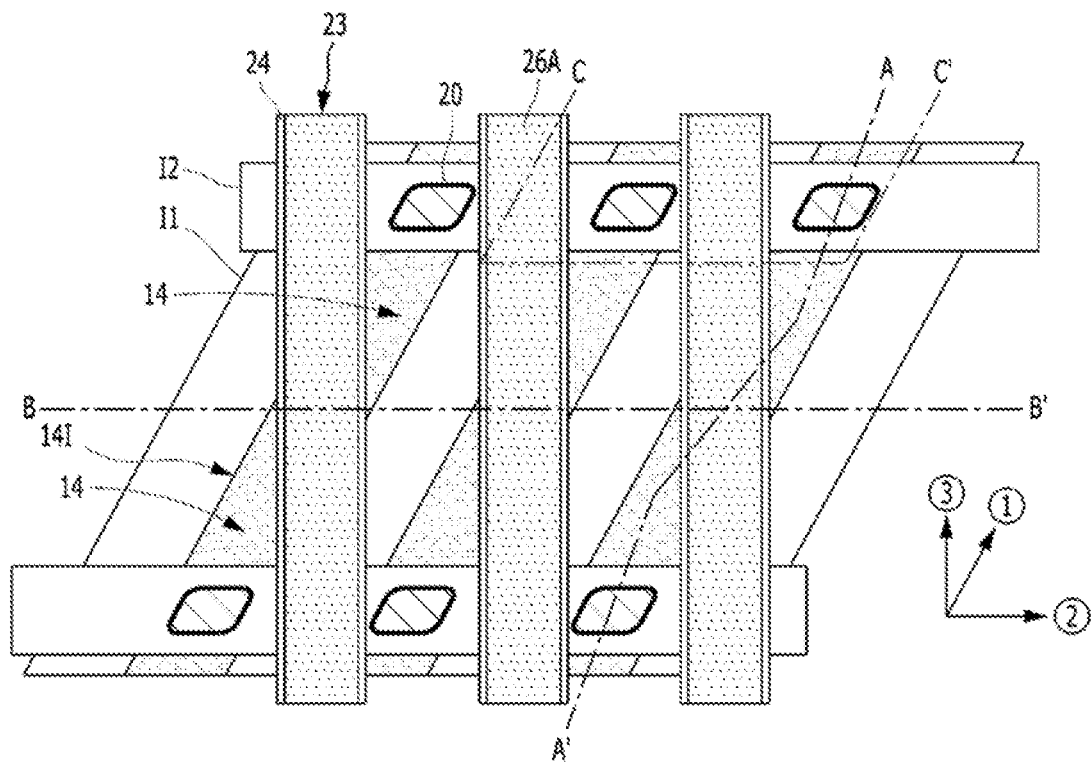
Figure 6C:
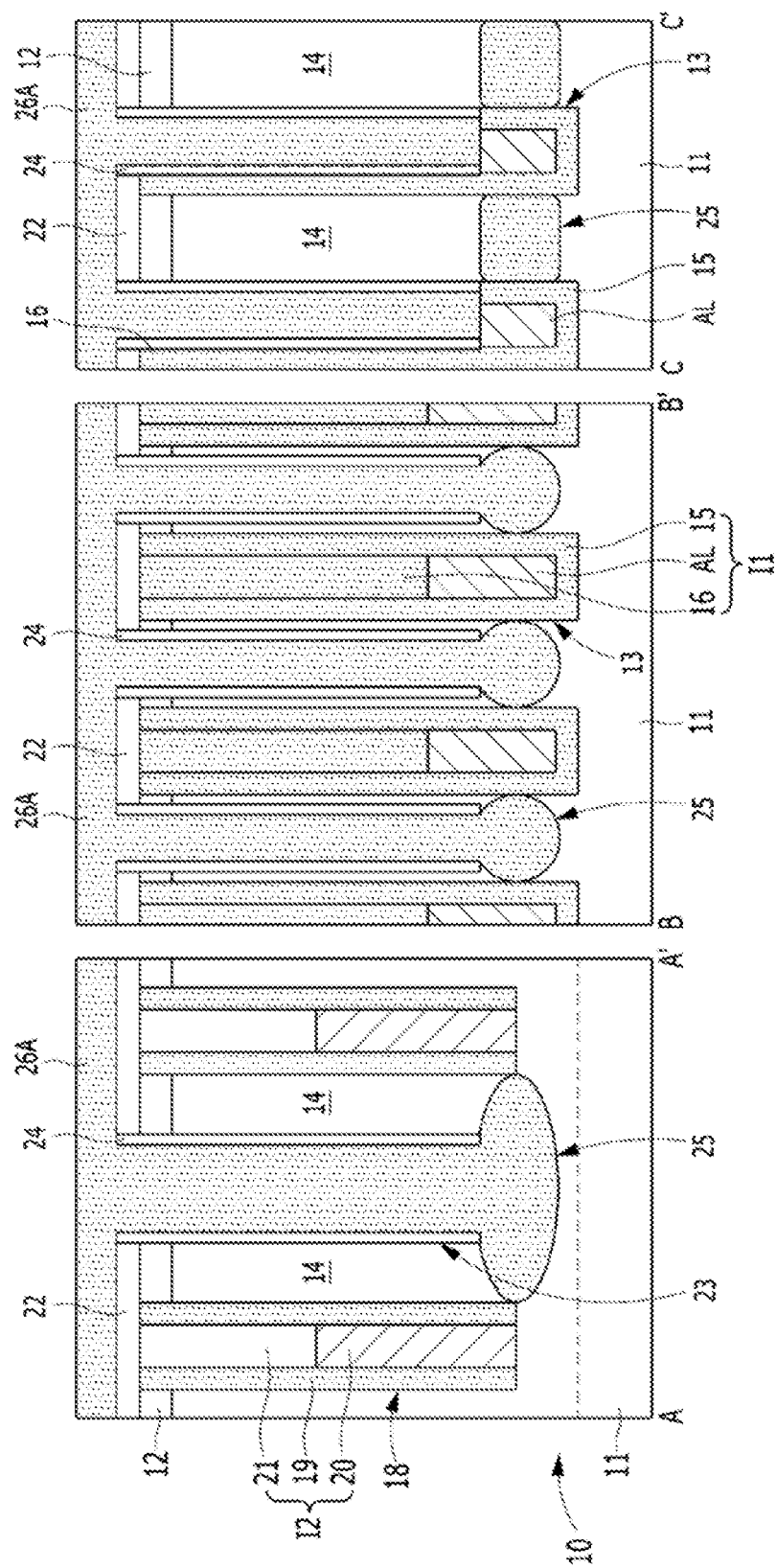

As shown in FIGS. 5C and 6C, a preliminary punch-through preventing layer 26A may fill the body trench 25 and the bit line trench 23. The preliminary punch-through preventing layer 26A may be formed of a dielectric material. To form the preliminary punch-through preventing layer 26A, the bit line trench 23 and the body trench 25 may be filled with a spin-on-dielectric (SOD).

Figure 5D:
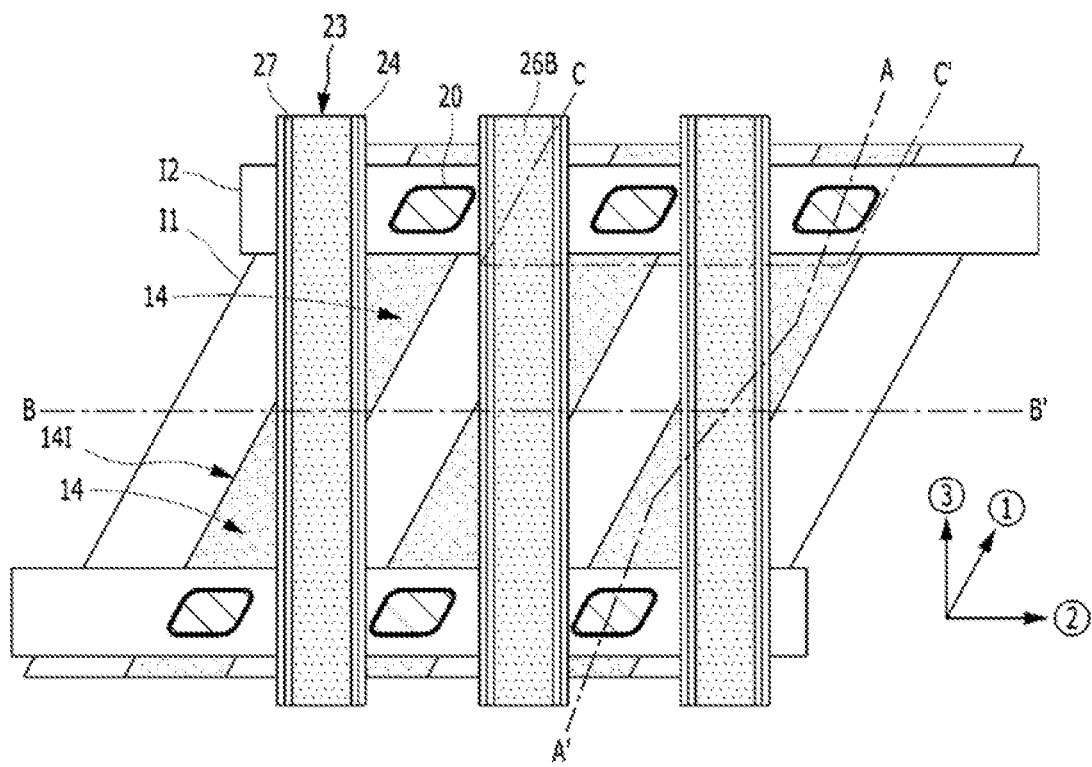
Figure 6D:
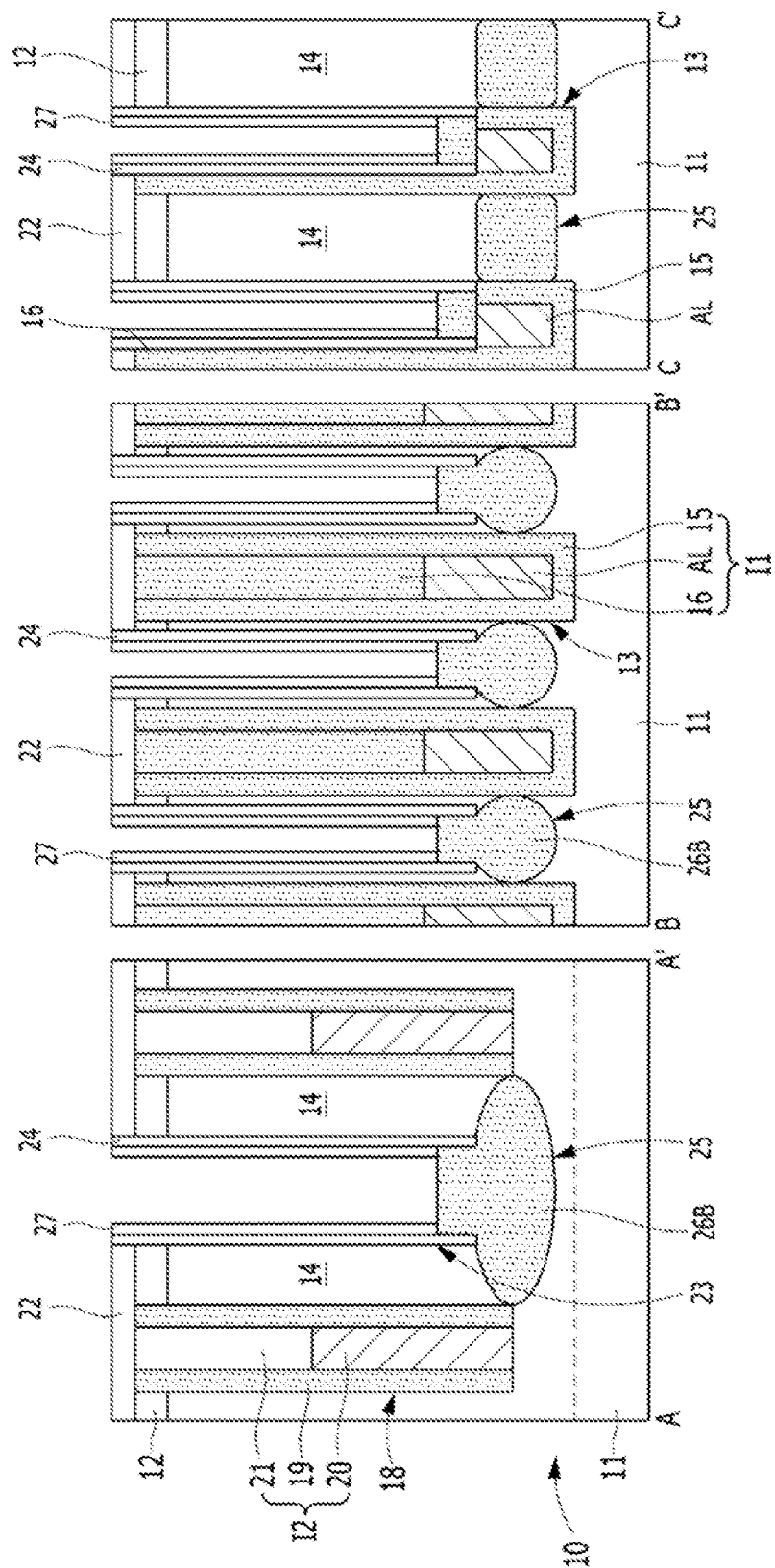

As shown in FIGS. 5D and 6D, a recessed punch-through preventing layer 26B may be formed. For example, the preliminary punch-through preventing layer 26A may be recessed to a given depth. The recessed punch-through preventing layer 26B may fill at least the body trench 25. A portion of the recessed punch-through preventing layer 26B is positioned at the bottom of the bit line trench 23. The pair of preliminary pillars 14 may float from the bulk 11 by the recessed punch-through preventing layer 26B. Moreover, electrical connection between the pair of the preliminary pillars 14 may be suppressed by the recessed punch-through preventing layer 26B. To form the recessed punch-through preventing layer 26B, a planarization process and then an etch-back process may be performed.

Then, a sacrificial spacer 27 may be formed. The sacrificial spacer 27 may cover the sidewalls of the liner spacer 24. The sacrificial spacer 27 may be formed of titanium nitride. For example, the sacrificial spacer 27 may be formed by conformally depositing titanium nitride followed by an etch-back process.

Figure 5E:
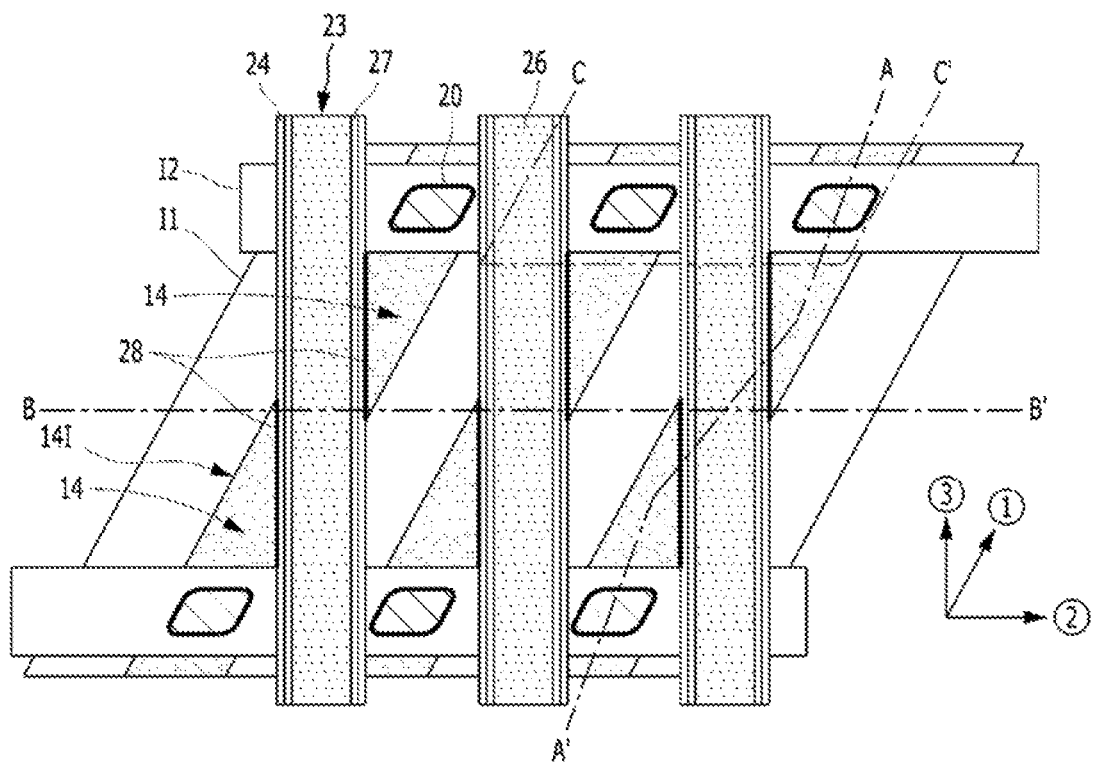

As shown in FIGS. 5E and 6E, an opening 28 exposing the bottom sidewall of the preliminary pillar 14 may be formed. To form the opening 28, the recessed punch-through preventing layer 26B may be recessed to a given depth by using the sacrificial spacer 27 as a barrier. Thus, a punch-through preventing layer 26 may be formed. The punch-through preventing layer 26 may fill the body trench 25. As the punch-through preventing layer 26 is recessed, a part of the liner spacer 24 may be exposed. Then, the exposed portion of the liner spacer 24 may be selectively removed.

Thus, the opening 28 exposing the bottom sidewall of the preliminary pillar 14 may be formed. The opening 28 is a region contacting a subsequent buried bit line and may be both side contact (BSC) exposing bottom sidewalls of neighboring preliminary pillars 14 simultaneously. For example, both bottom sidewalls of the bit line trench 23 may be simultaneously exposed by the opening 28. The upper sidewalls of the preliminary pillar 14 which are not exposed by the opening 28 may be covered by the liner spacer 24. Thus, this embodiment does not require additional contact masks for forming the opening 28.

Figure 5F:
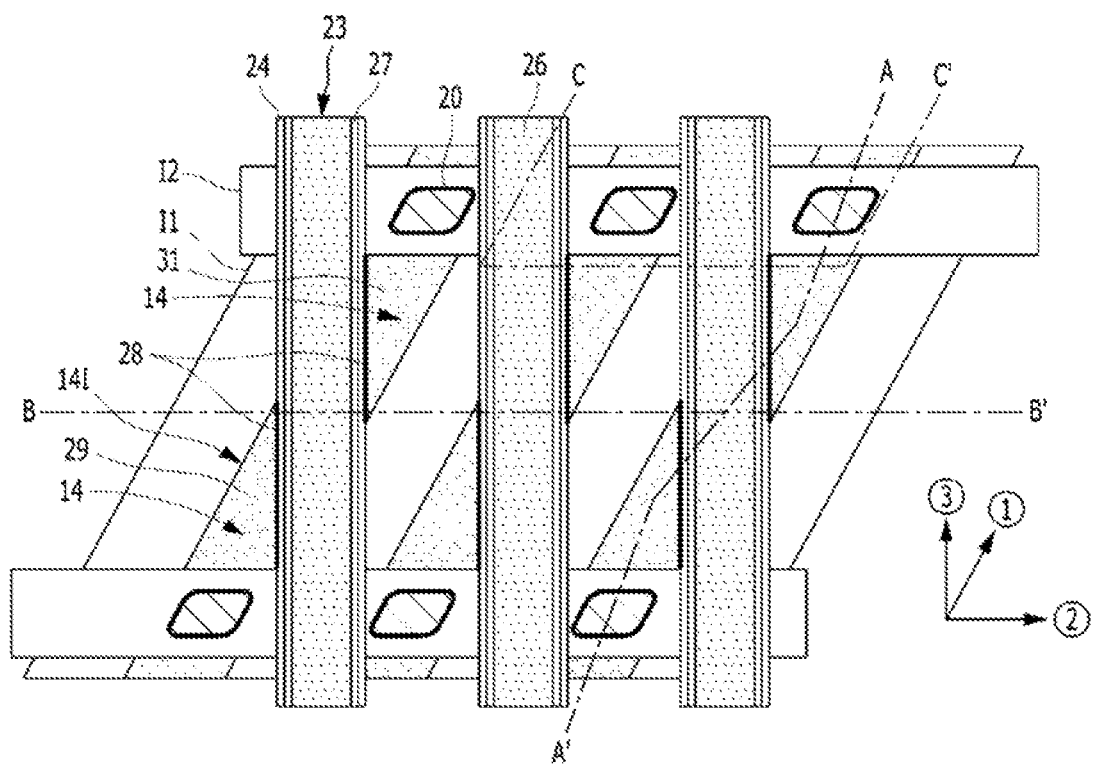
Figure 6F:
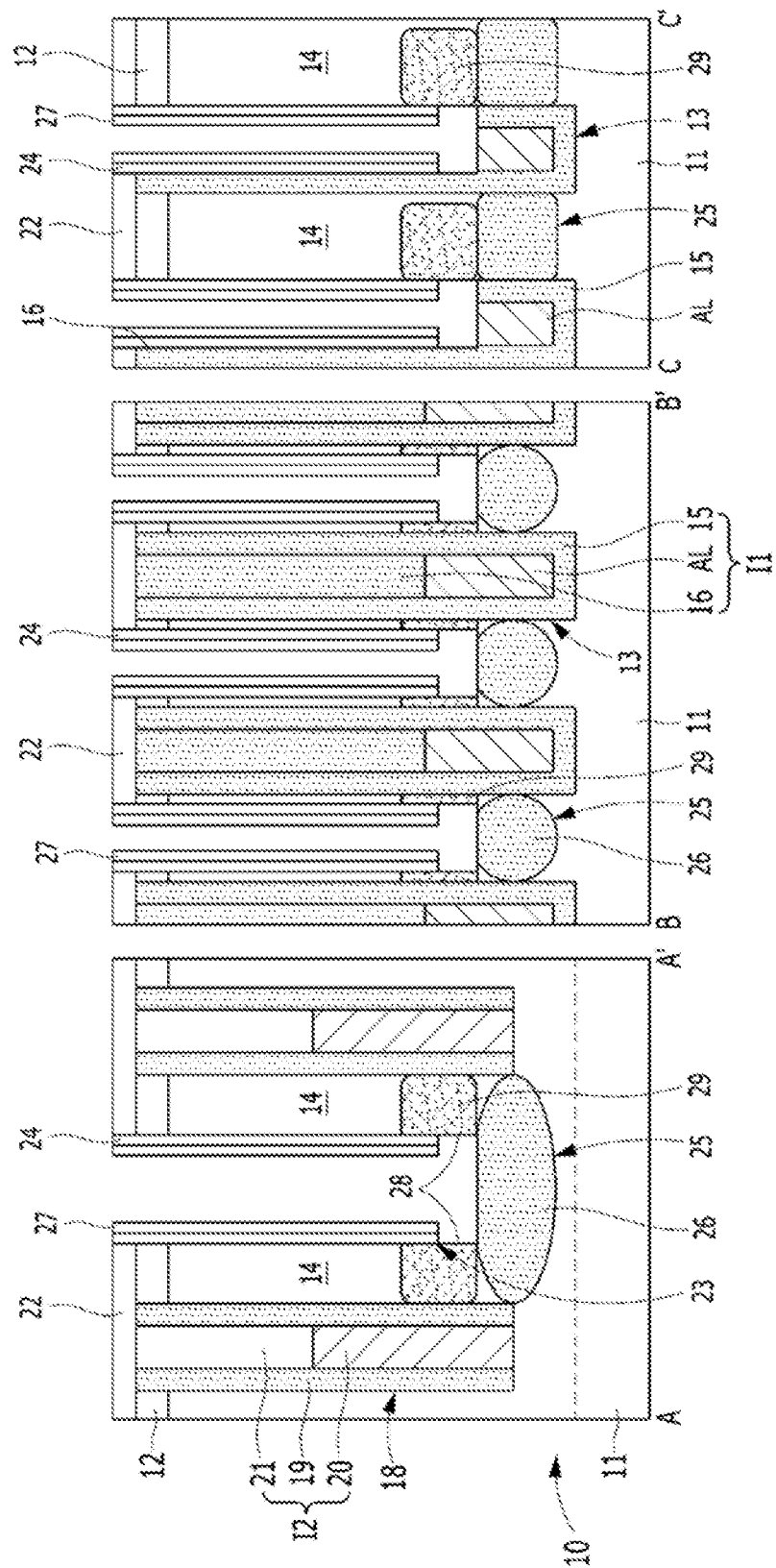

As shown in FIGS. 5F and 6F, a first junction region 29 may be formed. To form the first junction region 29, an impurity doping process may be performed by a plasma doping technology. For example, the impurity may be plasma doped through the opening 28 to form the first junction region 29. In the doping process, the impurity may include an N-type impurity or a P-type impurity. For example, phosphorous (P) or arsenic (As) may be used as the impurity. The first junction region 29 may be formed at the bottom of the preliminary pillar 14. The first junction region 29 may be formed floating from the bulk 11. That is, it may be separated from the bulk 11 by the punch-through preventing layer 26. Moreover, lateral diffusion of the first junction region 29 may be suppressed by the second device isolation region I2.

Figure 5G:
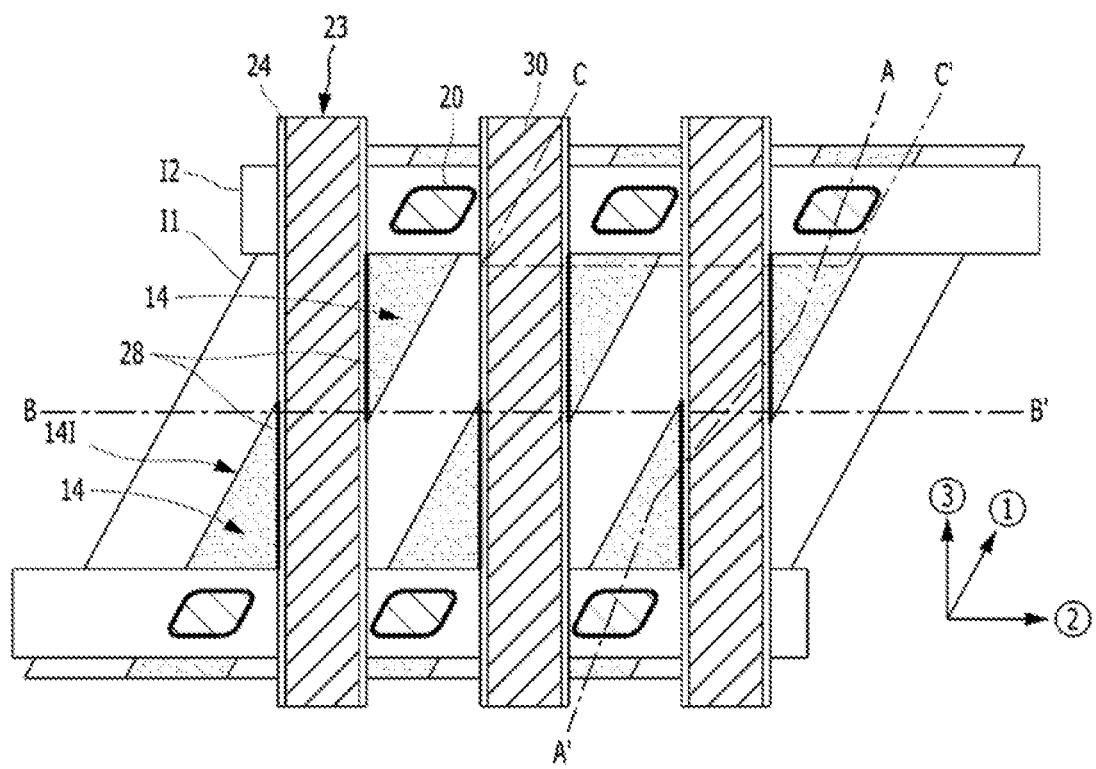
Figure 6G:
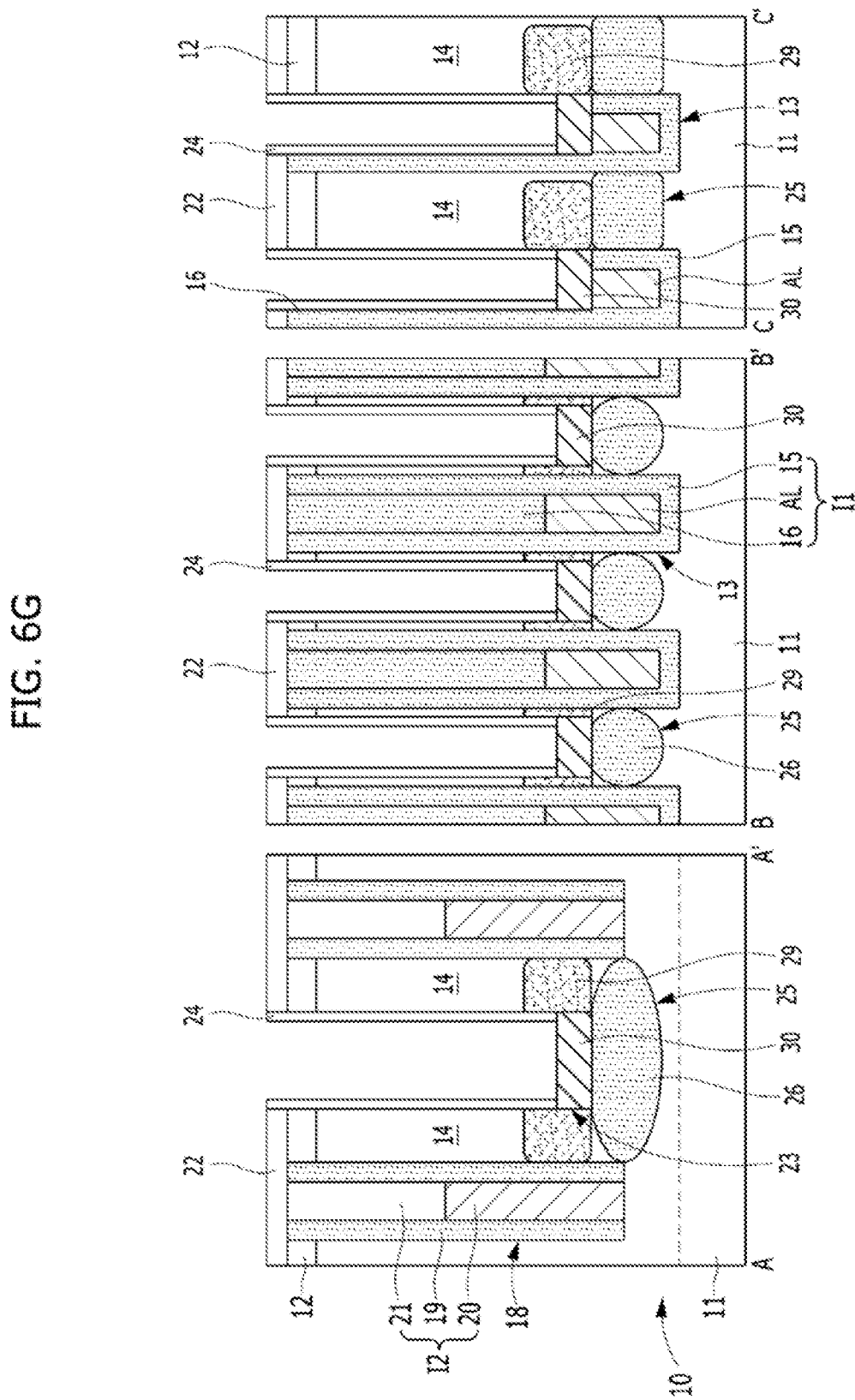

As shown in FIGS. 5G and 6G, a bit line 30 may be formed. For example, the bit line 30 may be formed by forming a metal layer (not shown) to bury the bit line trench 23 and then etching back the metal layer. Here, the bit line 30 may include tungsten (W). Both ends of the bit line 30 may be electrically coupled to the first junction region 29 by filling the opening 28. The punch-through preventing layer 26 may be positioned between the bit line 30 and the bulk 11.

Before forming the bit line 30, an ohmic contact layer (not shown) for an ohmic contact between the first junction region 29 and the bit line 30 may be formed. The ohmic contact layer may include metal silicide. For example, the ohmic contact layer may include cobalt silicide. To form cobalt silicide, a cobalt layer may be deposited on the whole surface of the structure having the first junction region 29 and then a thermal treatment may be performed. Subsequently, an unreacted cobalt layer may be removed.

As described above, the bit line 30 may contact the first junction region 29 without a plug. It may be referred to as a plugless contact.

Figure 5H:
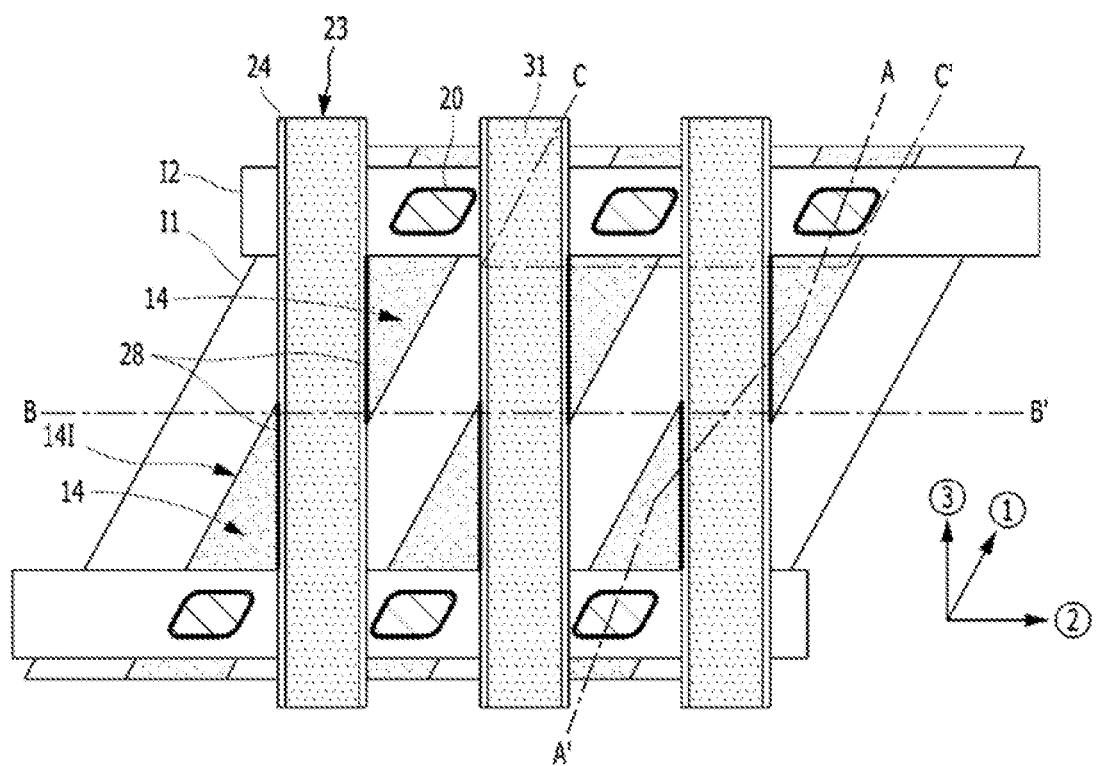
Figure 6H:
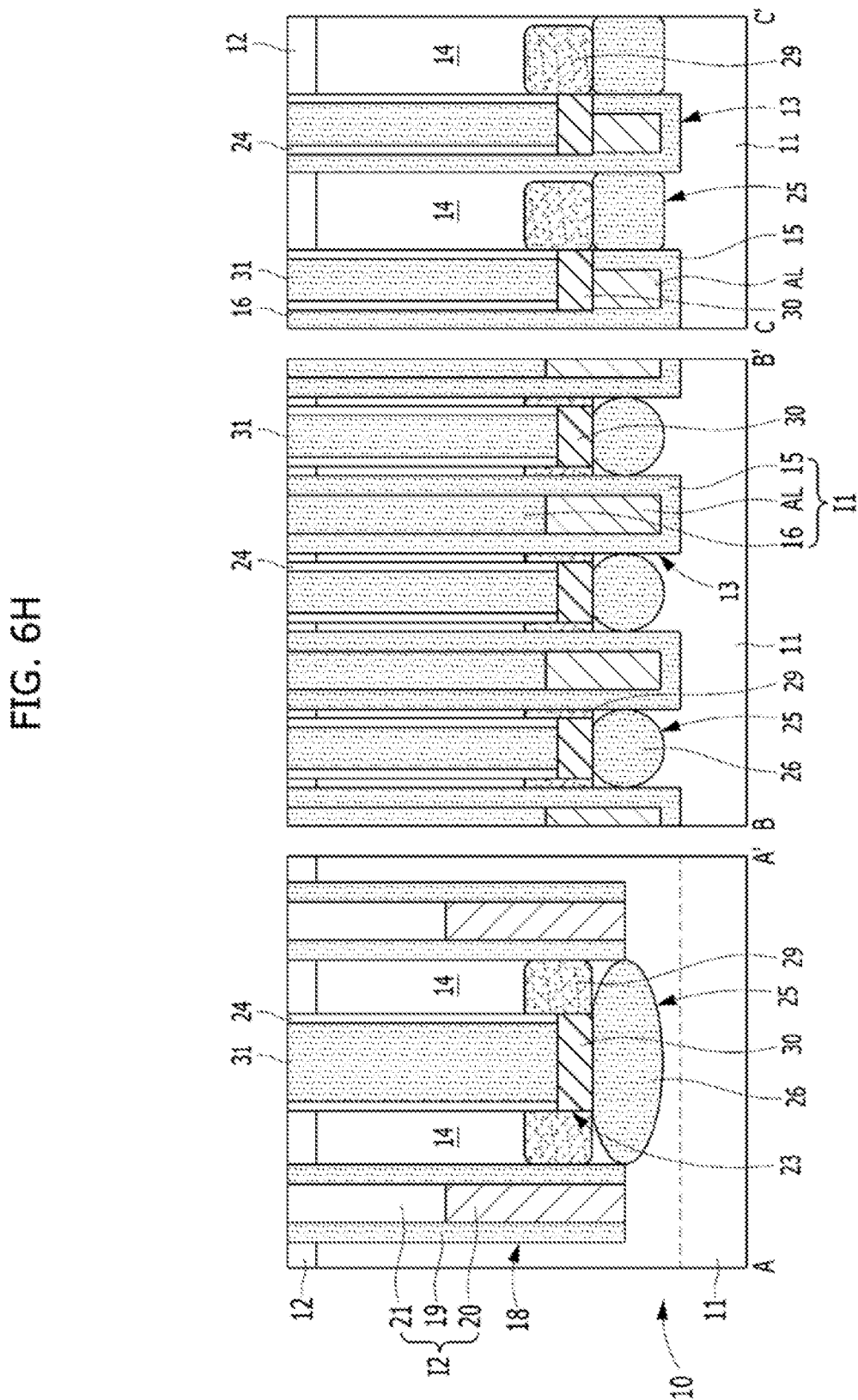

As shown in FIGS. 5H and 6H, the sacrificial spacer 27 may be selectively removed. To cover the bit line 30, a bit line capping layer 31 may be formed to bury the bit line trench 23. Here, the bit line capping layer 31 may include silicon oxide. Subsequently, the bit line capping layer 31 may be planarized until the surface of the first hard mask layer 12 is exposed.

Figure 7A:
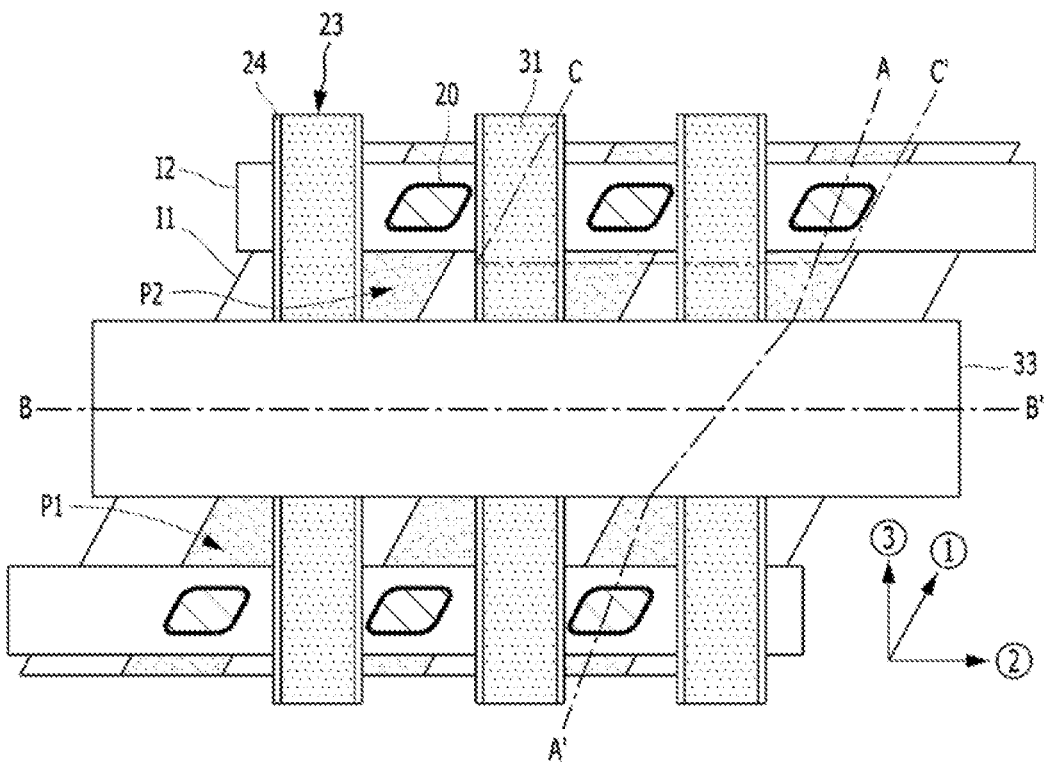
FIGS. 7A to 7H are views illustrating a gate electrode of the semiconductor device in accordance with the first embodiment.

FIGS. 7A to 7H are views illustrating an example of a gate electrode of the semiconductor device in accordance with the first embodiment. FIGS. 8A to 8H are cross-sectional views taken along the lines A-A', B-B' and C-C' of FIG. 7A to 7H. As shown in FIGS. 7A and 8A, a preliminary gate trench 33 may be formed. For example, the preliminary gate trench 33 may be formed by etching the bit line capping layer 31, the first device isolation region I1 and the preliminary pillar 14 by using a third hard mask layer 32 as an etch mask which is annotated with the reference number 32A. An etch process for forming the preliminary gate trench 33 may be performed until the bit line capping layer 31 remains with a given thickness. The preliminary gate trench 33 may extend in a direction crossing with the bit line 30. The preliminary gate trench 33 may extend in the second direction ②. The first junction region 29 may be exposed at the bottom of the preliminary gate trench 33.

A pair of first and second pillars P1 and P2 may be formed by the preliminary gate trench 33. The first and second pillars P1 and P2 may be formed by etching the preliminary pillar 14. Each of the first and second pillars P1 and P2 may become a structure having multi-sidewalls. During the etch process for forming the preliminary gate trench 33, a part of the liner spacer 24 may be etched. Along the line B-B', under the preliminary gate trench 33, the top surfaces of the liner spacer 24, the first device isolation region I1 and the bit line capping layer 31 may be at the same level as one another. The liner spacer 24 may be referred to as a bit line capping liner 24.

Figure 7B:
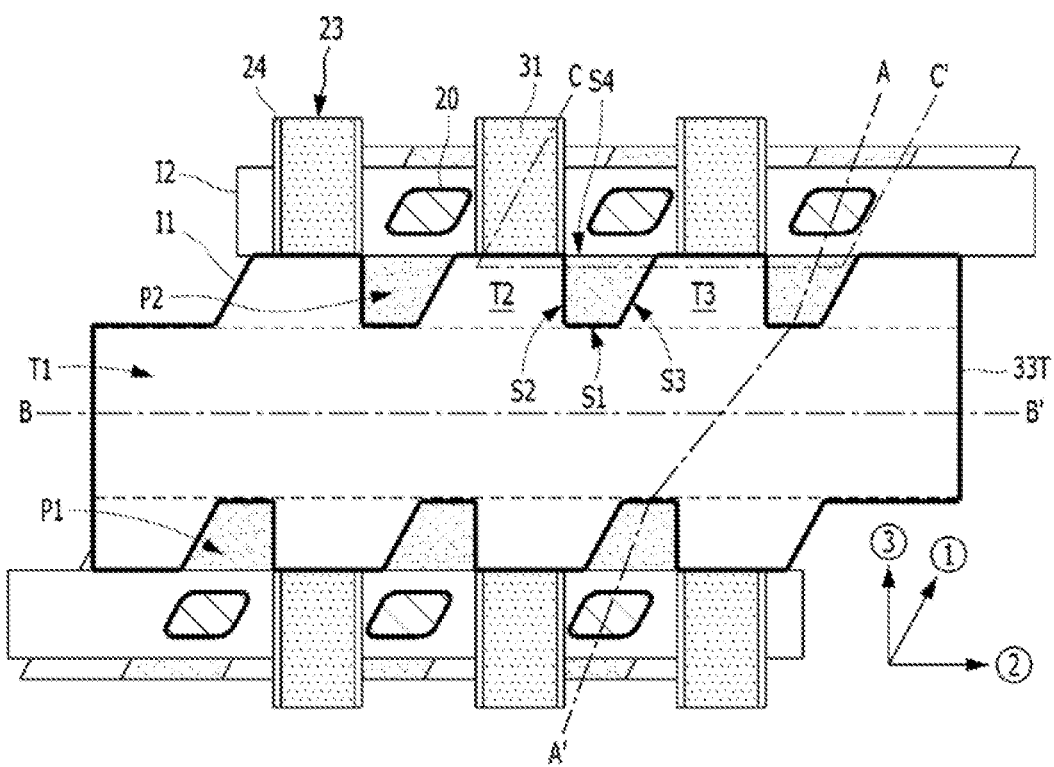
Figure 8A:
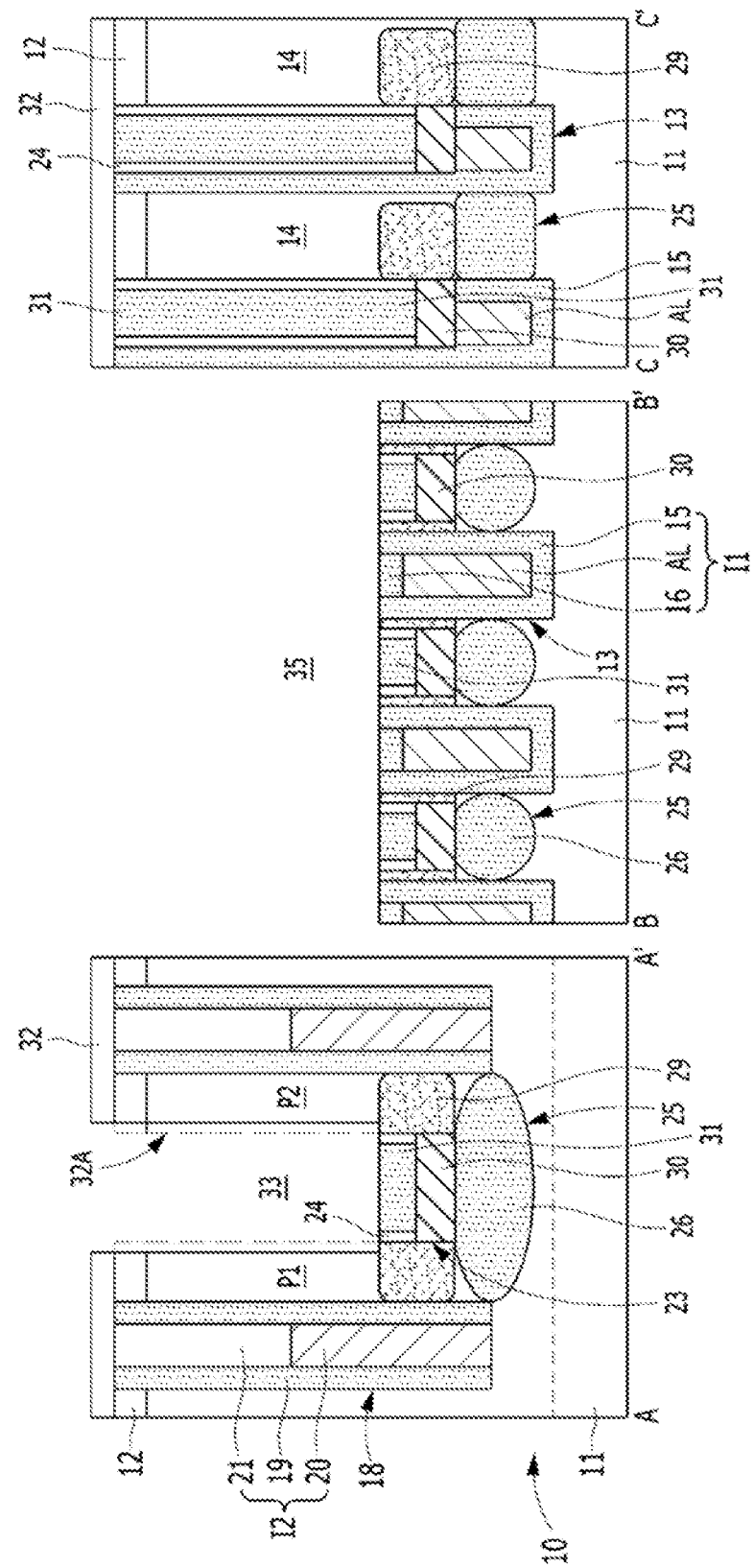
Figure 8B:
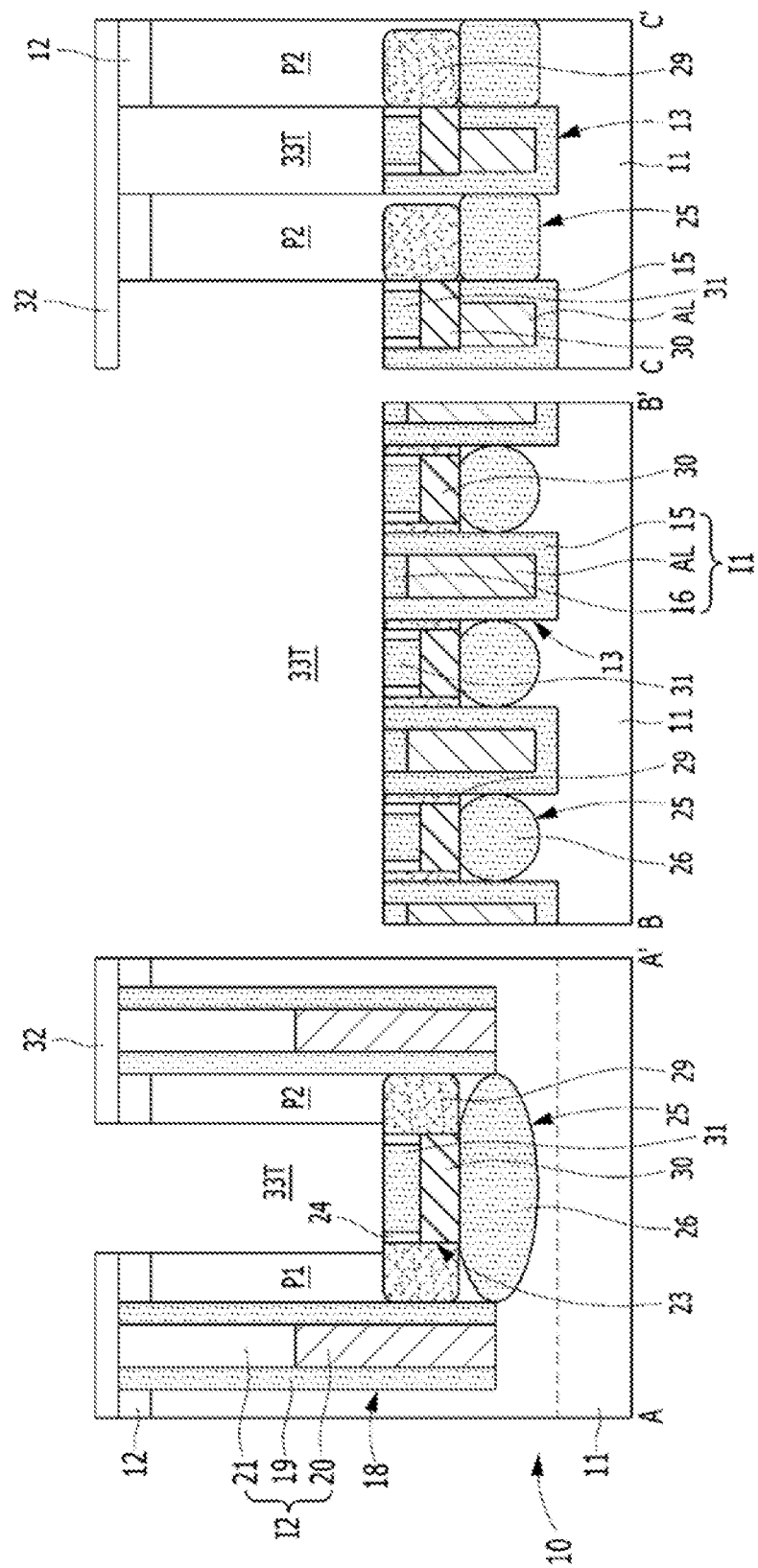

As shown in FIGS. 7B and 8B, an extending process of the preliminary gate trench 33 may be performed. For example, a part of bit line capping layer 31 and a part of the first device isolation region I1 may be selectively etched by a wet etch process. It may be referred to as a widening process. The widening process may use wet etching. The preliminary gate trench 33 may extend in the first direction ① by etching a part of the first device isolation region I1 and a part of the bit line capping layer 31 using wet widening. According to the wet widening process, oxides may be selectively removed. For example, the first liner 15, the first isolation dielectric layer 16, the bit line capping liner 24 and the bit line capping layer 31 may be selectively removed.

A preliminary gate trench extended by the wet widening process may be referred to as a gate trench 33T. The gate trench 33T may include a first trench T1, a second trench T2 and a third trench T3. The first trench T1 may extend in the second direction ②. The first trench T1 may be positioned between the first pillar P1 and the second pillar P2. The second trench T2 and the third trench T3 may branch from the first trench T1. The second trench T2 and the third trench T3 may extend in the first direction ① crossing with the second direction ②.

Side surfaces of the first and second pillars P1 and P2 may be exposed by the first trench T1, the second trench T2 and the third trench T3. For example, a first side surface S1, a second side surface S2 and a third side surface S3 may be exposed. The first side surface S1 may be exposed by the first trench T1, and the second side surface S2 and the third side surface S3 may be exposed by the second trench T2 and the third trench T3, respectively. The second trench T2 and the third trench T3 may be the same as each other in terms of size and shape. The first and second pillars P1 and P2 may include a fourth side surface S4, and the fourth side surface S4 may contact the second device isolation region I2. The second device isolation region I2 may contact the second trench T2 and the third trench T3.

After the wet widening process, the bit line capping layer 31 and the bit line capping liner 24 may remain to a given thickness on the bit line 30.

Figure 7C:
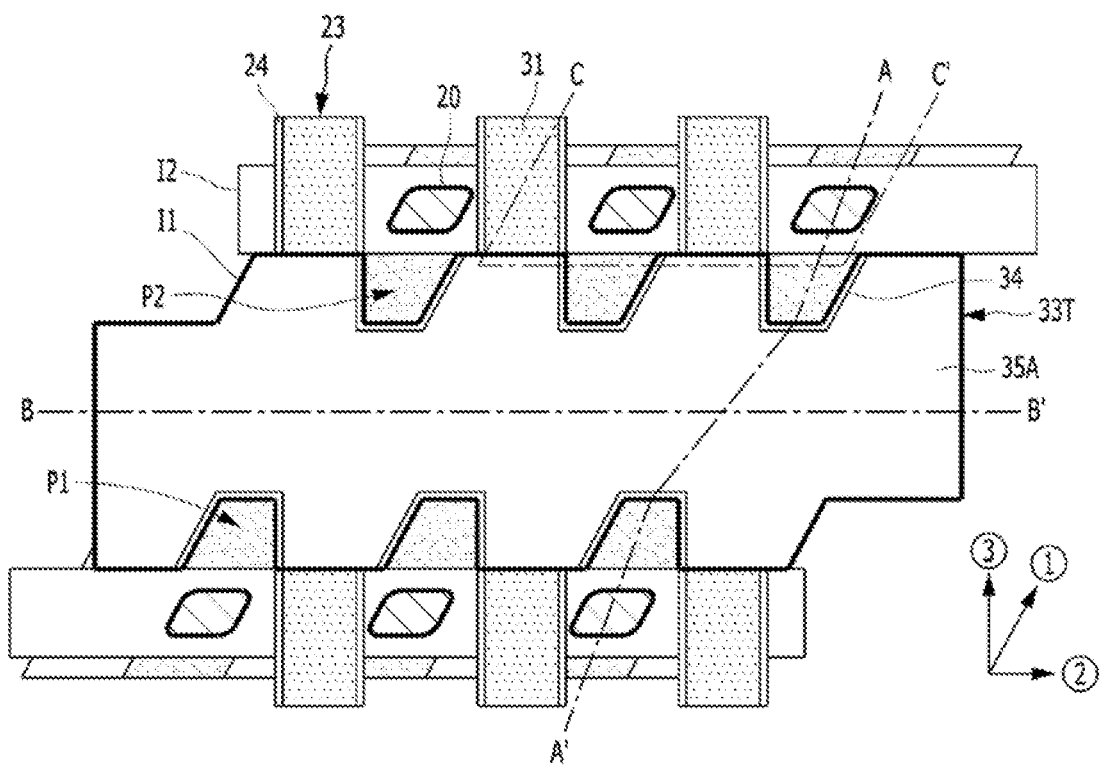
Figure 8C:
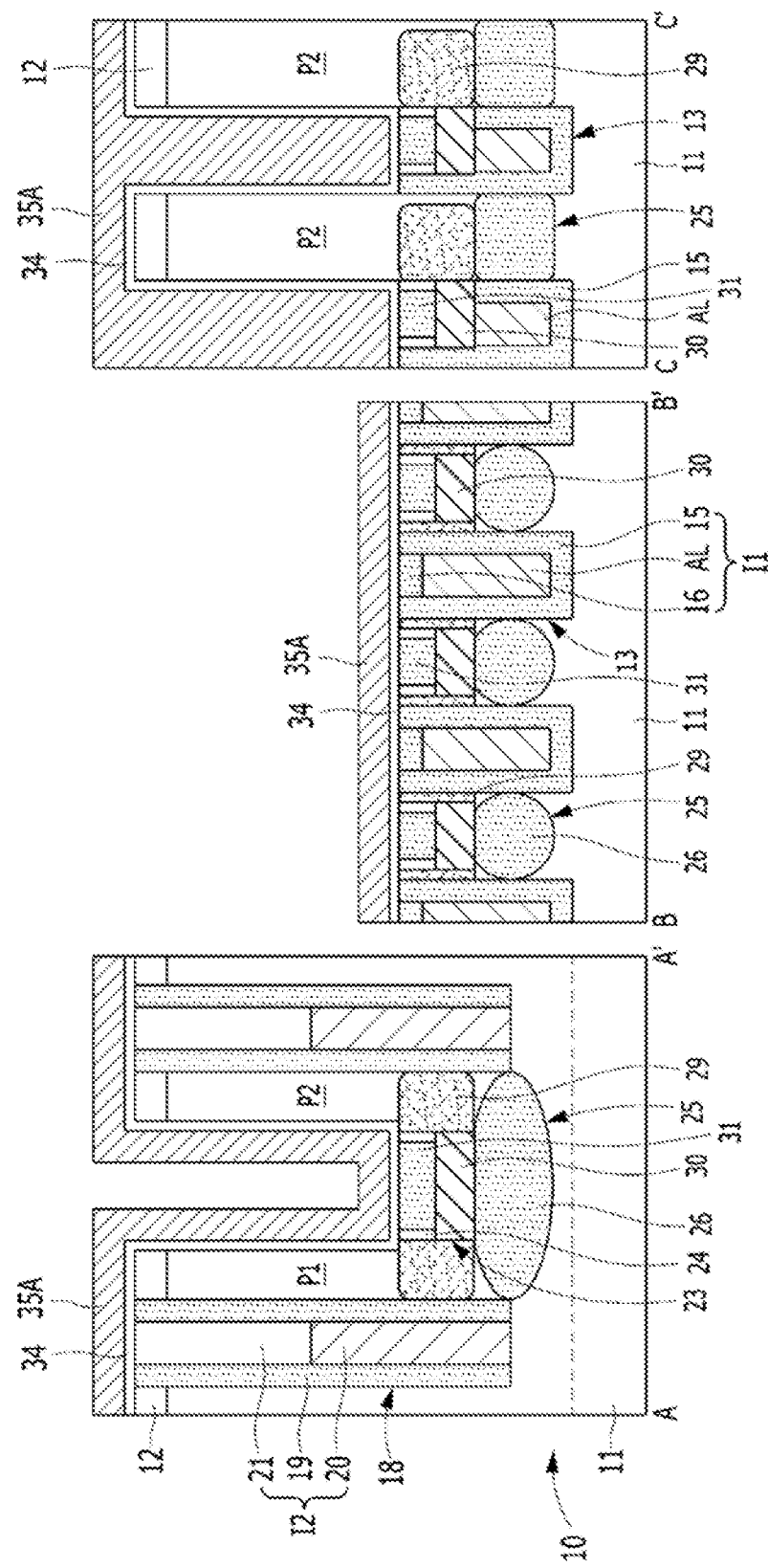

As shown in FIGS. 7C and 8C, the third hard mask layer 32 may be removed. Then, a gate dielectric layer 34 may be formed on the surface of the gate trench 33T.

The gate dielectric layer 34 may be formed by a thermal oxidation process. In another embodiment, the gate dielectric layer 34 may be formed by chemical vapor deposition (CVD) or atomic layer deposition (ALD). The gate dielectric layer 34 may include a high-k material, an oxide, a nitride, an oxynitride or a combination thereof. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

A first gate conductive layer 35A may be formed on the gate dielectric layer 34. The first gate conductive layer 35A may be conformally formed on the gate trench 33T. The first gate conductive layer 35A may include a low resistivity metal material. The first gate conductive layer 35A may be formed of titanium nitride, tungsten, and so on. In one embodiment, the first gate conductive layer 35A may include a lower barrier layer and a low resistivity layer. Moreover, the first gate conductive layer 35A may include a high work function material to control threshold voltage gate. The conductive layer 35A may include TiAlN as the high work function material.

Figure 7D:
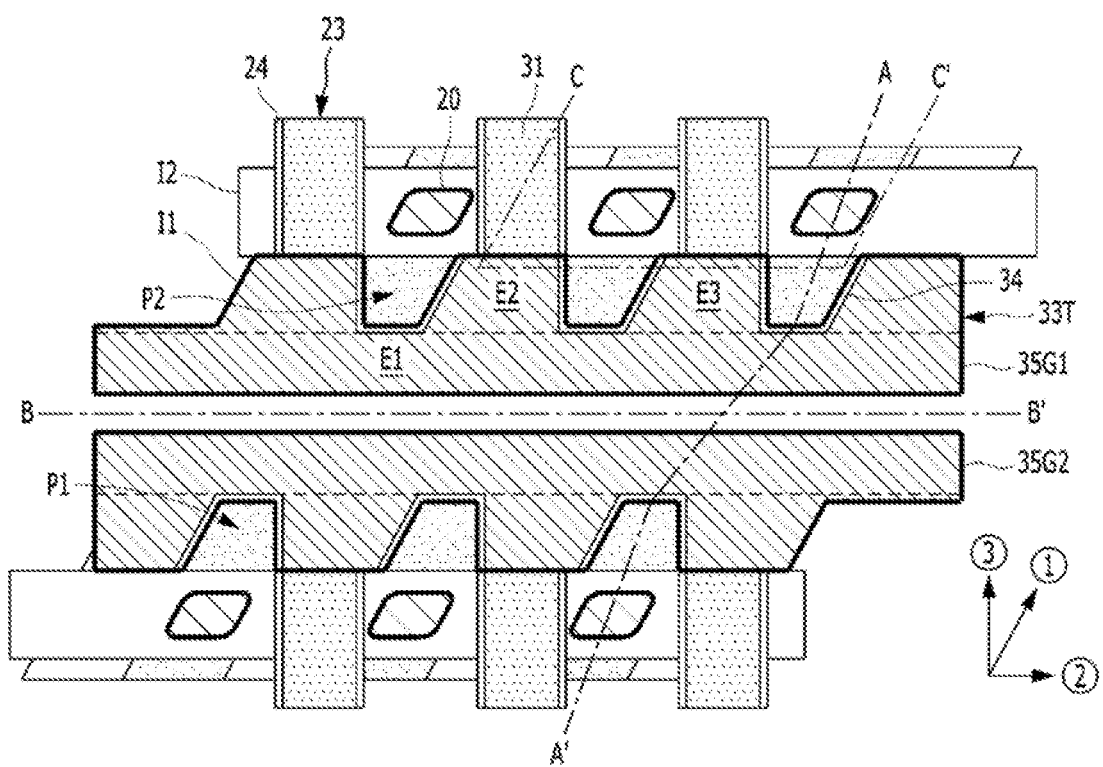
Figure 8D:
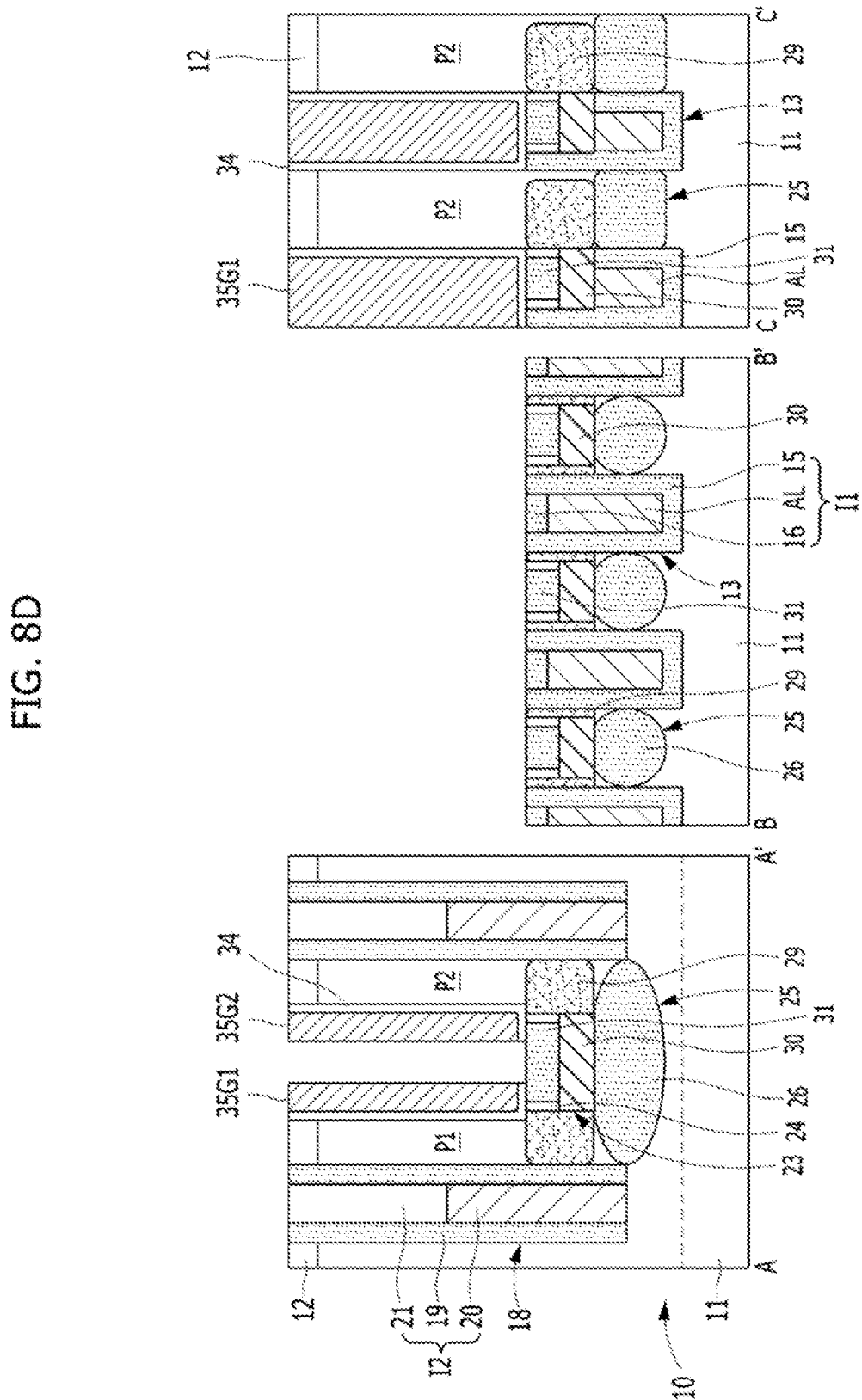

As shown in FIGS. 7D and 8D, a dry etch process may be performed such that preliminary lower gate electrodes 35G1 and 35G2 remain on the sidewalls of the gate trench 33T. For example, it may be performed by an etch-back process. The preliminary lower gate electrodes 35G1 and 35G2 may be formed by etching back the first gate conductive layer 35A. The preliminary lower gate electrodes 35G1 and 35G2 may have a spacer shape partially covering the sidewalls of the first and second pillars P1 and P2, respectively.

The preliminary lower gate electrodes 35G1 and 35G2 may respectively include a first electrode E1, a second electrode E2 and a third electrode E3. The first electrode E1 may extend in the second direction ②, and the second electrode E2 and the third electrode E3 may branch from the first electrode E1. The second electrode E2 and the third electrode E3 may extend in the first direction ①. The first electrode E1, the second electrode E2 and the third electrode E3 may have a shape covering at least three sidewalls of the first and second pillars P1 and P2, respectively. The first electrode E1 may be in a direction crossing with the buried bit line 30, and the second electrode E2 and the third electrode E3 may be positioned between neighboring first pillars P1 or between neighboring second pillars P2.

Figure 7E:
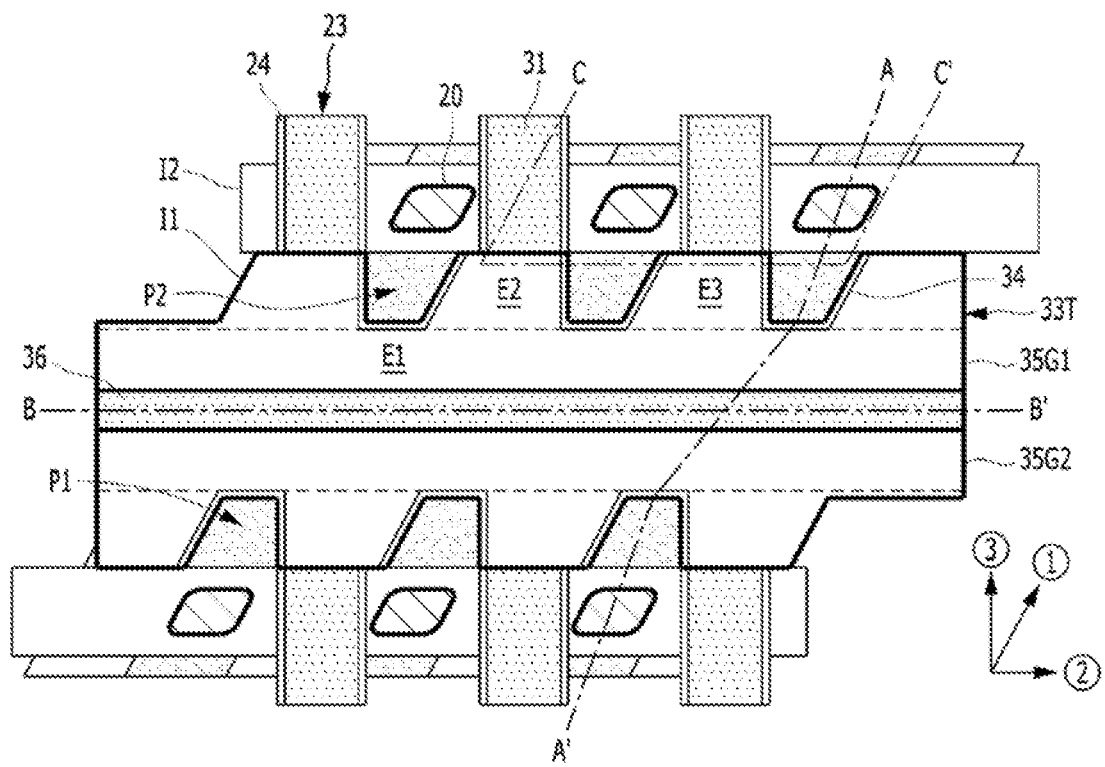
Figure 8E:
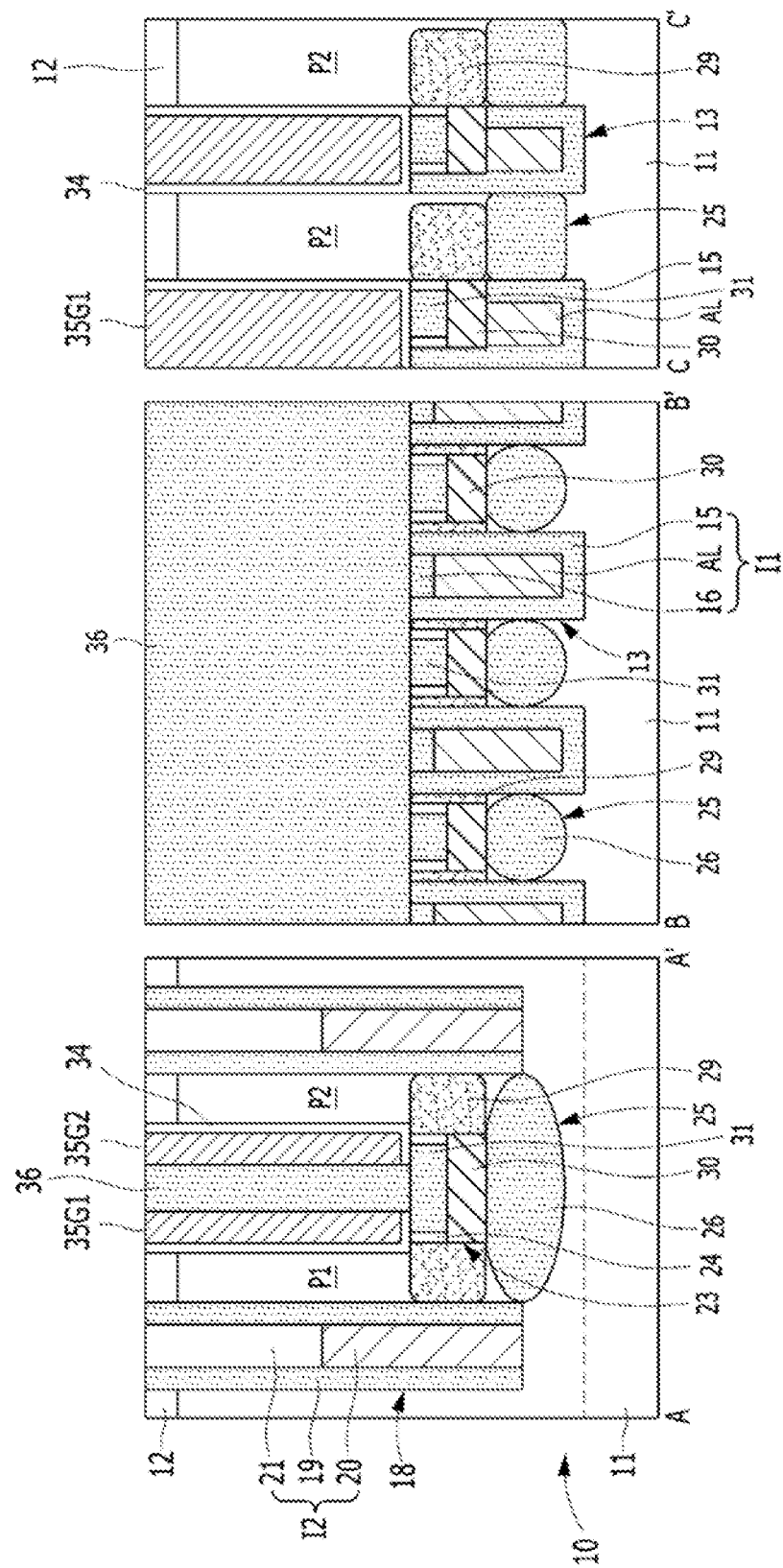

As shown in FIGS. 7E and 8E, a first gate capping layer 36 may be formed. The first gate capping layer 36 may fill the space between the preliminary lower gate electrodes 35G1 and 35G2. The first gate capping layer 36 may be planarized to expose the surfaces of the preliminary lower gate electrodes 35G1 and 35G2.

Figure 7F:
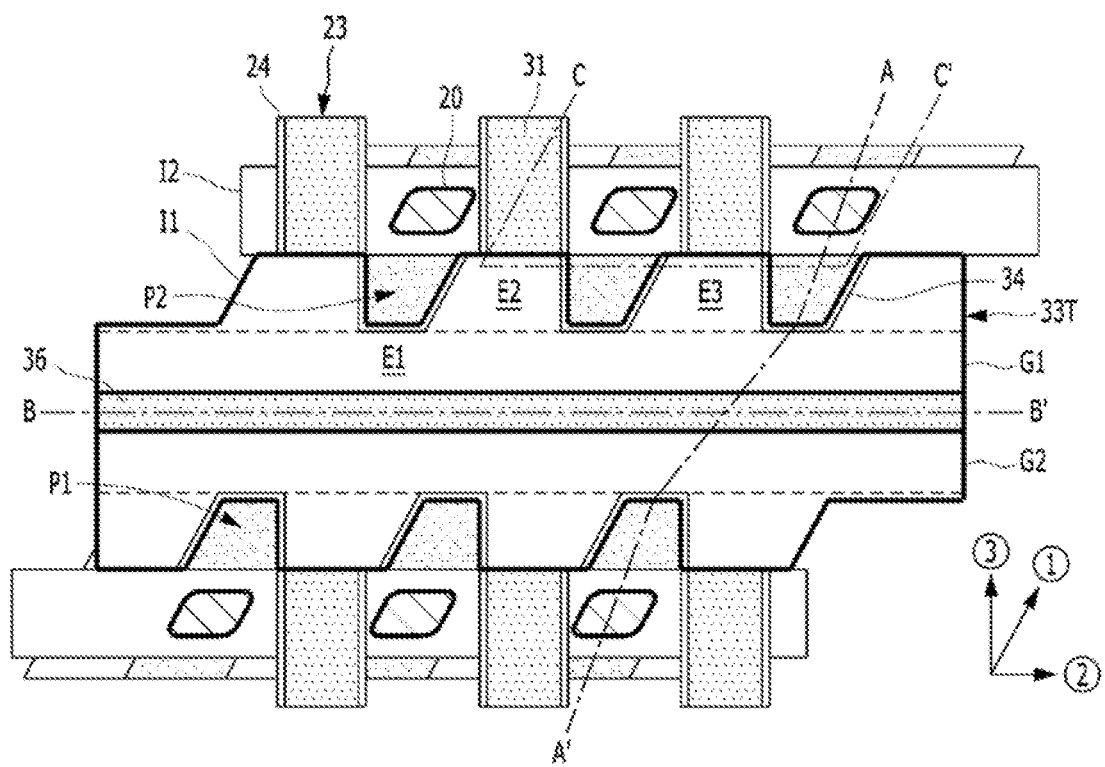

As shown in FIGS. 7F and 8F, the preliminary lower gate electrodes 35G1 and 35G2 may be recessed. See, reference number R. Thus, lower gate electrodes G1 and G2 may be formed.

The lower gate electrodes G1 and G2 may be formed in the gate trench 33T. The lower gate electrodes G1 and G2 may be recessed such that the top surfaces thereof are lower than the top surfaces of the pillars P1 and P2. The first gate capping layer 36 may be positioned between neighboring low gate electrodes G1 and G2.

Figure 7G:
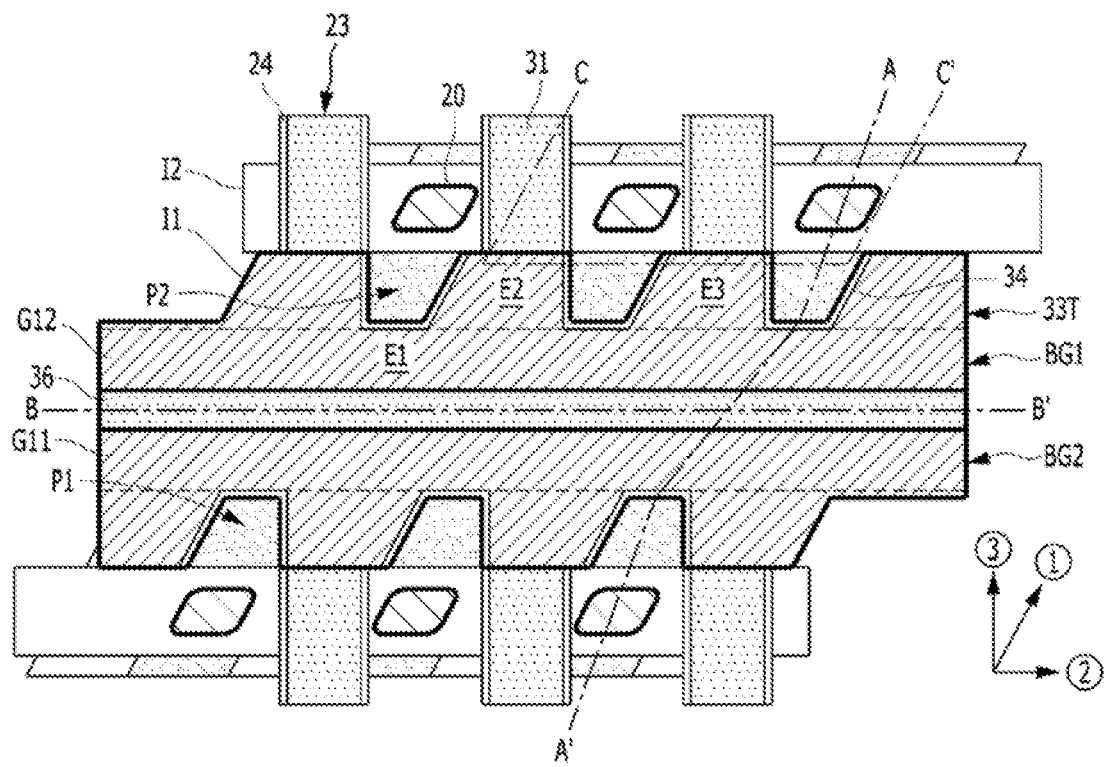
Figure 8G:
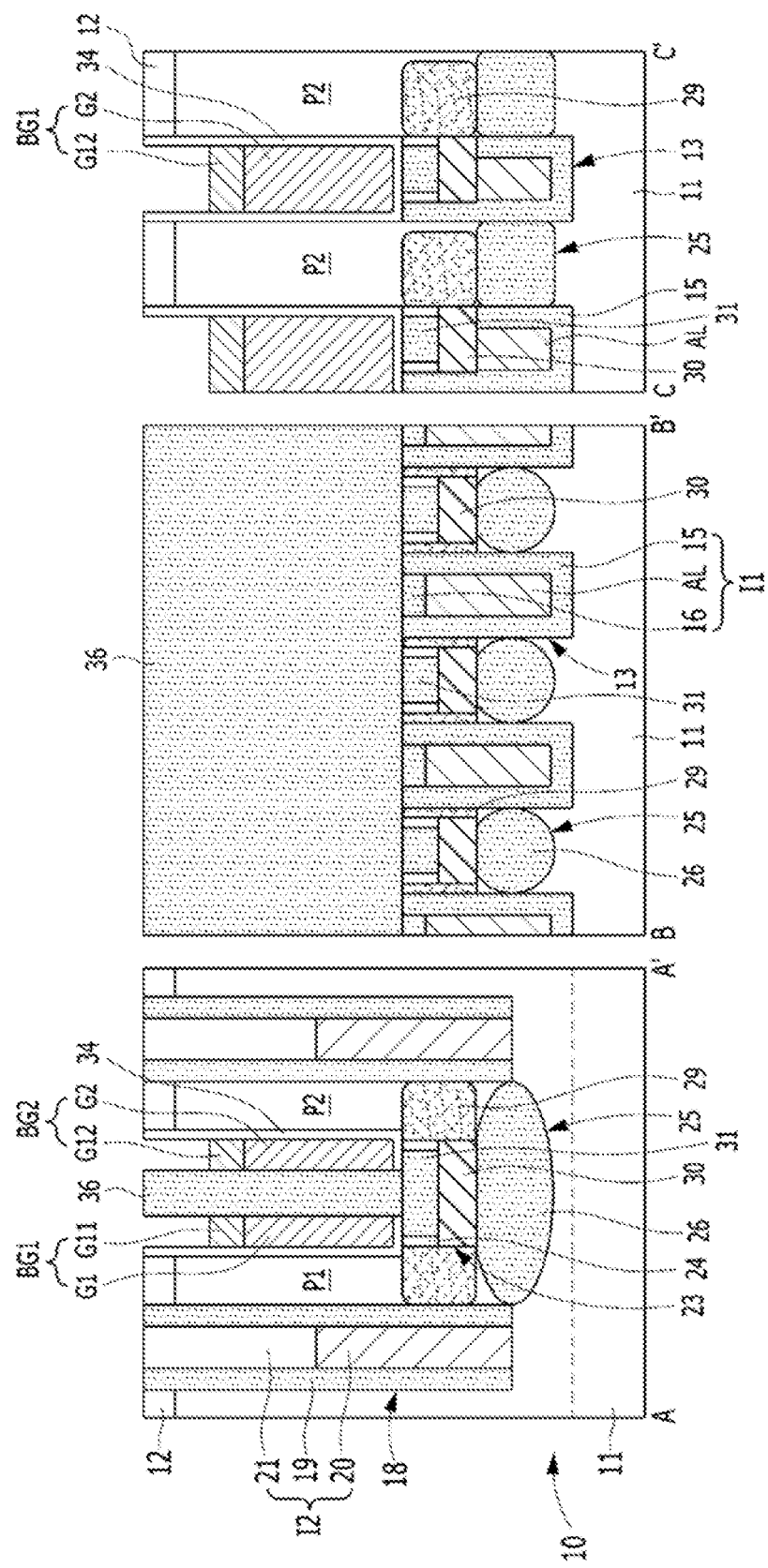

As shown in FIGS. 7G and 8G, upper gate electrodes G11 and G12 may be formed. The upper gate electrodes G11 and G12 may fill the upper portions of the lower gate electrodes G1 and G2, respectively. The upper gate electrodes G11 and G12 may have a recessed surface lower than the top surface of the first gate capping layer 36. A second gate conductive layer (not shown) may be filled and then an etch-back process may be performed. The upper gate electrodes G11 and G12 may include a low resistivity material. The upper gate electrodes G11 and G12 may be formed of a low work function material to improve gate-induced drain leakage. Moreover, an intermediate barrier may be further formed to prevent a reaction between the lower gate electrodes G1 and G2 and the upper gate electrodes G11 and G12.

According to above description, gate electrodes BG1 and BG2 may include the low gate electrodes G11 and G2 and the upper gate electrodes G11 and G12, respectively.

The gate electrodes BG1 and BG2 may be symmetrical to each other in structure. The gate electrodes BG1 and BG2 may include a first electrode E1 extending in the second direction ②, and a second electrode E2 and a third electrode E3 extending in the first direction ① crossing with the second direction ② and extending from the first electrode E1, respectively. The first electrode E1, the second electrode E2 and the third electrode E3 may be formed in the first trench T1, the second trench T2 and the third trench T3, respectively.

The first, second and third electrodes E1, E2 and E3 may overlap with at least three side surfaces of each of the first and second pillars P1 and P2. The fourth side surfaces S4 of the first and second pillars P1 and P2 may not overlap with the gate electrodes BG1 and BG2, respectively.

Figure 7H:
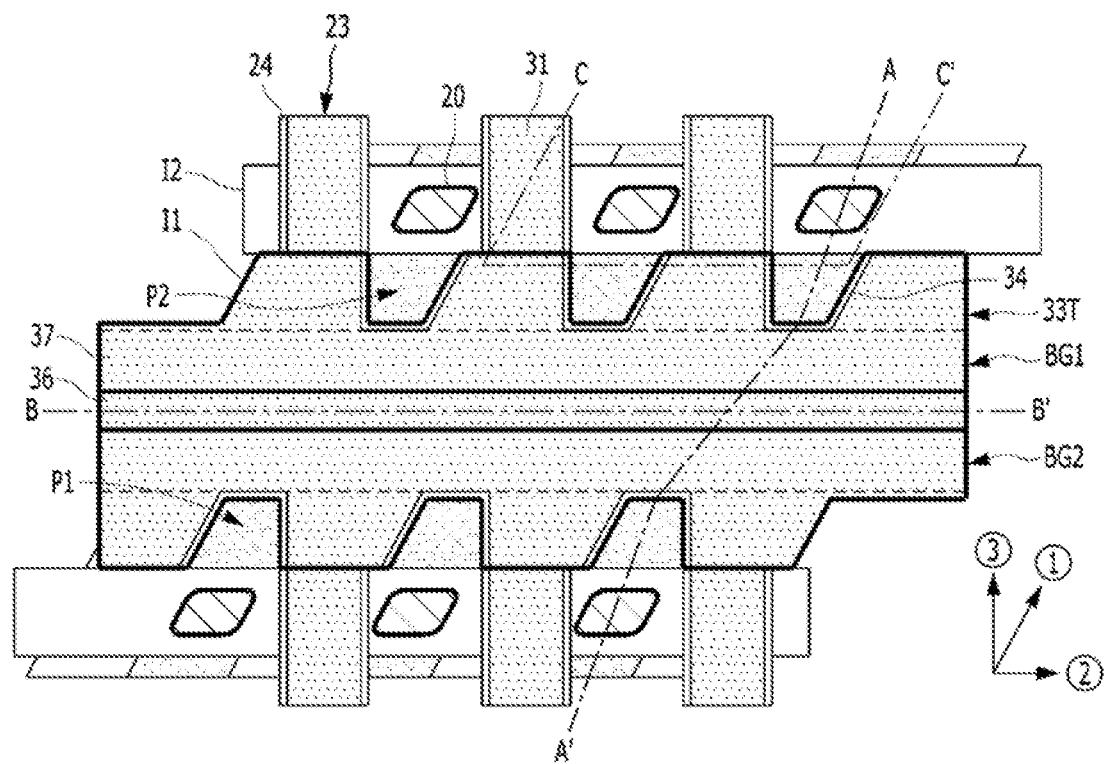
Figure 8H:
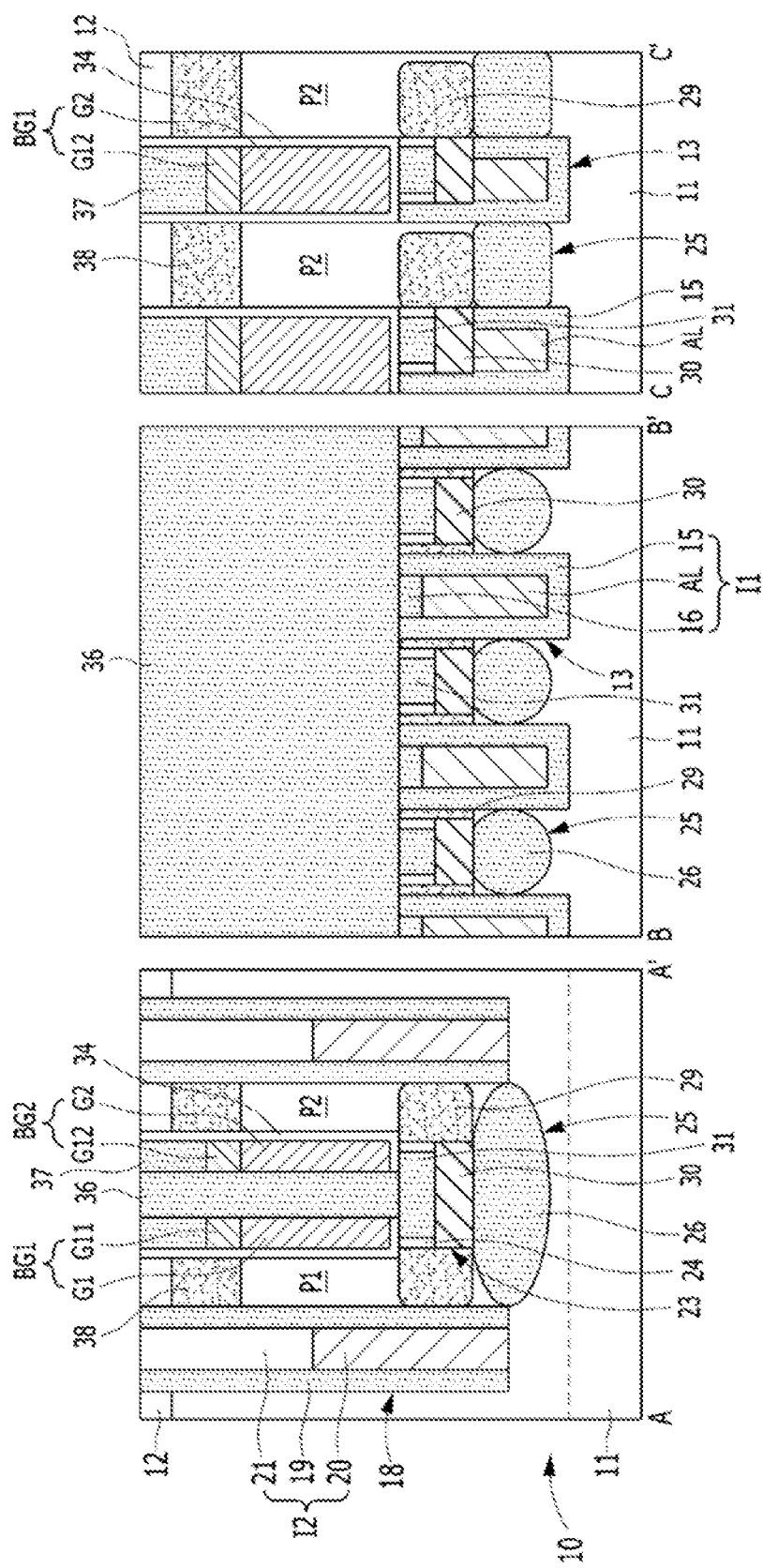

As shown in FIGS. 7H and 8H, a second gate capping layer 37 may be formed. The second gate capping layer 37 may include a dielectric material. The second gate capping layer 37 may fill the upper portion of the upper gate electrodes G11 and G12. The second gate capping layer 37 may include silicon oxide. Subsequently, the second gate capping layer 37 may be planarized such that the top surface of the first hard mask layer 12 is exposed.

After forming the second gate capping layer 37, an impurity doping process may be performed by implantation or other doping techniques. Thus, a second junction region 38 may be formed in the first and second pillars P1 and P2. When performing the impurity doping process, the first and second gate capping layers 36 and 37 may be used as a barrier. The second junction region 38 may become either a source region or a drain region. A vertical channel may be defined between the first junction region 29 and the second junction region 38.

As described above, the first gate electrode BG1, the first junction region 29 and the second junction region 38 may comprise a first transistor Tr1. The second gate electrode BG2, the first junction region 29 and the second junction region 38 may comprise a second transistor Tr2. Although it is not shown, a memory element may be electrically coupled to the second junction region 38.

In another embodiment, the second junction region 38 may be formed by an impurity doping process after forming a contact hole. Here, the contact hole may expose the top surfaces of the first and second pillars P1 and P2.

Figure 9:
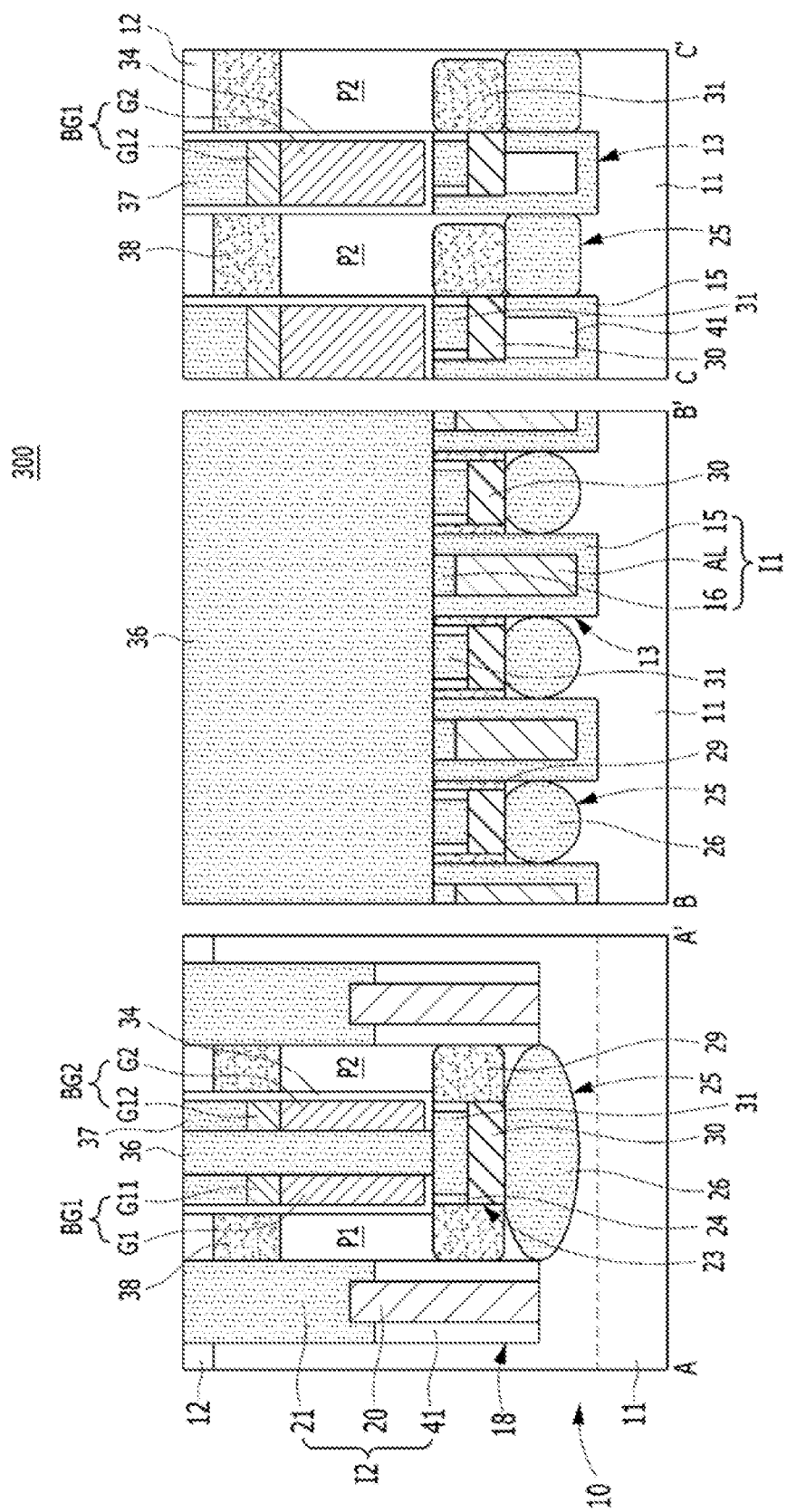
FIG. 9 is a view illustrating a semiconductor device in accordance with a second embodiment.

Hereinafter, a semiconductor device and a method for manufacturing the same in accordance with a second embodiment will be described. FIG. 9 is a view illustrating a semiconductor device in accordance with the second embodiment. A semiconductor device 300 in accordance with the second embodiment may be the same as the first embodiment except for a second device isolation region I2.

Referring to FIG. 9, an air gap 41 may be formed in a second device isolation region I2. The air gap 41 may be formed between a shield pillar 20 and a second isolation trench 18. Therefore, the second device isolation region I2 may include the shield pillar 20, the air gap 41 and a second isolation dielectric layer 21. The air gap 41 may be capped by the second isolation dielectric layer 21.

Parasitic capacitance between neighboring buried bit lines 30 may be reduced by the air gap 41. Moreover, the PG effect may be further suppressed.

Figure 10A:
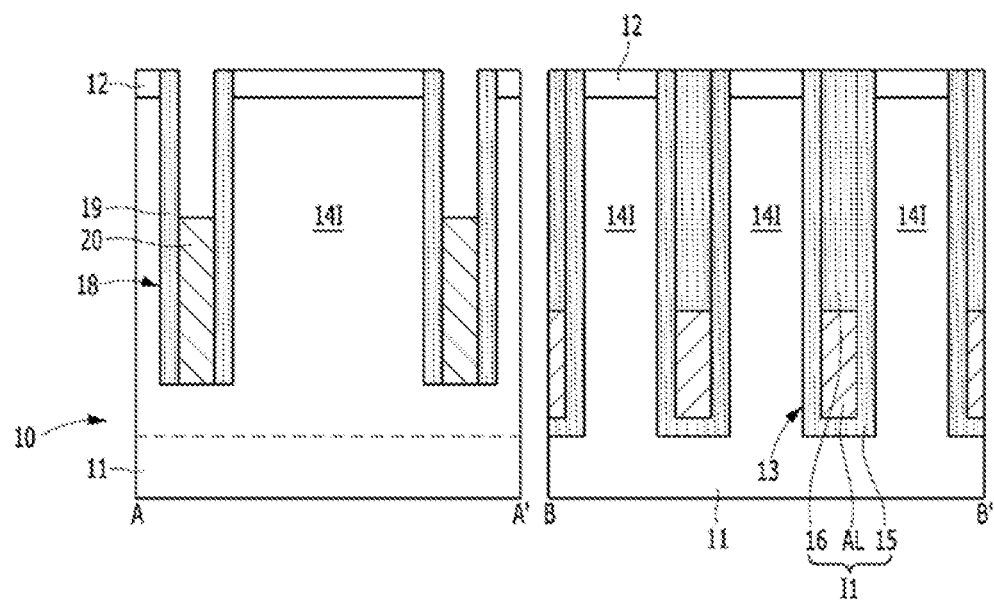
FIGS. 10A to 10C are views illustrating a method for manufacturing the semiconductor in accordance with the second embodiment.
Figure 10B:
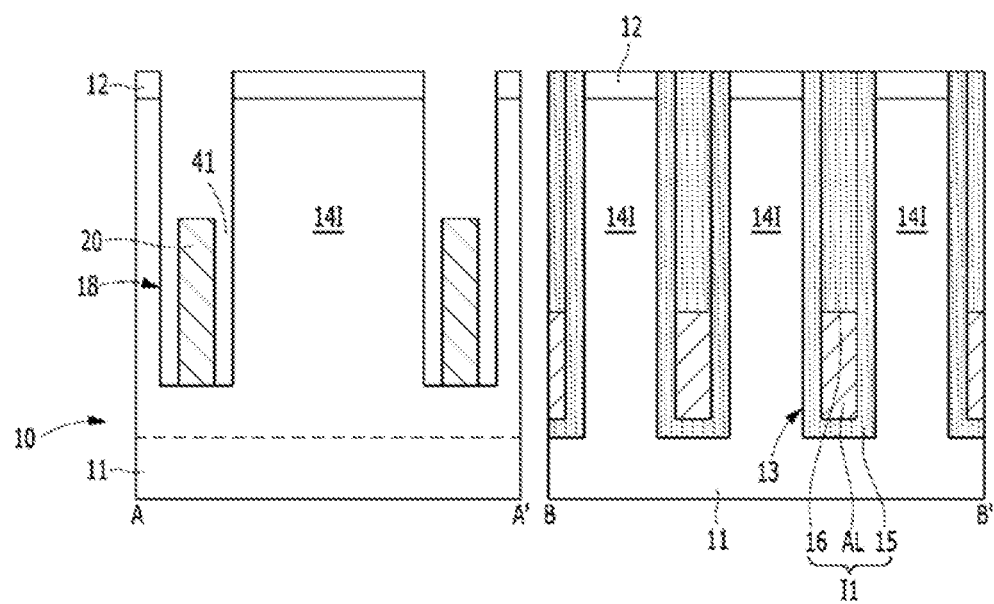
Figure 10C:
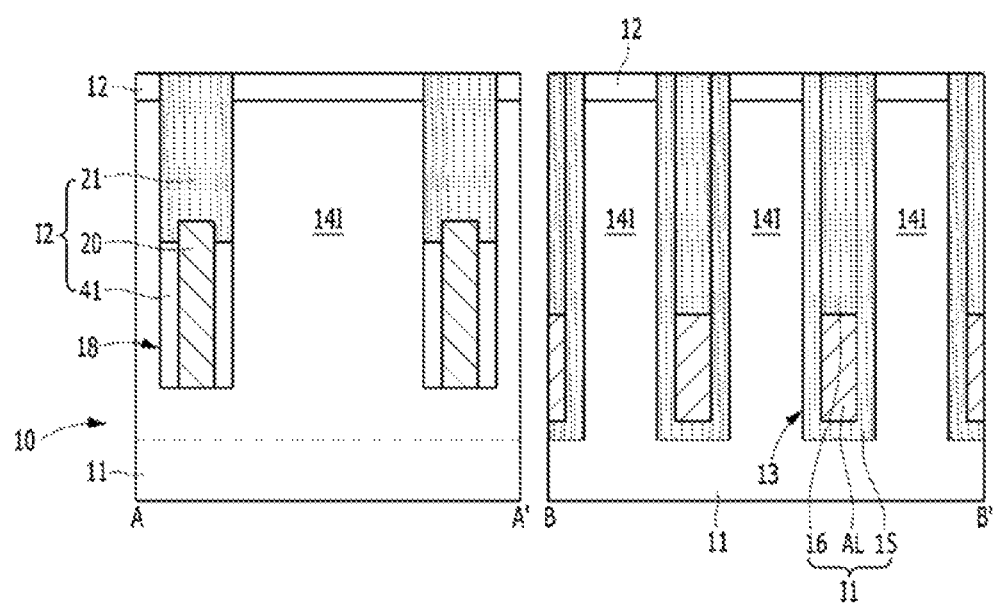

FIGS. 10A to 10C are cross-sectional views illustrating a method for manufacturing the semiconductor in accordance with the second embodiment. In the second embodiment, the method may be the same as or similar to the first embodiment except for a second device isolation region I2 having an air gap 41.

As shown in FIG. 10A, a spacer 19 may be formed on the sidewalls of a second isolation trench 18. To form the spacer 19, a dielectric material may be deposited followed by an etch-back process. The spacer 19 may be formed of a material having etch selectivity with respect to a substrate 10. The spacer 19 may include silicon oxide.

The bottom surface of the second isolation trench 18 may be exposed by the spacer 19.

A shield pillar 20 may be formed. The shield pillar 20 may be formed by selectively etching a shield layer (20A in FIG. 4F). For example, the shield layer 20A may be etched by an etch-back process. Thus, the shield pillar 20 may be formed in the second isolation trench 18. The shield pillar 20 may be independently positioned between the major axes of an active region 14I. That is, neighboring shield pillars 20 may be formed separately from each other. The shield pillar 20 may be recessed such that the top surface thereof is lower than that of the active region 14I. The spacer 19 may be positioned between the sidewalls of the shield pillar 20 and the sidewalls of the second isolation trench 18. The bottom of the shield pillar 20 may contact the substrate 10.

As shown in FIG. 10B, the spacer 19 may be selectively removed. The spacer 19 may be removed by wet etching. Thus, an air gap 41 may be formed.

As shown in FIG. 10C, a second isolation dielectric layer 21 may be formed. The second isolation dielectric layer 21 may be formed of silicon oxide. The second isolation dielectric layer 21 may fill the upper portion of the shield pillar 20. Subsequently, the second isolation dielectric layer 21 may be planarized. Thus, the second isolation dielectric layer 21 may remain to fill the recessed region on the shield pillar 20. The planarized surface of the second isolation dielectric layer 21 may be at the same level as the top surface of the first hard mask layer 12. The air gap 41 may be capped by the second isolation dielectric layer 21.

As described above, a second device isolation region I2 may be formed by forming the second isolation dielectric layer 21. The second device isolation region I2 may include the shield pillar 20, the air gap 41 and the second isolation dielectric layer 21. The second device isolation region I2 may be formed in the second isolation trench 18. The second device isolation region I2 may have the shield pillar 20 and the air gap 41.

Figure 11:
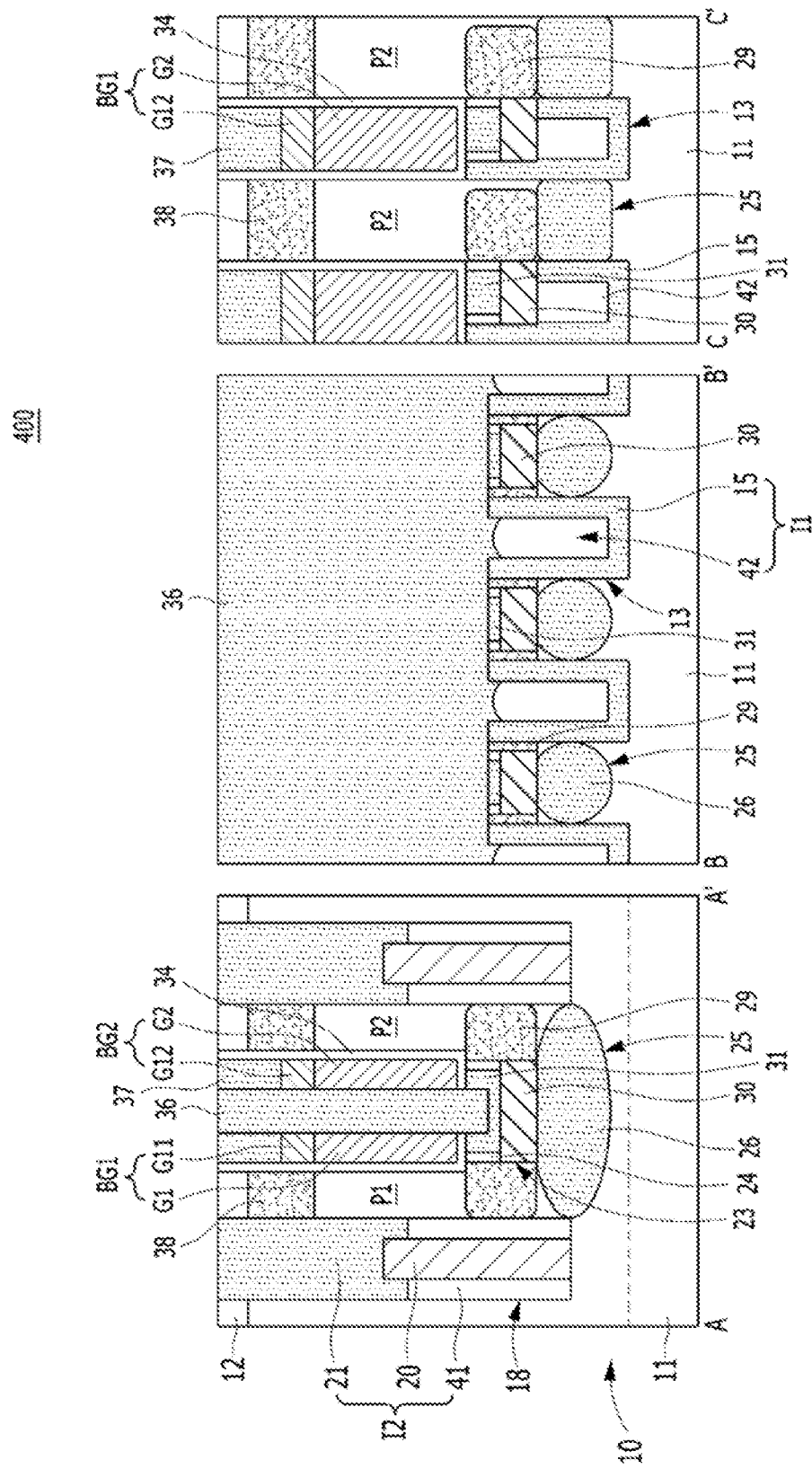
FIG. 11 is a view illustrating a semiconductor device in accordance with a third embodiment.

Hereinafter, a semiconductor device and a method for manufacturing the same in accordance with a third embodiment will be described. FIG. 11 is a view illustrating a semiconductor device in accordance with a third embodiment. A semiconductor device 400 in accordance with a third embodiment may be the same as the second embodiment except for a first device isolation region I1.

Referring to FIG. 11, a first air gap 42 may be formed in the first device isolation region I1. The first air gap 42 may be formed in the first isolation trench 13. Therefore, the first device isolation region I1 may include the first air gap 42 and a first liner 15. The first air gap 42 may be capped by the first gate capping layer 36.

A second air gap 41 may be formed in the second device isolation region I2. The second air gap 41 may be formed in the space between a shield pillar 20 and a second isolation trench 18. Therefore, the second device isolation region I2 may include the shield pillar 20, the second air gap 41 and a second isolation dielectric layer 21. The second air gap 41 may be capped by the second isolation dielectric layer 21.

Parasitic capacitance between neighboring buried bit lines 30 may be reduced by the first air gap 42 and the second air gap 41. Moreover, the PG effect may be increased.

FIGS. 12A to 12D are views illustrating a method for manufacturing the semiconductor in accordance with the third embodiment. In the third embodiment, the method may be the same as or similar to the first and second embodiments except for a first device isolation region I1 having a first air gap 42. For example, the first air gap 42 may be formed between a process for forming pillars P1 and P2 and a process for forming gate electrodes BG1 and BG2.

Figure 12A:
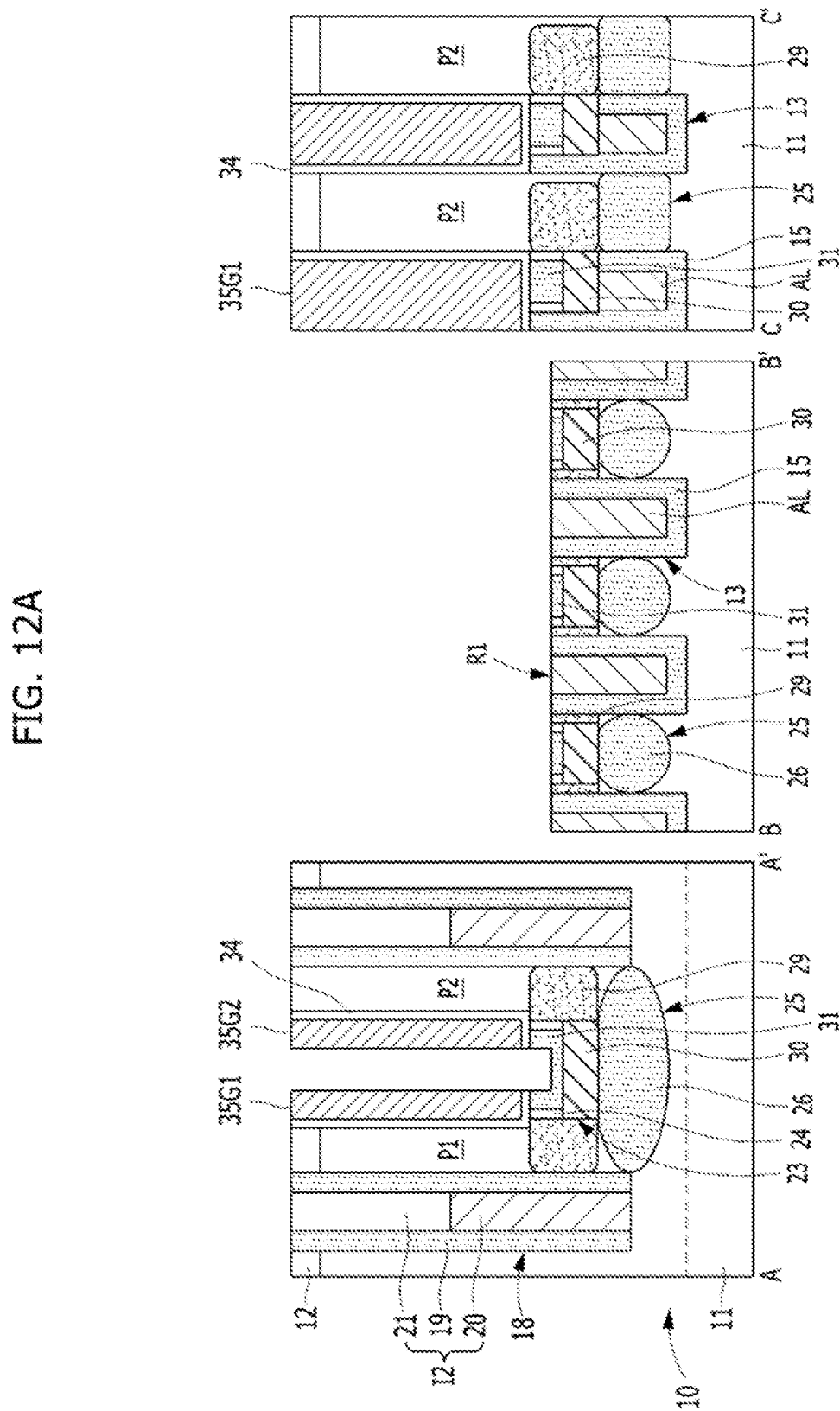
FIGS. 12A to 12D are views illustrating a method for manufacturing the semiconductor in accordance with the third embodiment.

As shown in FIG. 12A, after forming the pillars P1 and P2, a gate dielectric layer 34 may be formed. Then, a dry etch process may be performed such that preliminary lower gate electrodes 35G1 and 35G2 remain on the sidewalls of a gate trench 33T. For example, it may be performed by an etch-back process. The preliminary lower gate electrodes 35G1 and 35G2 may be formed by performing an etch-back process of a gate conductive layer 35A. The etch-back process of the first gate conductive layer 35A may be sufficiently performed to expose a dielectric pillar AL. See, reference number R1. Here, the dielectric pillar AL may be exposed without attacking a buried bit line 30. That is, the dielectric pillar AL may be exposed by removing a first isolation dielectric layer 16.

Figure 12B:
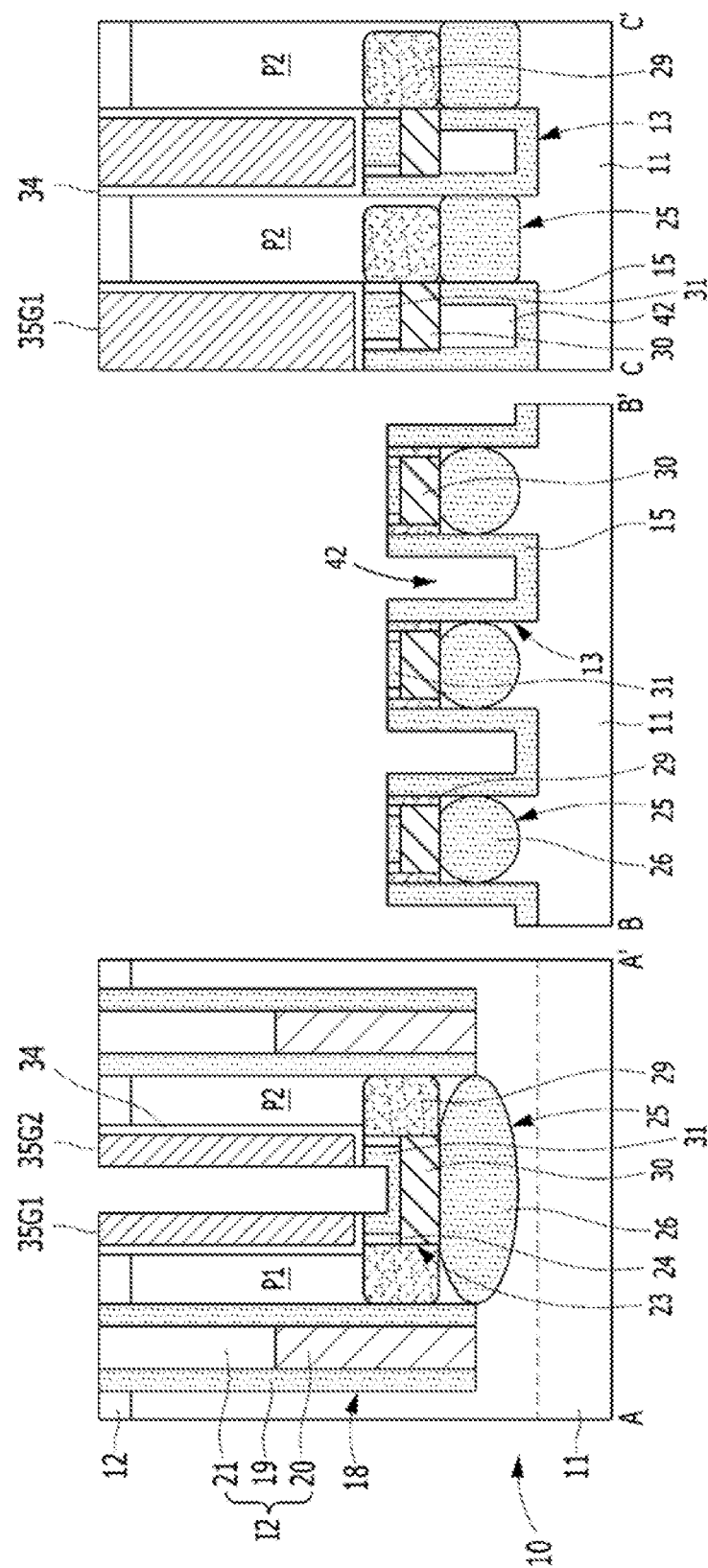

As shown in FIG. 12B, the dielectric pillar AL may be selectively removed. Thus, the first air gap 42 may be formed. When forming the first air gap 42, a first liner 15 may not be removed.

Figure 12C:
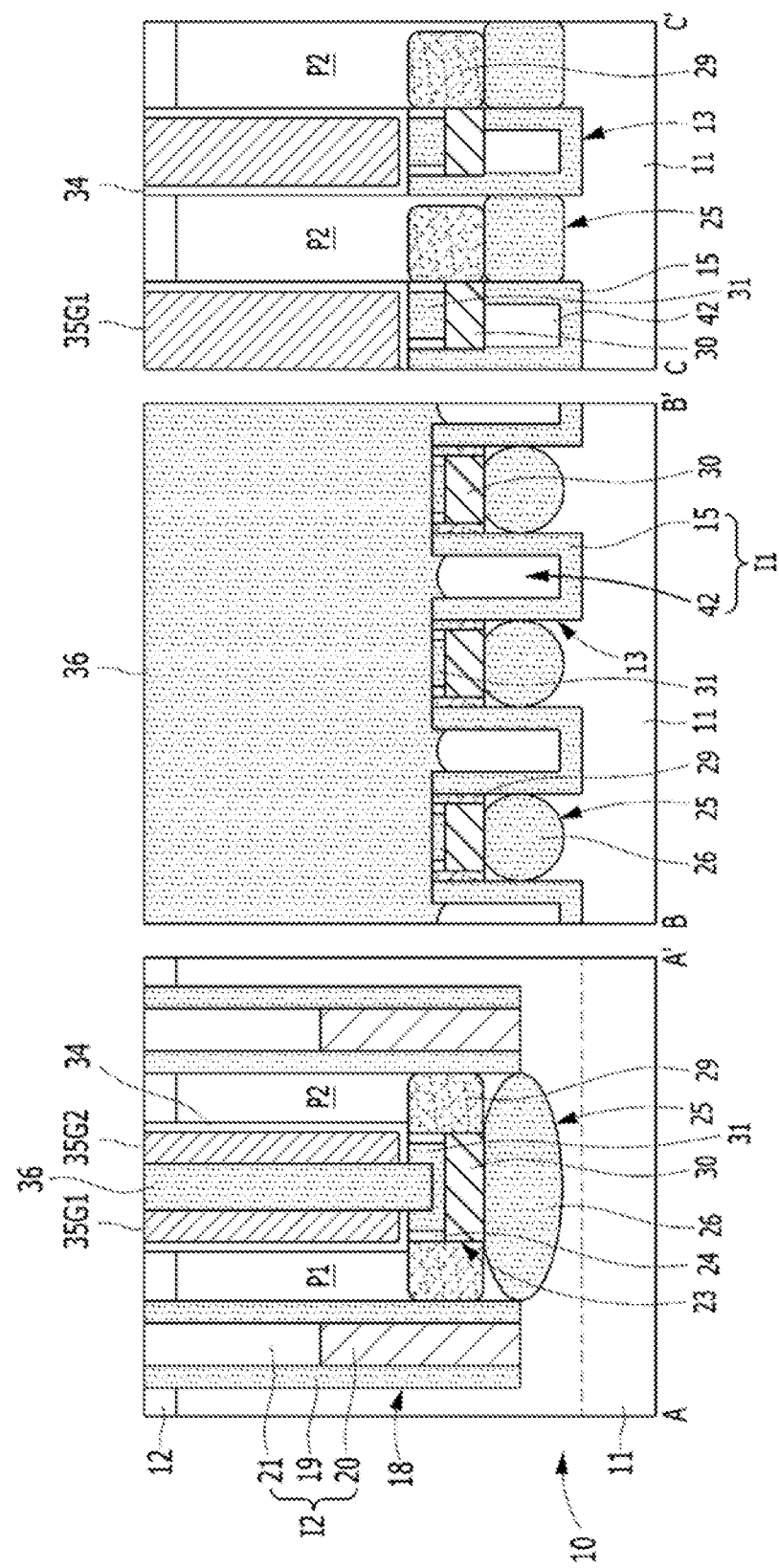

As shown in FIG. 12C, a first gate capping layer 36 may be formed. The first gate capping layer 36 may include a dielectric material. The first gate capping layer 36 may fill the space between the preliminary lower gate electrodes 35G1 and 35G2. The first gate capping layer 36 may include silicon nitride. Subsequently, the first gate capping layer 36 may be planarized such that the top surface of a first hard mask layer 12 is exposed.

During forming the first gate capping layer 36, the top of the first air gap 42 may be capped. That is, the top of the first air gap 42 may be closed by the first gate capping layer 36. In another embodiment, when initially forming the first gate capping layer 36, the first gate capping layer 36 may be thinly formed on the surface of the first liner 15. During continuously forming the first gate capping layer 36, the top of the first air gap 42 may be closed.

Figure 12D:
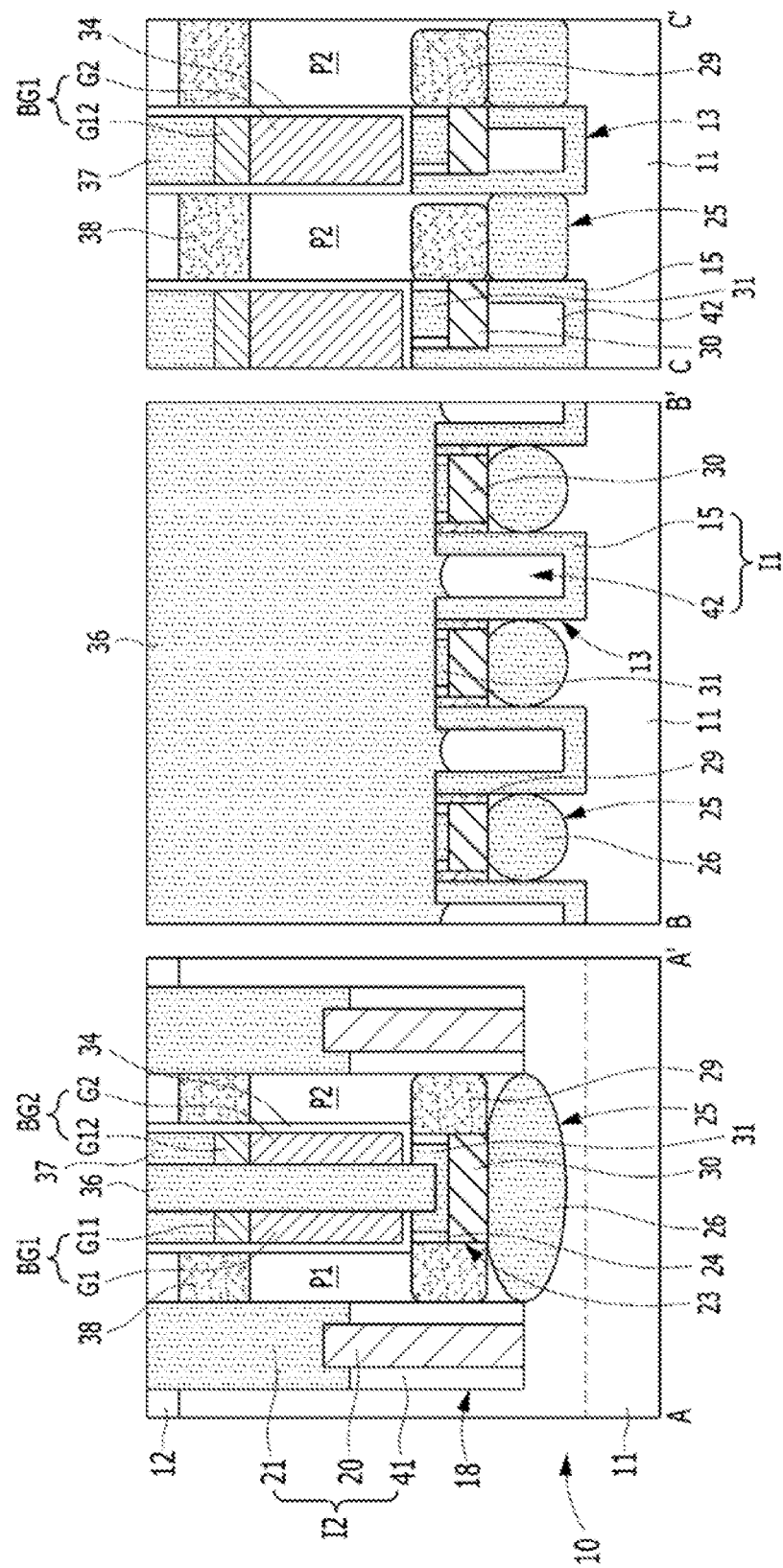

As described above, the first air gap 42 may be formed in the first device isolation region I1. As shown in FIG. 12D, subsequently gate electrodes G1 and G2, a second gate capping layer 37 and a second junction region 38 may be formed according to the method illustrated in FIGS. 8F to 8H.

According to the third embodiment, the first air gap 42 may be positioned between the minor axes of the island type active region 14I. Thus, parasitic capacitance between the minor axes of the island type active region 14I may be reduced.

In accordance with the third embodiment, the second air gap 41 may be positioned between the major axes of the island type active region 14I, and the first air gap 40 may be positioned between the minor axes of the island type active region 14I. Thus, parasitic capacitance between neighboring bit lines 30 may be reduced to improve the speed of the semiconductor device. Moreover, the PG effect may be further suppressed.

According to the embodiments, a shield pillar formed in a device isolation region may be formed to suppress the passing gate effect. Moreover, according to the embodiments, threshold voltage may be controlled by the shield pillar.

Further, according to the embodiments, parasitic capacitance may be reduced by forming the air gap.

Figure 13A:
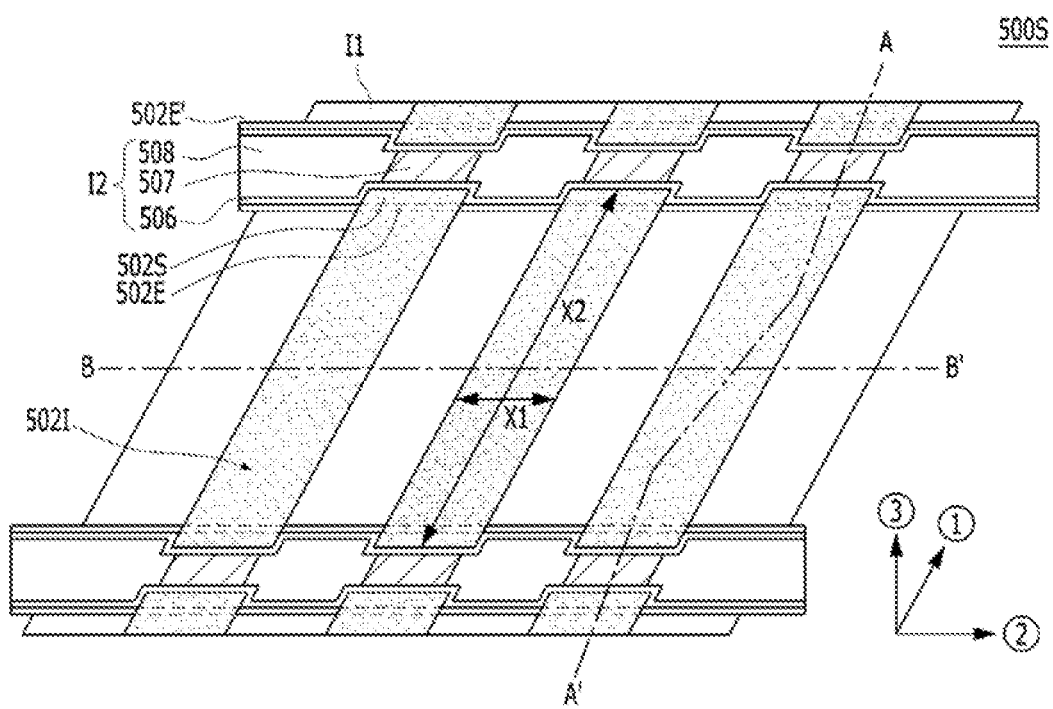
FIG. 13A is a plan view illustrating a device isolation region in accordance with a fourth embodiment.
Figure 13B:
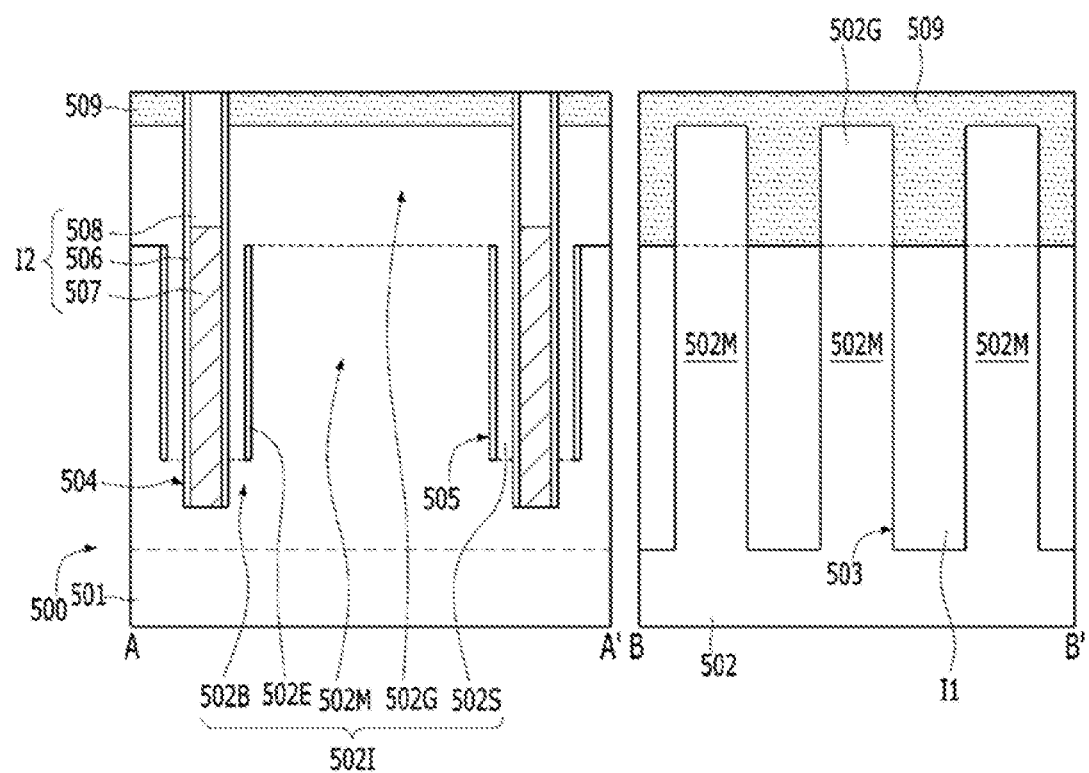
FIG. 13B is a cross-sectional view taken along the lines A-A' and B-B' of FIG. 13A.

FIG. 13A is a plan view illustrating a device isolation region in accordance with a fourth embodiment. FIG. 13B is a cross-sectional view taken along the lines A-A' and B-B' of FIG. 13A.

Referring to FIGS. 13A and 13B, a semiconductor device 500S may include a plurality of active regions 502I. A device isolation region I and the active regions 502I may be formed in a substrate 500. The device isolation region I may include a first device isolation region I1 and a second device isolation region I2. The active region 502I may be defined by the first device isolation region I1 and the second device isolation region I2. The first device isolation region I1 may extend in a first direction ①, and the second device isolation region I2 may extend in a second direction ② crossing the first direction ①. The first device isolation region I1 may be discontinuous by the second device isolation region I2. The first and second device isolation regions I1 and I2 may be STI regions which are formed by trench etching.

The substrate 500 may include a semiconductor substrate. The substrate 500 may be formed of a silicon-containing material. The substrate 500 may include silicon, monocrystalline silicon, polysilicon, amorphous silicon, silicon germanium, monocrystalline germanium, polycrystalline silicon germanium, carbon-doped silicon, combinations thereof or multi-layers thereof. The substrate 500 may include another semiconductor material such as germanium. The substrate 500 may include a III/V group semiconductor substrate, for example, a compound semiconductor substrate such as GaAs. The substrate 500 may include an SOI substrate. The substrate 500 may further include a bulk portion 501 which is located under the active region 502I.

The first device isolation region I1 may be formed in a first isolation trench 503. The second device isolation region I2 may be formed in a third isolation trench 504. The third isolation trench 504 may be connected to the substrate 500 through the second isolation trench 505. The first and second device isolation regions I1 and I2 may be formed of the same material or different materials. For example, the first and second device isolation regions I1 and I2 may include silicon oxide, silicon nitride or a combination thereof.

The second device isolation region I2 may include a shield pillar 507 embedded therein. The second device isolation region I2 may further include a liner 506 and an isolation dielectric layer 508. The liner 506 may be formed at both sidewalls of the third isolation trench 504, and the isolation dielectric layer 508 may be positioned over the shield pillar 507. The liner 506 may include silicon oxide. The isolation dielectric layer 508 may include silicon oxide, silicon nitride or a combination thereof. The shield pillar 507 may be formed of a silicon-containing material. The shield pillar 507 may include a polysilicon layer. The shield pillar 507 may be doped with an impurity. The shield pillar 507 may include a boron-doped polysilicon layer.

The active region 502I may be formed in an island shape. The plurality of active regions 502I may be arrayed in the second direction ②. The first device isolation region I1 is located between the active regions 502I. The plurality of active regions 502I may be arrayed with the same spacing and size as each other. The active region 502I may have a major axis X2 and a minor axis X1.

The second device isolation region I2 may be positioned between the major axes X2 of the neighboring active regions 502I. The first device isolation region I1 may be positioned between the minor axes X1 of the neighboring active regions 502I. In the present specification, one active region 502I will be described.

The active region 502I may include a body portion 502B, a main portion 502M over the body portion 502B, a growth portion 502G over the main portion 502M, and side portions 502S at both sidewalls of the growth portion 502G. The growth portion 502G and the side portions 502S may cover the top and sidewalls of the main portion 502M. The active region 502I may further include an embedded spacer 502E. The embedded spacer 502E may be covered by the growth 502G and the side portions 502S. The embedded spacer 502E may be surrounded by the growth portion 502G, the main portion 502M, and the side portions 502S. The embedded spacer 502E may have an embedded structure that is disposed in the active region 502I. Thus, the embedded spacer 502E and the third isolation trench 504 may be spaced apart from each other.

The body portion 502B, the main portion 502M, the growth portion 502G, and the side portions 502S may be formed of the same material. That is, the body portion 502B, the main portion 502M, the growth portion 502G, and the side portions 502S may be formed of silicon. The growth portion 502G and the side portions 502S may be silicon epitaxial layers. The embedded spacer 502E may be formed of a dielectric material. The embedded spacer 502E may be formed of silicon oxide.

A part of the embedded spacer 502E may extend into the second device isolation region I2 along the second direction ①. See, reference numeral 502E' of FIG. 13A. The side portions 502S may be electrically coupled to the body portion 502B. The body portion 502B may be connected to the bulk portion 501 of the substrate 500. Thus, the body portion 502B and the side portions 502S may be electrically coupled to each other. As a result, the active region 502I may have a body-tied structure. A hard mask layer 509 may be formed over the active region 502I.

Referring to FIGS. 13A and 13B, the second device isolation region I2 having the shield pillar 507 embedded therein may be positioned between two neighboring active regions 502I which are arranged side by side along the first direction ①. The shield pillar 507 may have a body-tied structure. The active region 502I may include the embedded spacer 502E and the side portions 502S, and the side portion 502S may have a body-tied structure. The side portion 502S may serve as a body connection portion to the bulk portion 501 of the substrate 500.

The active region 502 may include various semiconductor devices formed therein.

Figure 14A:
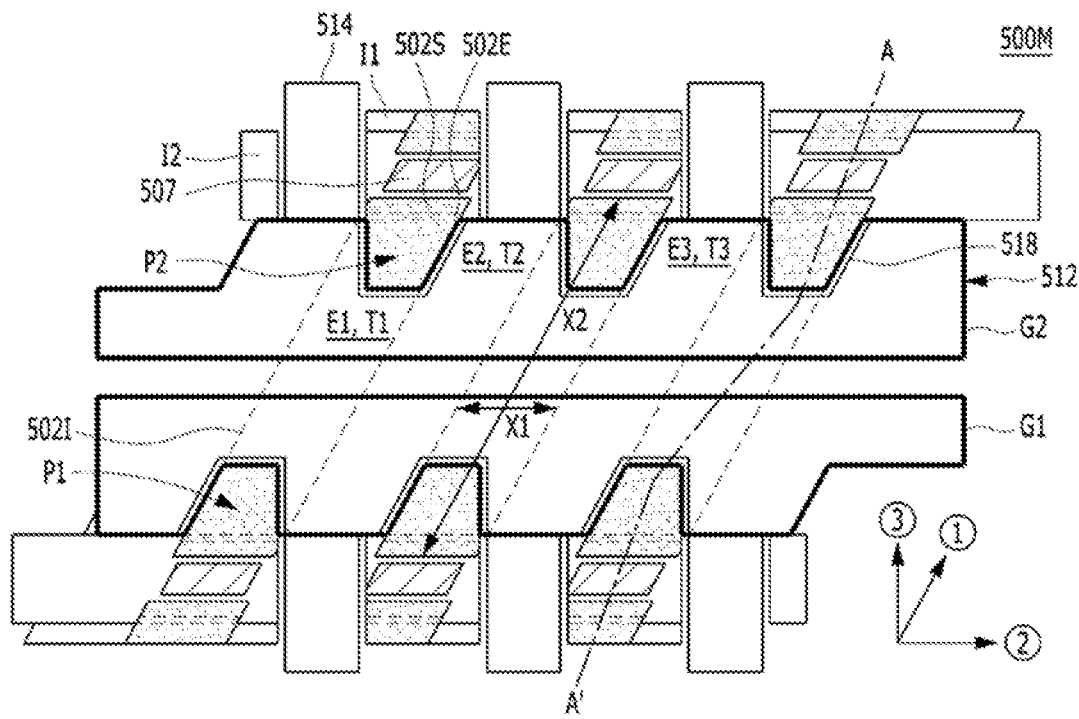
FIG. 14A is a plan view illustrating a semiconductor device to which the fourth embodiment is applied.
Figure 14B:
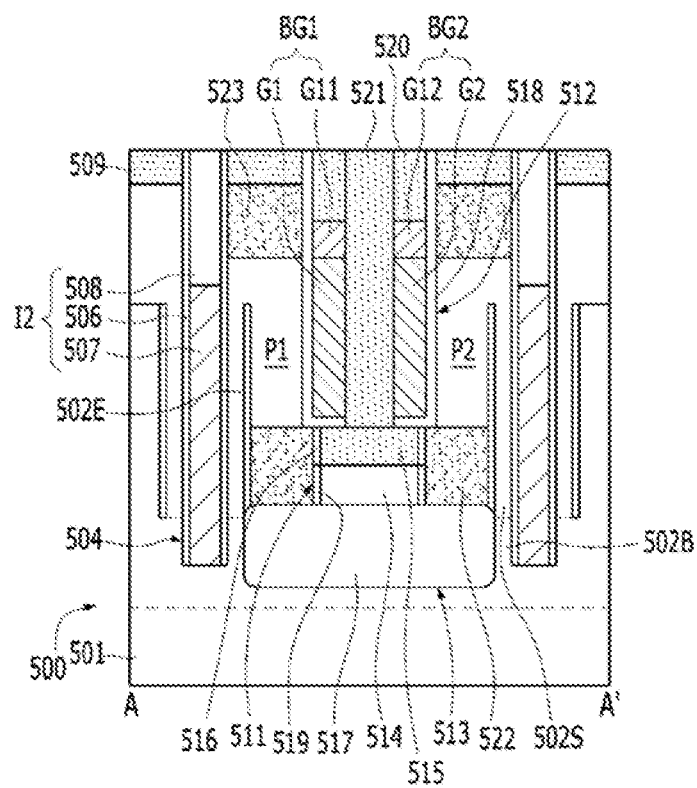
FIG. 14B is a cross-sectional view taken along the line A-A' of FIG. 14A.

FIG. 14A is a plan view illustrating a semiconductor device to which the fourth embodiment is applied. FIG. 14B is a cross-sectional view taken along the line A-A' of FIG. 14A. The semiconductor device 500M may include memory cells. For the active region 502I and the first and second device isolation regions I1 and I2, refer to FIGS. 13A and 13B.

The semiconductor device 500M may include the active region 502I, the first device isolation region I1 and the second device isolation region I2. Referring back to FIG. 13B, the active region 502I may include the body portion 502B, the main portion 502M, the growth portion 502G, the side portions 502S and the embedded spacer 502E. The active region 502I may have an island shape.

The active region 502I may include a first pillar P1 and a second pillar P2. The first and second pillars P1 and P2 may form a pair while being symmetrical with each other. Side surfaces of the first and second pillars P1 and P2 may be in contact with the second device isolation region I2. Parts of the first and second pillars P1 and P2 may be connected to the bulk portion 501 of the substrate 500 through the side portions 502S. That is, the first and second pillars P1 and P2 may have a body-tied structure through the side portions 502S.

The active region 502I may include a plurality of trenches. The plurality of trenches may include a bit line trench 511, a gate trench 512 over the bit line trench 511, and a body trench 513 under the bit line trench 511. The bit line trench 511 may extend in a third direction ③. The third direction ③ may cross the first direction ① and the second direction ②. The gate trench 512 may extend in the second direction ②. The second direction ② may cross the first direction ① and the third direction ③. The body trench 513 may extend in the first direction ①, and have the same extension length as the active region 502I. The first and second pillars P1 and P2 may be isolated from each other by the gate trench 512.

A buried bit line 514 may be embedded in the bit line trench 511. A bit line capping layer 515 may be formed over the buried bit line 514. The buried bit line 514 may include a low resistance metal. The buried bit line 514 may include tungsten. Between the bit line capping layer 515 and the bit line trench 511, a bit line capping liner 516 may be positioned. The bit line capping layer 515 and the bit line capping liner 516 may include a dielectric material. The bit line capping layer 515 and the bit line capping liner 516 may include silicon oxide, silicon nitride or a combination thereof. The bit line capping layer 515 may cover the top surface of the buried bit line 514. Thus, the buried bit line 514 may be referred to as an embedded buried bit line in the substrate 500.

Under the buried bit line 514, a punch-through preventing layer 517 may be formed. The punch-through preventing layer 517 may be formed of a dielectric material. The punch-through preventing layer 517 may prevent a punch between the neighboring buried line lines 514. The buried bit line 514 may float from the bulk portion 501 of the substrate 500 by the punch-through preventing layer 517. The first and second pillars P1 and P2 may float from the bulk portion 501 of the substrate 500 by the punch-through preventing layer 517. The first and second pillars P1 and P2 may have a body-tied structure with the bulk portion 501 through the side portions 502S.

The gate trench 512 may correspond to the space between the first and second pillars P1 and P2. The gate trench 512 has a pair of gate electrodes BG1 and BG2 embedded therein. Between the pair of gate structures, the first gate electrode BG1 may overlap a side surface of the first pillar P1, and the second gate electrode BG2 may overlap a side surface of the second pillar P2. The first and second gate electrodes BG1 and BG2 may be symmetrical with each other.

A gate dielectric layer 518 may be formed on the sidewalls of the first and second pillars P1 and P2. The first and second gate electrodes BG1 and BG2 may be covered by first and second gate capping layers 520 and 521. The top surfaces of the first and second gate electrodes BG1 and BG2 may be positioned at a lower level than the top surface of the first and second pillars P1 and P2. The top surfaces of the first and second gate capping layers 520 and 521 may be positioned at the same level as the top surfaces of the first and second pillars P1 and P2.

Since the first and second gate electrodes BG1 and BG2 are positioned in the gate trench 512 and the top and side surfaces thereof are covered by the first and second gate capping layers 520 and 521, each of the first and second gate electrodes BG1 and BG2 may have a buried structure. The first and second gate electrodes BG1 and BG2 may be referred to as buried gate electrodes. The semiconductor device 500M may be applied to a memory cell. Thus, the first and second gate electrodes BG1 and BG2 may serve as buried word lines.

The gate dielectric layer 518 may be formed on the sidewalls of the gate trench 512. That is, the gate dielectric layer 518 may cover the gate trench 512. Furthermore, the gate dielectric layer 518 may cover the lower and upper side surfaces of the first and second pillars P1 and P2. The gate dielectric layer 518 may include silicon oxide, silicon nitride, silicon oxynitride, a high-k material or combinations thereof.

The high-k material may include a material having a larger dielectric constant than silicon oxide. For example, the high-k material may include a material having a larger dielectric constant than 3.9. For another example, the high-k material may include a material having a larger dielectric constant than 10. For another example, the high-k material may include a material having a dielectric constant between 10 and 30. The high-k material may include at least one metallic element. The high-k material may include a hafnium-containing material. The hafnium-containing material may include hafnium oxide, hafnium silicon oxide, hafnium silicon oxynitride or combinations thereof. In another embodiment, the high-k material may include lanthanum oxide, lanthanum aluminum oxide, zirconium oxide, zirconium silicon oxide, zirconium silicon oxynitride, aluminum oxide and combinations thereof. As the high-k material, other publicly known high-k materials may be selectively used.

The bottom surfaces of the first and second gate electrodes BG1 and BG2 may be in contact with the bit line capping layer 515. That is, between the first and second gate electrodes BG1 and BG2 and the bit line 514, the bit line capping layer 515 may be positioned. The first and second gate electrodes BG1 and BG2 may overlap the side surfaces of the first and second pillars P1 and P2, respectively.

A second junction region 523 and a first junction region 522 may be formed in the first and second pillars P1 and P2.

The first junction region 522 may be positioned at the bottom portions of the first and second pillars P1 and P2, and the second junction region 523 may be positioned at the top portions of the first and second pillars P1 and P2. The first junction region 522 may be connected to the buried bit line 514. Between the first junction region 522 and the buried bit line 514, an ohmic contact layer 519 may be further formed. The ohmic contact layer 519 may include metal silicide. The first junction region 522 may be positioned at a lower level than the second junction region 523. Between the first and second junction regions 522 and 523, a vertical channel may be formed.

The first and second junction regions 522 and 523 may be doped with a conductive impurity. For example, the conductive impurity may include phosphorous (P), arsenic (As), antimony (Sb) or boron (B). The first and second junction regions 522 and 523 may be doped with impurities having the same conductive type. The first junction region 522 and the second junction region 523 may be referred to as a source region and a drain region, respectively.

The first and second gate electrodes BG1 and BG2 may be formed by vertically stacking bottom gate electrodes G1 and G2 and top gate electrodes G11 and G12. The first gate electrode BG1 may include a first bottom gate electrode G1 and a first top gate electrode G11. The second gate electrode BG2 may include a second bottom gate electrode G2 and a second top gate electrode G12.

The bottom gate electrodes G1 and G2 may include a high work function material. The top gate electrodes G11 and G12 may include a low work function material. The bottom gate electrodes G1 and G2 having a high work function may control a threshold voltage. The top gate electrodes G11 and G12 having a low work function may suppress gate-induced drain leakage.

Each of the first and second gate electrodes BG1 and BG2 may include a first electrode portion E1, a second electrode portion E2 and a third electrode portion E3. The first electrode portion E1 may extend in the second direction ②, and the second and third electrode portions E2 and E3 may diverge from the first electrode portion E1. The second and third electrode portions E2 and E3 may extend in the first direction ①. The first to third electrode portions E1 to E3 may surround at least three side surfaces of the first and second pillars P1 and P2. The first electrode portion E1 may extend in the direction crossing the buried bit line 514, and the second and third electrode portions E2 and E3 may be positioned between the neighboring first pillars P1 or the neighboring second pillars P2 in the second direction.

The gate trench 512 may have a line shape extended in any one direction. The gate trench 512 may include a first trench T1, a second trench T2 and a third trench T3. The first trench T1 may be formed between the first and second pillars P1 and P2. The second and third trenches T2 and T3 may diverge from the first trench T1 so as to be positioned on the side surfaces of the first pillar P1. The second and third trenches T2 and T3 may diverge from the first trench T1 so as to be positioned on the side surfaces of the second pillar P2. The first to third trenches T1 to T3 may surround at least three side surfaces of the first and second pillars P1 and P2.

The first trench T1 may extend in the second direction ②, and the second and third trenches T2 and T3 may extend in the first direction ①. The first electrode portion E1 may be embedded in the first trench T1, and the second and third electrode portions E2 and E3 may be embedded in the second and third trenches T2 and T3, respectively.

Hereafter, the second device isolation region I2 will be described in detail. The second device isolation region I2 may include the liner 506, the shield pillar 507 and the isolation dielectric layer 508. The second device isolation region I2 may be formed in the third isolation trench 504. The second device isolation region I2 may include the shield pillar 507 embedded therein. The shield pillar 507 may be formed of a silicon-containing material. The shield pillar 507 may include a polysilicon layer. The shield pillar 507 may be doped with an impurity. The shield pillar 507 may include a boron-doped polysilicon layer. The shield pillar 507 may be independently positioned between the active regions 502I which are arranged side by side along the second direction.

The top surface of the shield pillar 507 may be recessed to a lower level than the top surface of the active region 502I. Between the sidewall of the shield pillar 507 and the sidewall of the third isolation trench 504, the liner 506 may be positioned. The bottom of the shield pillar 507 may be in contact with the substrate 500.

In accordance with the fourth embodiment, the shield pillar 507 may be positioned between the active regions 502I, thereby suppressing the PG effect. That is, the PG effect may be suppressed by field shielding of the passing gate. Furthermore, the shield pillar 507 may serve as a back gate, thereby increasing the threshold voltage.

Furthermore, the first and second pillars P1 and P2 may have a body-tied structure and suppress the floating body effect (FBE). The embedded spacer 502S may be formed to suppress parasitic capacitance.

Hereafter, a method for fabricating a semiconductor device in accordance with the fourth embodiment will be described. FIGS. 15A to 15J illustrate a method for fabricating the parallel active region of the semiconductor device in accordance with the fourth embodiment. FIGS. 16A to 16J are cross-sectional views taken along the lines A-A' and B-B' of FIGS. 15A to 15J.

Figure 15A:
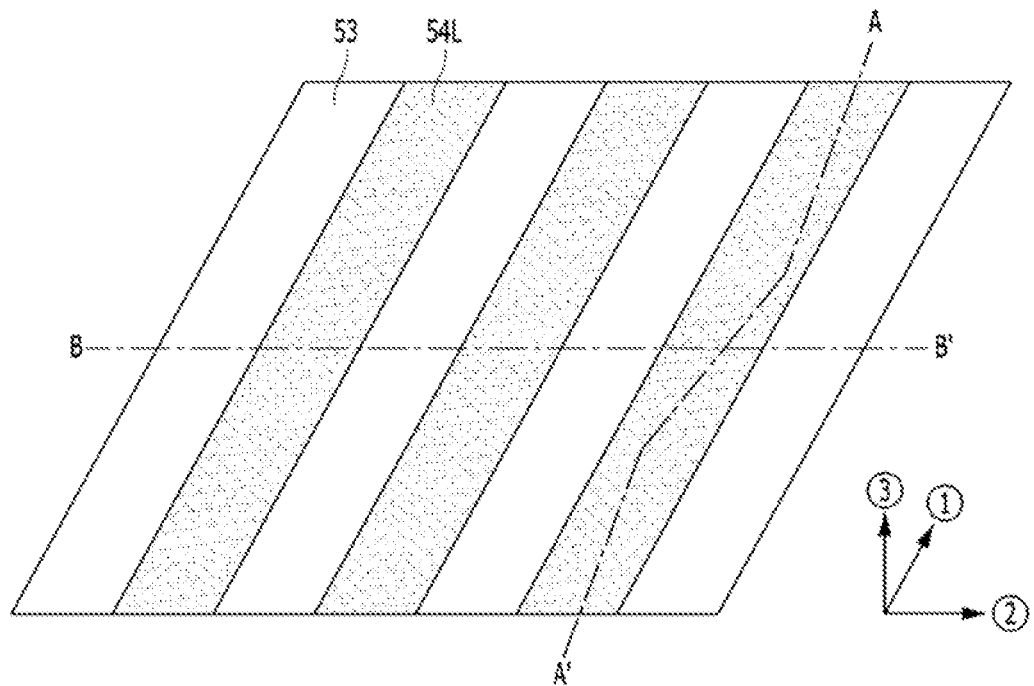
FIGS. 15A to 15J illustrate a method for fabricating a parallel active region of the semiconductor device in accordance with the fourth embodiment.
Figure 16A:
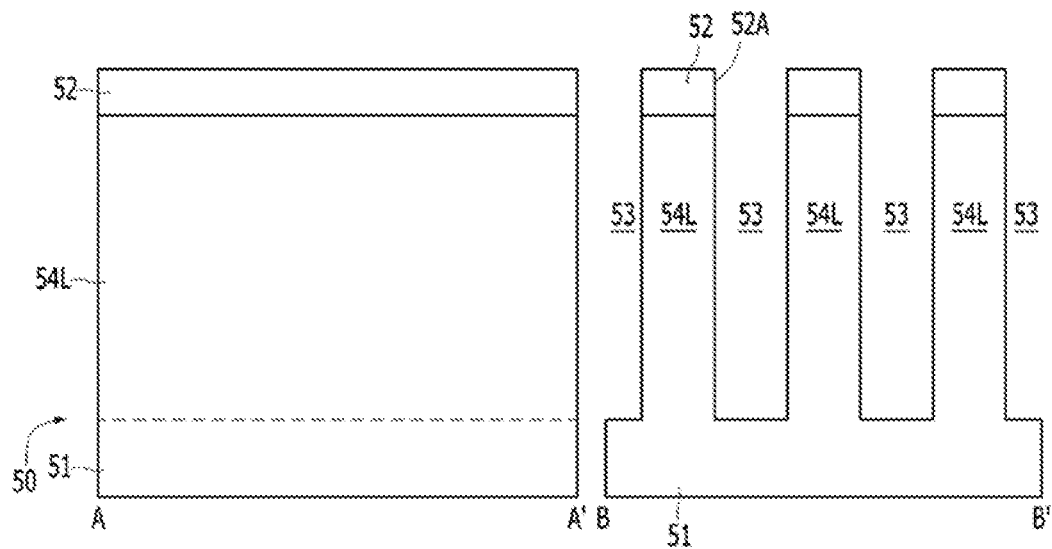
FIGS. 16A to 16J are cross-sectional views taken along the lines A-A' and B-B' of FIGS. 15A to 15J.

As shown in FIGS. 15A and 16A, a substrate 50 may be prepared. The substrate 50 may include a material suitable for semiconductor processing. The substrate 50 may include a semiconductor substrate. The substrate 50 may include a silicon-containing material. The substrate 50 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 50 may include a semiconductor material such as germanium. The substrate 50 may include a III/V group semiconductor substrate, for example, a compound semiconductor substrate such as GaAs. The substrate 50 may include an SOI substrate.

A first hard mask layer 52 may be formed over the substrate 50. The first hard mask layer 52 may have a plurality of line-shaped openings 52A formed therein. To form the plurality of line-shaped openings 52A, the first hard mask layer 52 may be etched through a mask (not illustrated). The plurality of line-shaped openings 52A may be formed by Spacer Pattern Technology (SPT). The first hard mask layer 52 may include a material having etch selectivity with respect to the substrate 50. For example, the first hard mask layer 52 may include silicon nitride. Although not illustrated, a buffer layer or pad layer may be further formed between the first hard mask layer 52 and the substrate 50. The buffer layer may be formed of silicon oxide.

A first isolation trench 53 may be formed. The substrate 50 may be etched using the first hard mask layer 52 having the line-shaped openings 52A as a mask. Thus, the first isolation trench 53 may be formed in a line shape. The first isolation trenches 53 may define first line-shaped active regions 54L in the substrate 50. The space between the neighboring first line-shaped active regions 54L may correspond to the first isolation trench 53. The first line-shaped active region 54L and the first isolation trench 53 may extend in the first direction ①. For convenience of description, the first direction ① may be a diagonal direction. The remaining bottom portion of the substrate 50, in which the process for forming the first line-shaped active regions 54L and the first isolation trenches 53 is not performed, may be referred to as a bulk portion 51.

Figure 15B:
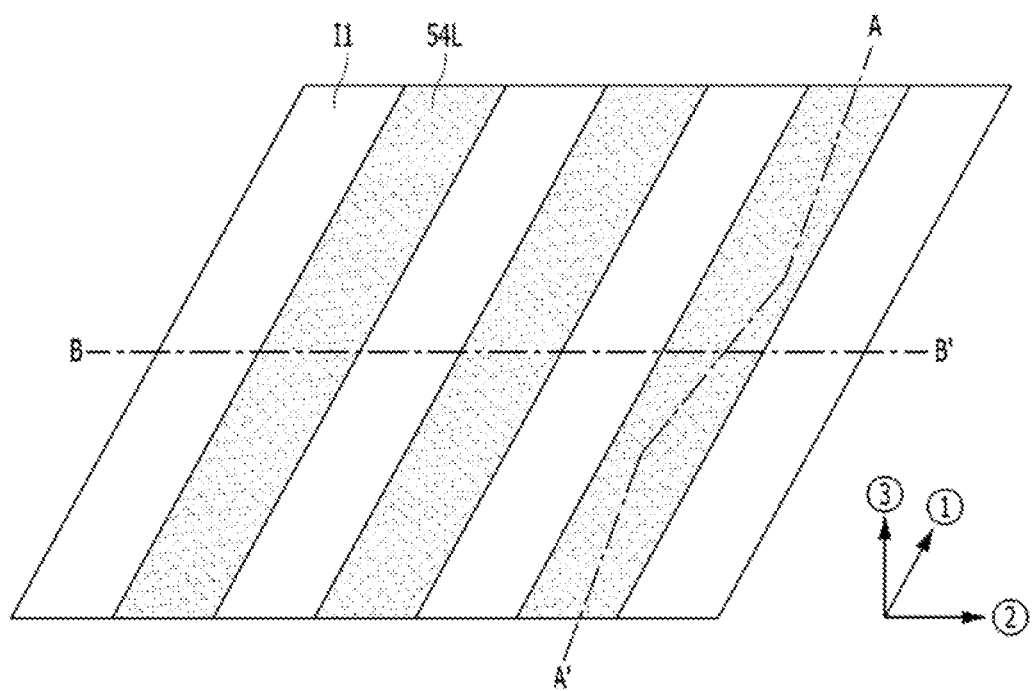
Figure 16B:
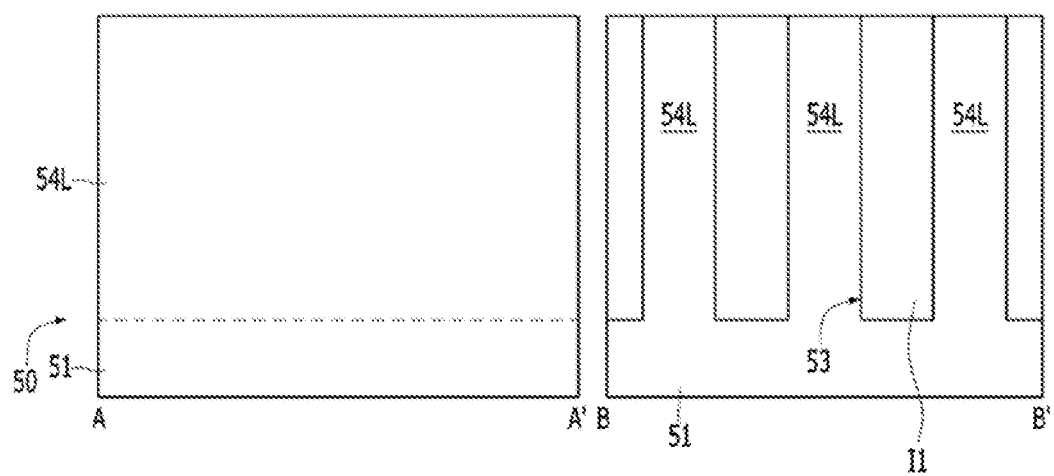

As shown in FIGS. 15B and 16B, a first device isolation region I1 may be formed in the first isolation trench 53. The first device isolation region I1 may be embedded in the first isolation trench 53. The line-shaped active region 54L and the first device isolation region I1 may be alternately formed. The line-shaped active region 54L and the first device isolation region I1 may have the same line width. The line-shaped active region 54L and the first device isolation region I1 may extend in the first direction ①. Each of the line-shaped active region 54L and the first device isolation region I1 may have a line shape.

While the first device isolation region I1 is formed, the first hard mask layer 52 may be removed. Although not illustrated, the first device isolation region I1 may include a liner layer, a dielectric pillar layer and an isolation dielectric layer. For example, the first device isolation region I1 may be formed by the method illustrated in FIGS. 4A to 4C. The first device isolation region I1 may include silicon oxide, silicon nitride, silicon germanium, Spin On Dielectric (SOD) or combinations thereof.

Figure 15C:
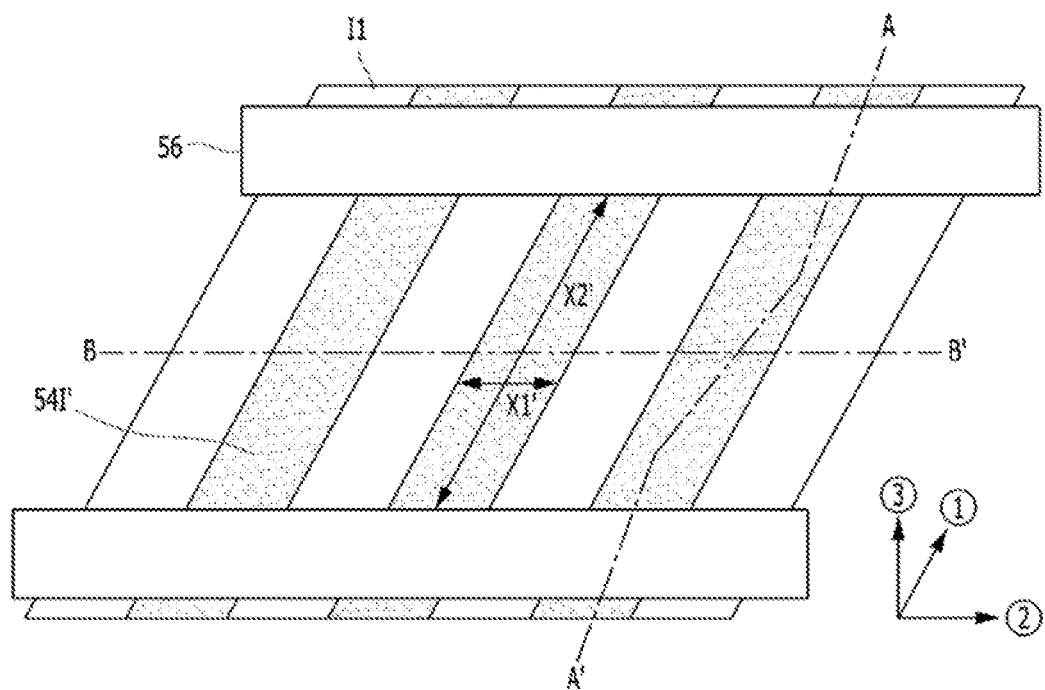
Figure 16C:
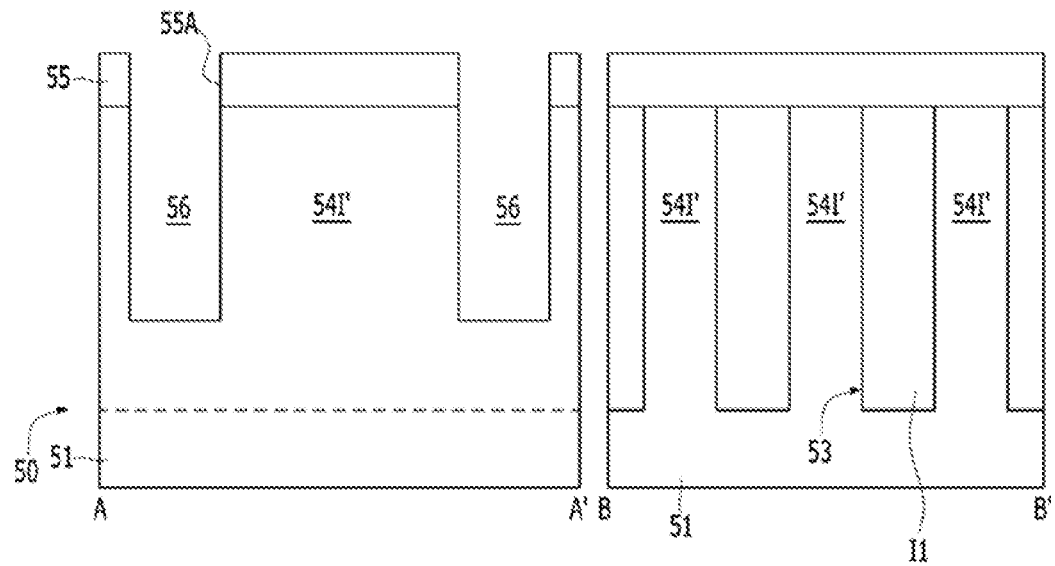
Figure 16D:
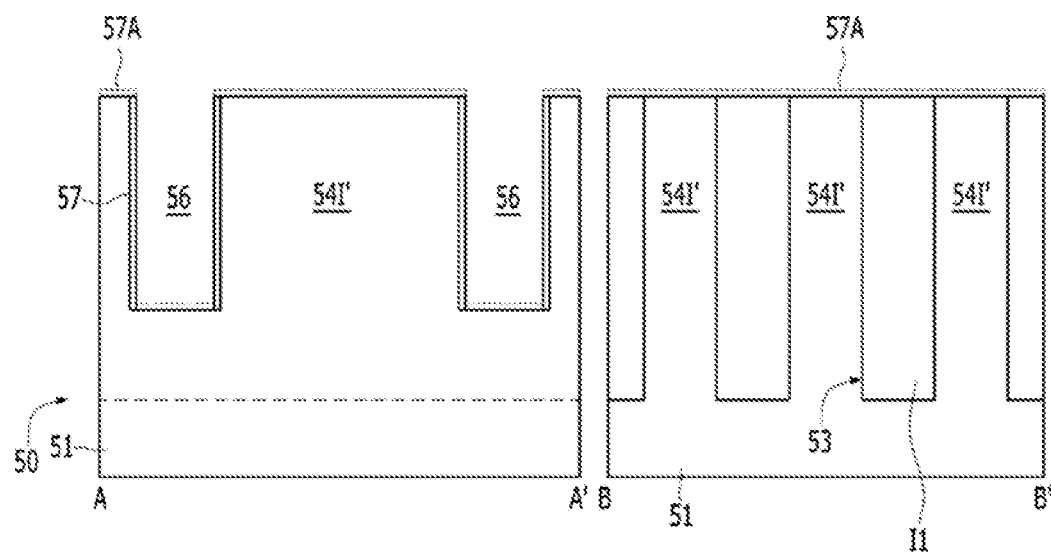

As shown in FIGS. 15C and 16C, the line-shaped active region 54L may be cut in a uniform length unit. In order to cut the line-shaped active region 54L, a first cutting mask 55 may be applied. The first cutting mask 55 may have a plurality of line-shaped openings 55A. The plurality of line-shaped openings 55A may extend in the second direction ②. The first cutting mask 55 may extend in a direction crossing the line-shaped active region 54L. The first cutting mask 55 may include a photoresist pattern.

The line-shaped active region 54L and the first device isolation region I1 may be etched using the first cutting mask 55 as a mask. Thus, the line-shaped active region 54L may be cut to form a second isolation trench 56. The second isolation trench 56 may extend in the second direction ②. A plurality of preliminary island-shaped active regions 54I' may be formed by the second isolation trenches 56.

Through the above-described series of processes, the line-shaped active region 54L may be cut to form the independent preliminary island-shaped active regions 54I'. When seen along the first direction ①, the neighboring preliminary island-shaped active regions 54I' may be uniform in length and spacing, and isolated from each other by the second isolation trench 56. The preliminary island-shaped active region 54I' may have a minor axis X1' and a major axis X2'. The plurality of preliminary island-shaped active regions 54I' may be repeatedly formed so that the preliminary island-shaped active regions 54I' are isolated from each other along the first and second directions ① and ②.

Between the major axes X2' of the neighboring island-shaped active regions 54I', the second isolation trench 56 may be formed. Between the minor axes X1' of the neighboring island-shaped active regions 54I, the first device isolation region I1 may be positioned. The second isolation trench 56 may extend in the second direction ②. The second isolation trench 56 may be formed shallower than the first isolation trench 53.

Figure 15D:
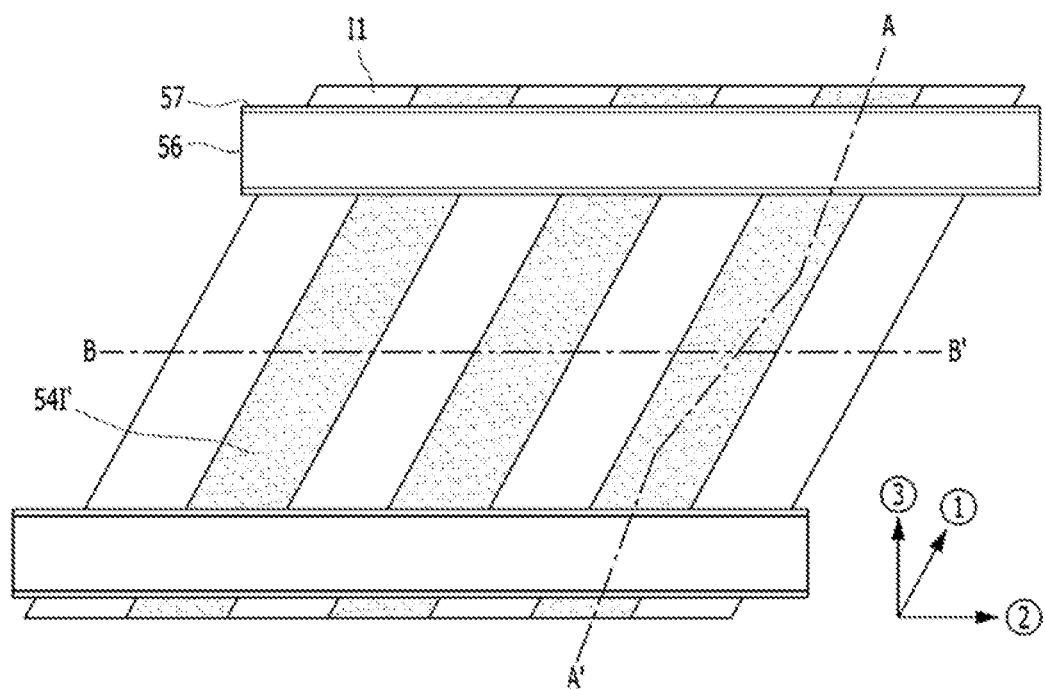

As shown in FIGS. 15D and 15D, the first cutting mask 55 may be removed. Then, a spacer layer 57A may be formed on the sidewalls of the second isolation trench 56. The spacer layer 57A may be formed of silicon oxide. The spacer layer 57A may be formed through a thermal oxidation process or deposition method.

Then, a spacer 57 may be formed. The spacer 57 may be formed on the sidewalls of the second isolation trench 56. To form the spacer 57, an etch-back process for the spacer layer 57A may be performed. Thus, the spacer layer 57A may be removed from the top surface of the substrate 50. Furthermore, the spacer layer 57A may not remain on the bottom surface of the first isolation trench 53.

Figure 15E:
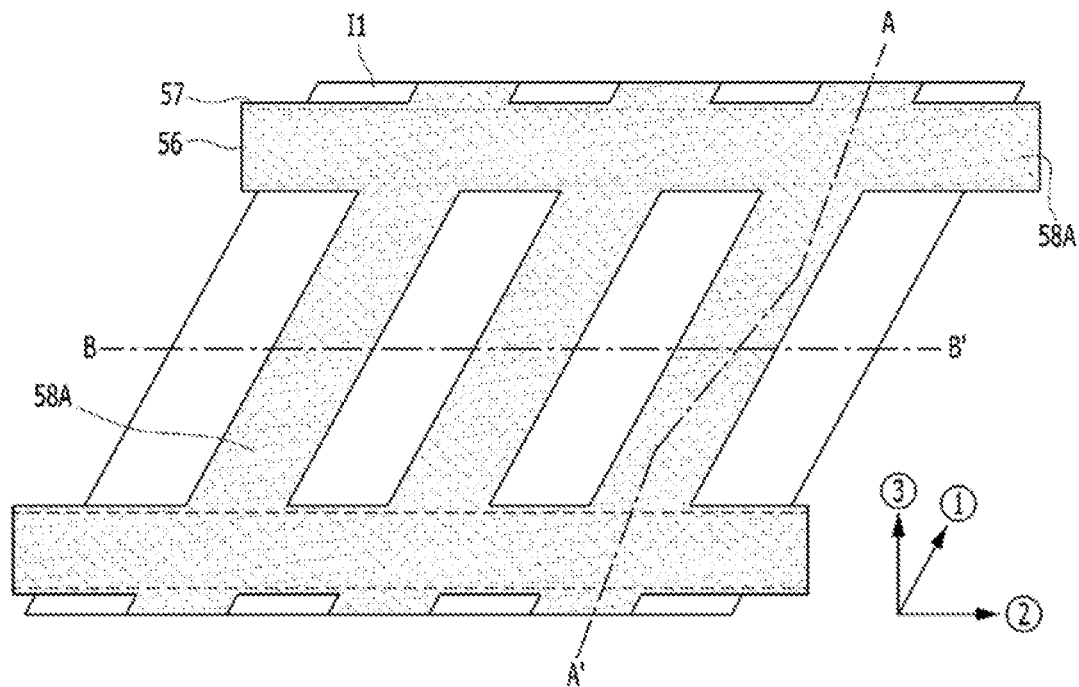
Figure 16E:
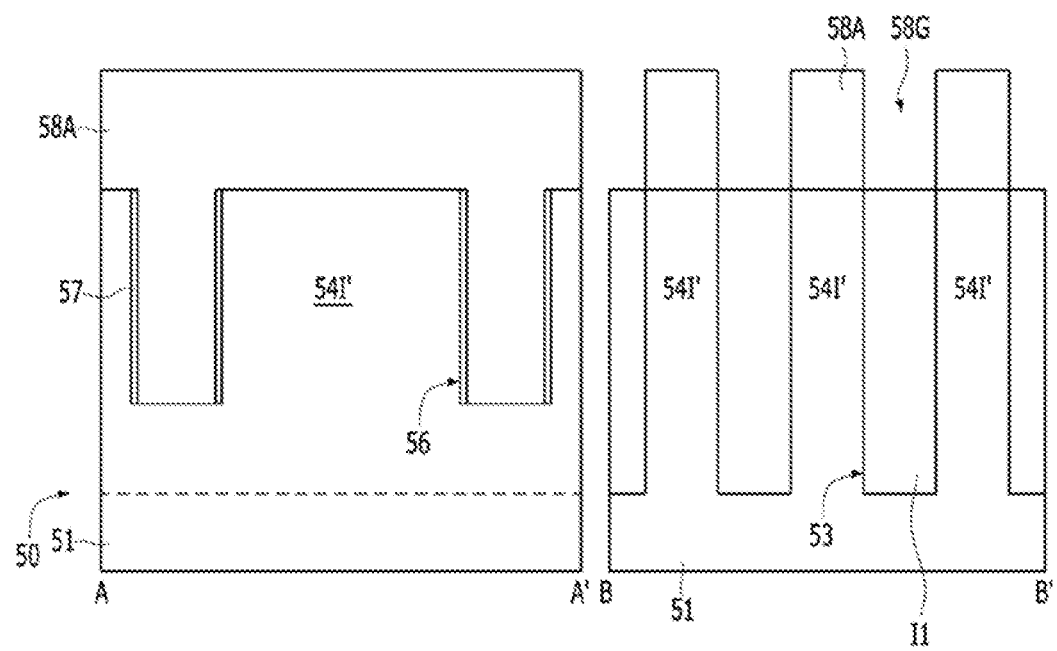

As shown in FIGS. 15E and 16E, a growth layer 58A may be formed. The growth layer 58A may be formed by epitaxial growth. The growth layer 58A may include a silicon-containing material. The growth layer 58A may be formed by silicon epitaxial growth, for example, Selective Epitaxial Growth (SEG) of silicon. To form the growth layer 58A, seed layer deposition, reflow and SEG may be sequentially performed. Thus, the second isolation trench 56 may be filled with the growth layer 58A without a void. The growth layer 58A may cover all of the top surfaces of the preliminary island-shaped active regions 54I'. The growth layer 58A and the substrate 50 may be formed of the same material.

The growth layer 58A formed by SEG may cover only the preliminary island-shaped active regions 54I' and the second isolation trenches 56. That is, the growth layer 58A may not be formed over the first device isolation region I1. Thus, when seen along the direction B-B', a gap 58G may be formed between the growth layers 58A.

Figure 15F:
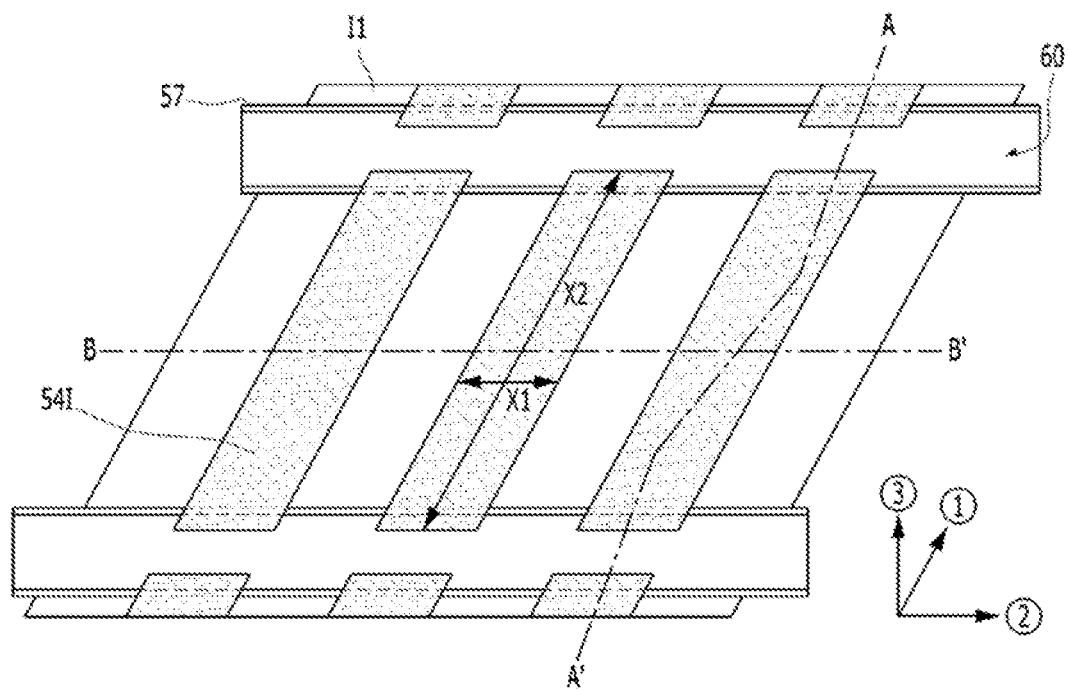
Figure 16F:
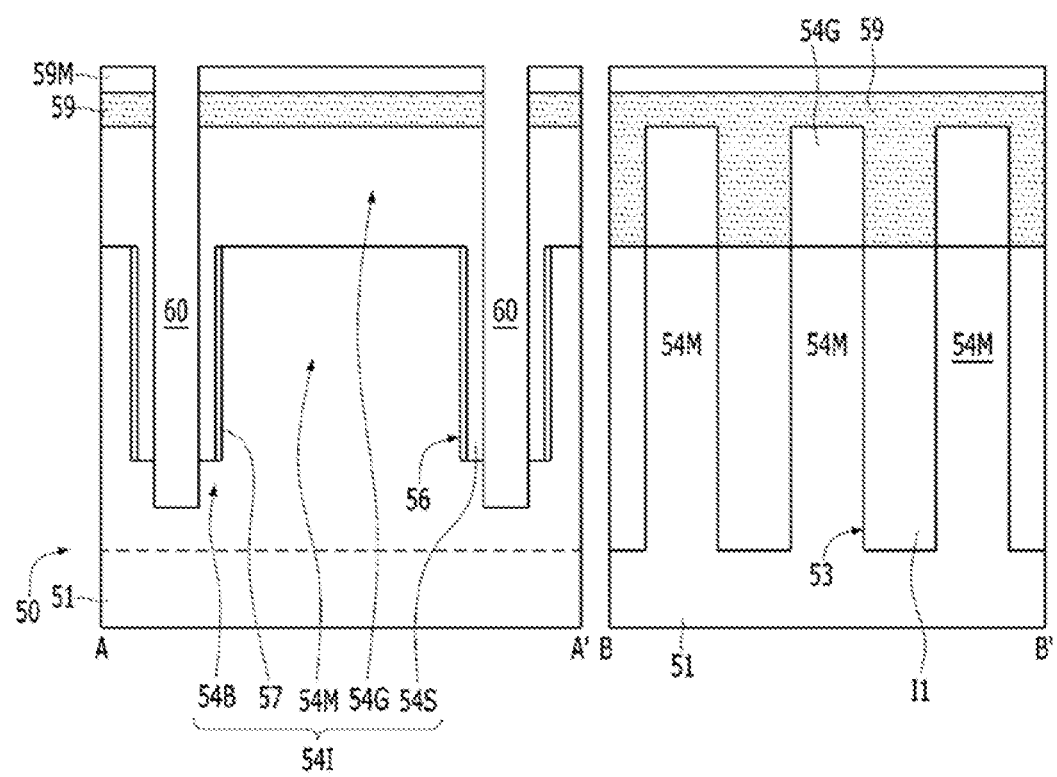

As shown in FIGS. 15F and 16F, a second hard mask layer 59 may be formed over the growth layer 58A. The second hard mask layer 59 may include silicon nitride.

A second cutting mask 59M may be formed over the second hard mask layer 59. The second cutting mask 59M may have a plurality of line-shaped openings 55MI. The plurality of line-shaped openings 59MI may extend in the second direction ②. The second cutting mask 59M may extend in a direction crossing the preliminary island-shaped active region 54I'. The second cutting mask 59M may include a photoresist pattern. When seen along the direction B-B', a part of the second cutting mask 59M may fill the gap 58G between the growth layers 58A.

The second hard mask layer 59 and the growth layer 58A may be etched using the second cutting mask 59M as a mask. After the growth layer 58A is cut, the bottom portion of the second isolation trench 56 is etched to a given depth. Thus, a third isolation trench 60 may be formed. The third isolation trench 60 may extend in the second direction ②. The third isolation trench 60 may have a smaller line width than the second isolation trench 56. Furthermore, the third isolation trench 60 may have a larger depth than the second isolation trench 56.

A plurality of preliminary island-shaped active regions 54I may be formed by the third isolation trenches 60. The island-shaped active region 54I may include a body portion 54B, a main portion 54M over the body portion 54B, a growth portion 54G over the main portion 54M, and side portions 54S at both sidewalls of the growth portion 54G. The body portion 54B may be formed by etching the substrate 500. The main portion 54M may indicate the preliminary island-shaped active region 54I'. The growth portion 540 and the side portions 54S may be formed by etching the growth layer 58A. The growth portion 54G and the side portions 54S may cover the top and sidewalls of the main portion 54M.

The island-shaped active region 54I may further include an embedded spacer 57. The embedded spacer 57 may indicate a first spacer 57. The embedded spacer 57 may have an embedded structure that is positioned in the island-shaped active region 54I by the main portion 54M, the growth portion 54G, and the side portions 54S. Thus, the embedded spacer 57 may be closed from the third isolation trench 60. The body portion 54B, the main portion 54M, the growth portion 54G and the side portions 54S may be formed of the same material. That is, the body portion 54B, the main portion 54M, the growth portion 54G and the side portions 54S may be formed of silicon. The embedded spacer 57 may be formed of a dielectric material. The embedded spacer 57 may be formed of silicon oxide. The side portions 54S may be electrically coupled to the body portion 54B. The body portion 54B may be connected to the bulk portion 51 of the substrate 50. Thus, the bulk portion 51 and the side portions 54S may be electrically coupled to each other. As a result, the island-shaped active region 54I may have a body-tied structure.

Through the above-described series of processes, the line-shaped active region 54L may be cut to form independent island-shaped active regions 54I. In a cross-sectional view taken along the first direction ①, the neighboring island-shaped active regions 54I may be uniform in length and spacing, and isolated from each other by the third isolation trench 60. The island-shaped active region 54I may have a minor axis X1 and a major axis X2. The minor axis X1 of the island-shaped active region 54I may correspond to the minor axis X1' of the preliminary island-shaped active region. The major axis X2 of the island-shaped active region 54I may have a larger length than the major axis X2' of the preliminary island-shaped active region, due to the side portion 54S.

The plurality of island-shaped active regions 54I may be repeatedly formed so that island-shaped active regions 54I are isolated from each other along the first and second directions ① and ②. Between the major axes X2 of the neighboring island-shaped active regions 54I, the third isolation trench 60 may be formed. Between the minor axes X1 of the neighboring island-shaped active regions 54I, the first device isolation region I1 may be positioned. The third isolation trench 58 may extend in the second direction ②. The third isolation trench 60 may have a smaller depth than the first isolation trench 53. In another embodiment, the third isolation trench 60 and the first isolation trench 53 may have the same depth.

Figure 15G:
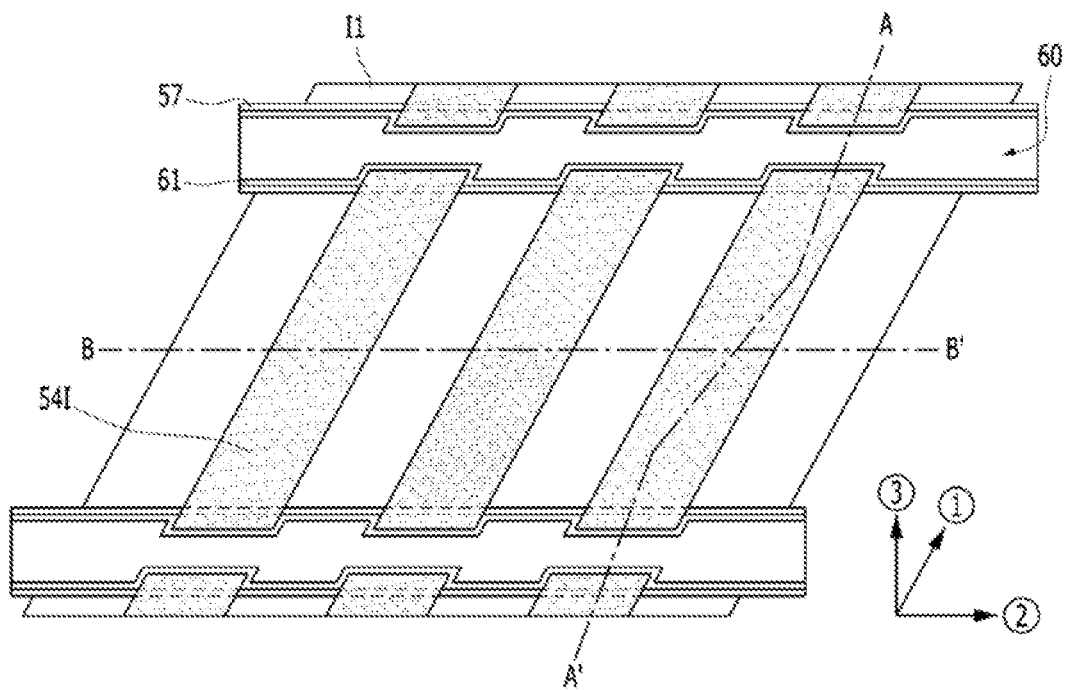
Figure 16G:
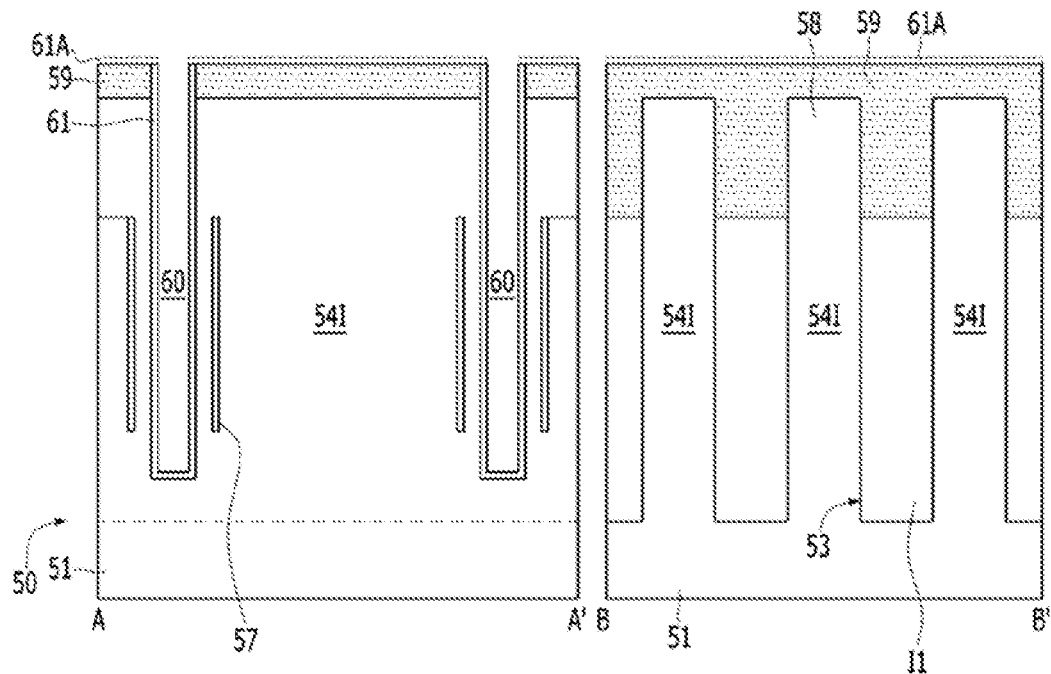

As shown in FIGS. 15G and 16G, a second cutting mask 59M may be removed. Hereafter, for convenience of description, reference numerals of the body portion 54B, the main portion 54M, the growth portion 54G and the side portions 54S will be omitted. That is, the body portion 54B, the main portion 54M, the growth portion 54G and the side portions 54S may be collectively referred to as the island-shaped active region 54I, and only the embedded spacer 57 within the island-shaped active region 54I will be illustrated.

A liner 61 may be formed on the sidewalls of the third isolation trench 60. To form the liner 61, a liner layer 61A may be deposited, and an etch-back process may be performed. The liner 61 may be formed of a material having etch selectivity with respect to the substrate 50. The liner 61 may include silicon oxide. The bottom surface of the third isolation trench 60 may be exposed by the liner 61.

Figure 15H:
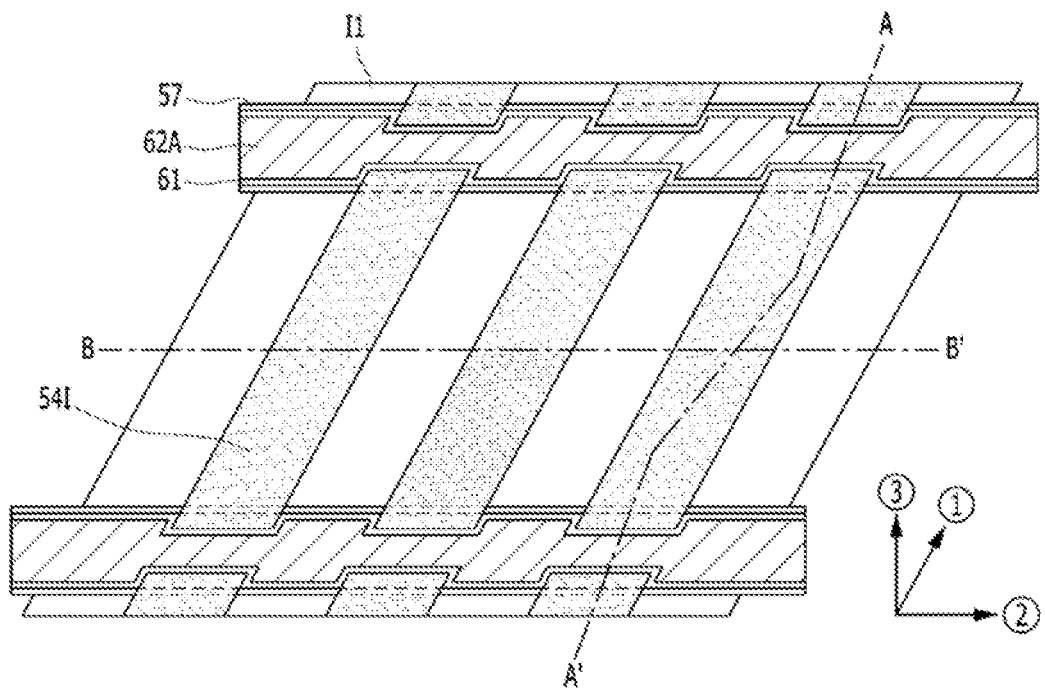
Figure 16H:
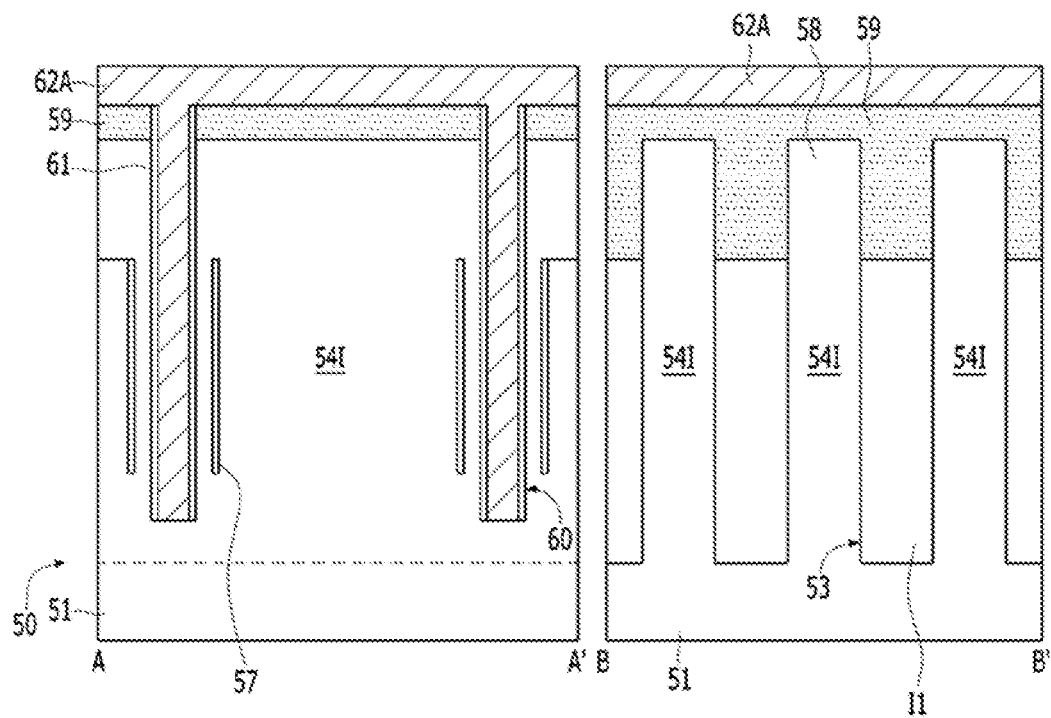

As shown in FIGS. 15H and 16H, a shield layer 62A may be formed. The shield layer 62A may include a conductive material. The shield layer 62A may be formed of a silicon-containing material. The shield layer 62A may include a polysilicon layer. The shield layer 62A may be doped with an impurity, in order to have conductivity. The shield layer 62A may include a boron-doped polysilicon layer.

Figure 15I:
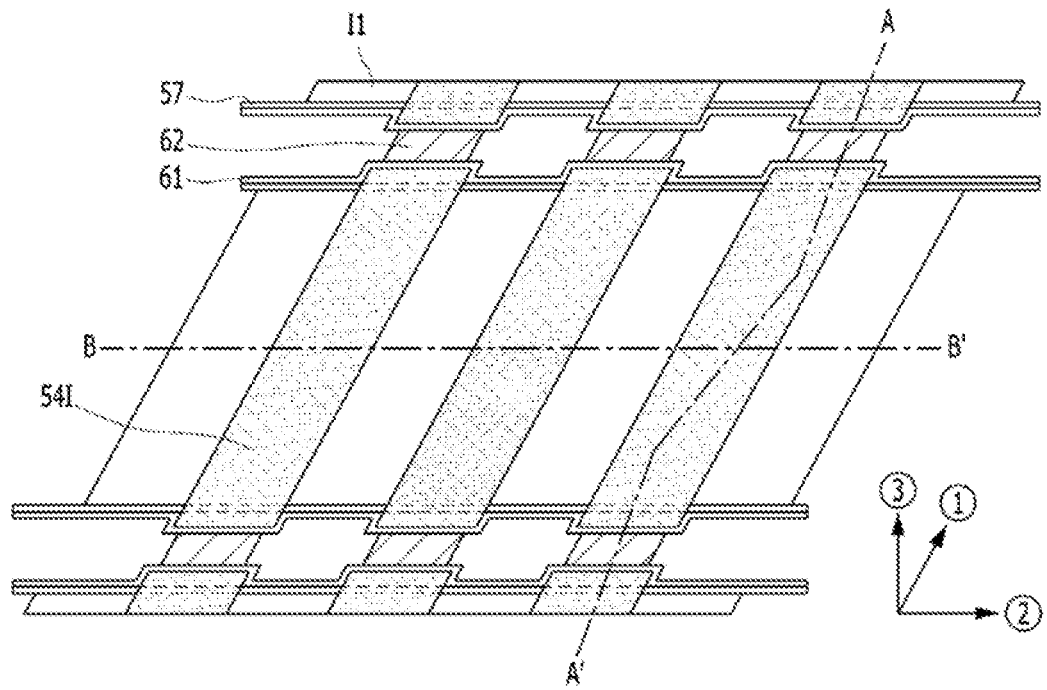
Figure 16I:
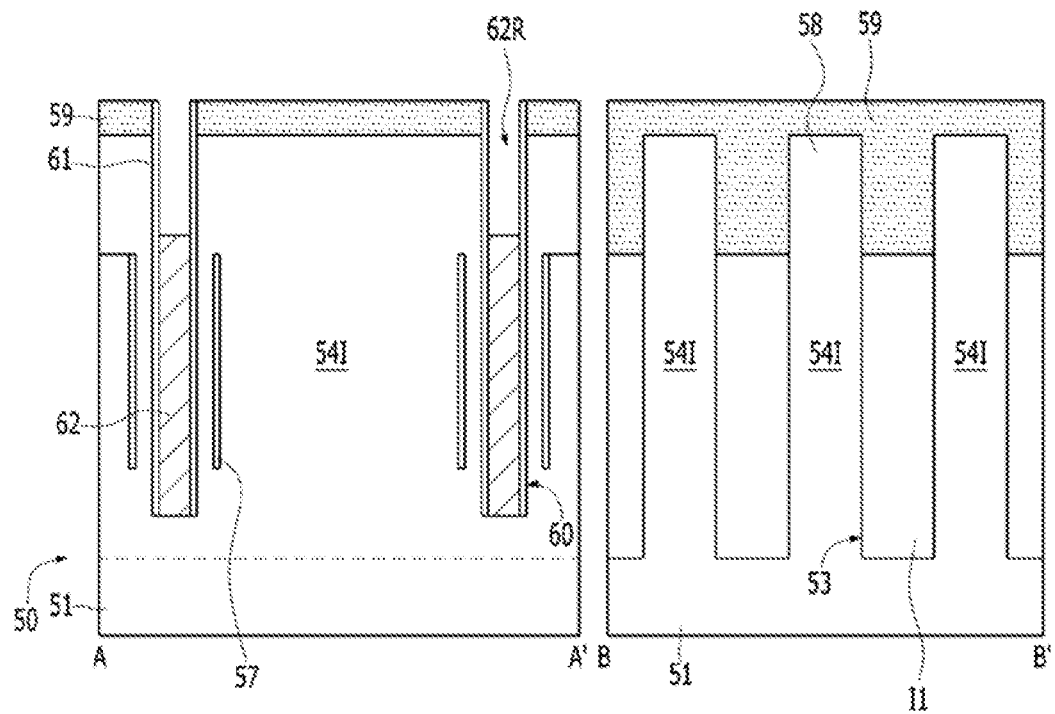

As shown in FIGS. 15I and 16I, a shield pillar 62 may be formed. The shield pillar 62 may be formed by selectively etching the shield layer 62A. For example, the shield layer 62A may be etched by an etch-back process. Thus, the shield pillar 62 may be formed in the third isolation trench 60. The shield pillar 62 may be positioned between the major axes of the island-shaped active regions 54I. That is, the neighboring shield pillars 62 may be separated from each other. The top surface of the shield pillar 62 may be recessed to a lower level than the top surface of the island-shaped active region 54I. Thus, a recessed region 62R may be formed at the top of the shield pillar 62.

Between the sidewall of the shield pillar 62 and the sidewall of the third isolation trench 60, the liner 61 may be positioned. The bottom of the shield pillar 62 may be in contact with the substrate 50. That is, the body-tied shield pillar 62 may be formed. The liner 61 may be positioned between the shield pillar 62 and the island-shaped active region 54I that is, in a horizontal direction.

Figure 15J:
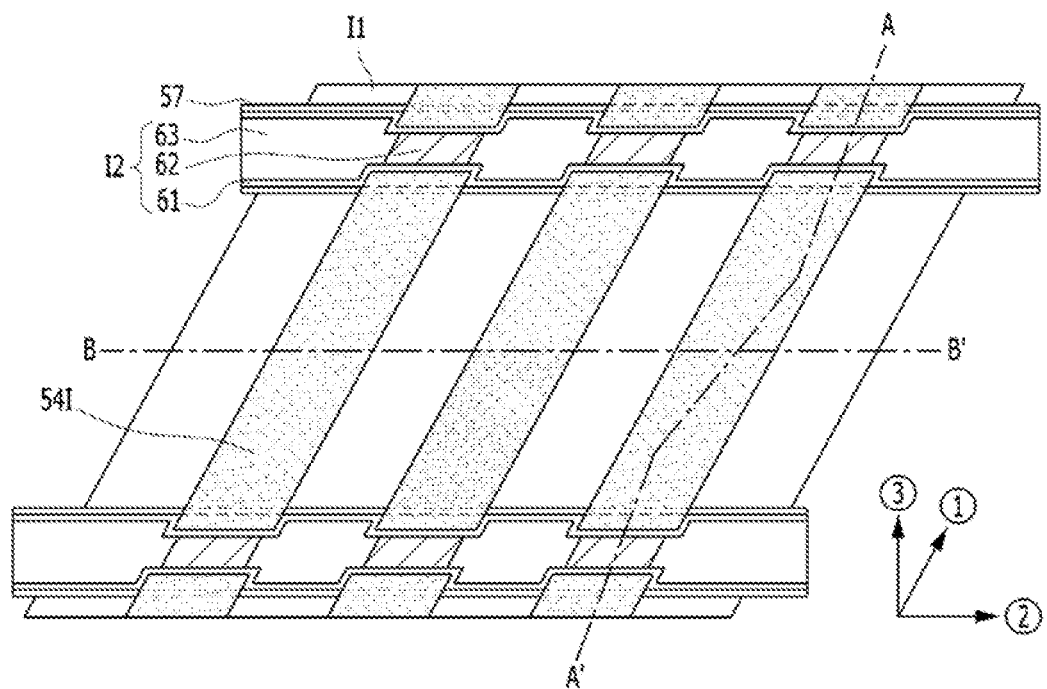
Figure 16J:
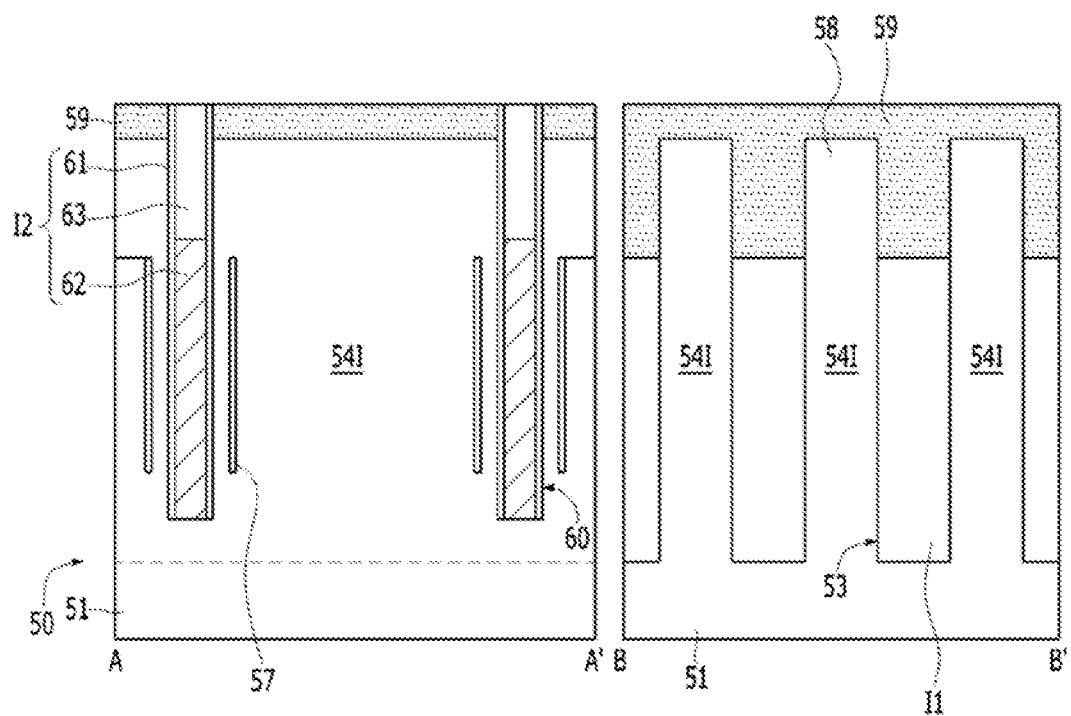

As shown in FIGS. 15J and 16J, the second isolation dielectric layer 63 may be formed. The second isolation dielectric layer 63 may be formed of silicon oxide. The second isolation dielectric layer 63 may fill the recessed region of the shield pillar 62. Subsequently, the second isolation dielectric layer 63 may be planarized. Thus, the second isolation dielectric layer 63 may remain to fill the recessed region 62R at the top of the shield pillar 62. The planarized surface of the second isolation dielectric layer 63 may be at the same level as the top surface of the second hard mask layer 59.

As such, the second isolation dielectric layer 63 may be planarized to form the second device isolation region I2. The second device isolation region I2 may include the liner 61, the shield pillar 62 and the second isolation dielectric layer 63. The second device isolation region I2 may be embedded in the third isolation trench 60. The second device isolation region I2 may include the embedded shield pillar 62. The shield pillar 62 may have a body-tied structure.

The island-shaped active region 54I may be defined by the first device isolation region I1 and the second device isolation region I2. The plurality of island-shaped active regions 54I may be defined by the plurality of first device isolation regions I1 and the plurality of second device isolation regions I2. The plurality of island-shaped active regions 54I may be arranged in parallel. Thus, the plurality of island-shaped active regions may be referred to as parallel active regions.

In accordance with the above-described embodiment, the shield pillar 62 may be formed between the island-shaped active regions 54I, thereby improving the NG or PG effect. Furthermore, the body-tied structure may be formed to suppress the FBE. The spacer 57 and the liner 61 may be formed to suppress parasitic capacitance.

Subsequently, a buried bit line may be formed. For the method for fabricating the buried bit line, refer to FIGS. 5A to 5H and 6A to 6H. After the buried bit line is formed, a gate electrode may be formed. For the method for fabricating the gate electrode, refer to FIGS. 7A to 7H and 8A to 8H.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a semiconductor substrate comprising a plurality of active regions and a device isolation region for isolating the plurality of active regions;
a buried bit line is formed in the semiconductor substrate; and
a conductive shield pillar formed in the device isolation region and connected to the semiconductor substrate,
wherein each of the active regions comprises:
a body portion formed in the substrate;
a pillar floating from the body portion and positioned over the body portion;
a side portion provided over a side surface of the pillar and connected to the body portion; and
an embedded spacer positioned between the side portion and the pillar,
wherein the pillar is coupled to the substrate through the side portion,
wherein a bottom of the pillar is formed between the buried bit line and the embedded spacer.

2. The semiconductor device of claim 1, wherein the embedded spacer comprises a dielectric material.

3. The semiconductor device of claim 1, wherein the embedded spacer comprises silicon oxide.

4. The semiconductor device of claim 1, wherein the side portion comprises a silicon epitaxial layer.

5. The semiconductor device of claim 1, wherein the conductive shield pillar comprises boron-doped polysilicon.

6. The semiconductor device of claim 1, wherein the device isolation region comprises:
a plurality of first device isolation regions extending in a first direction and a plurality of second device isolation regions extending in a second direction crossing the first direction, and
wherein the conductive shield pillar is formed in each of the second device isolation regions.

7. The semiconductor device of claim 6, further comprising:
a plurality of first isolation trenches extending in the first direction,
wherein each of the first device isolation regions is formed in each of the first isolation trenches.

8. The semiconductor device of claim 6, further comprising:
a plurality of second isolation trenches extending in the second direction,
wherein each of the second device isolation regions is formed in each of the second isolation trenches.

9. The semiconductor device of claim 8, wherein each of the second device isolation regions comprises:
a liner formed between the conductive shield pillar and the sidewalls of the second isolation trenches; and
an isolation dielectric layer covering the shield pillar.

10. The semiconductor device of claim 6, wherein each of the active regions is formed in an island shape and has a minor axis and a major axis,
wherein the plurality of first device isolation regions are positioned between the minor axes of the plurality of active regions in the second direction, and
wherein the plurality of second device isolation regions are positioned between the major axes of the plurality of active regions in the first direction.

11. The semiconductor device of claim 1, wherein the pillar comprises:
a first pillar and a second pillar formed over the body portion,
wherein the first pillar and the second pillar are isolated from each other.

12. The semiconductor device of claim 11, further comprising:
a body trench formed in the body portion;
a punch-through preventing layer formed in the body trench; and
a bit line trench over the punch-through preventing layer,
wherein the
buried bit line formed in the bit line trench and connected to bottom portions of the first and second pillars,
wherein the first pillar and the second pillar are floats from the body portion by the punch-through preventing layer.

13. The semiconductor device of claim 12, further comprising:
a gate trench over the buried bit line; and
a buried gate electrode formed in the gate trench,
wherein the gate trench is formed between the first pillar and the second pillar.

14. The semiconductor device of claim 13, wherein the gate trench comprises:
a first trench portion; and
second and third trench portions each extending from the first trench portion.

15. The semiconductor device of claim 14,
wherein the first trench portion is formed between the first pillar and the second pillar,
wherein the first, second and the third trench portion are surround a portion of sidewalls of the first and second pillar.

16. The semiconductor device of claim 15, wherein the buried gate electrode comprises first to third electrode portions, and
wherein the first to third electrode portions are formed in the first to third trench portions of the gate trench, respectively.

17. The semiconductor device of claim 12, wherein the first pillar and the second pillar comprises:
a first junction region connected to the buried bit line;
a second junction region positioned vertically over the first junction region; and
a channel portion positioned between the first and second junction regions and overlapping the buried gate electrode.

* * * * *